(12) United States Patent
Masuoka et al.

(10) Patent No.: US 10,026,893 B2
(45) Date of Patent: *Jul. 17, 2018

(54) METHOD FOR PRODUCING A MEMORY DEVICE HAVING A PHASE CHANGE FILM AND RESET GATE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,509

(22) Filed: Jul. 12, 2017

(65) Prior Publication Data

US 2017/0309814 A1  Oct. 26, 2017

Related U.S. Application Data

(60) Division of application No. 15/140,189, filed on Apr. 27, 2016, now Pat. No. 9,825,222, which is a
(Continued)

(51) Int. Cl.
*H01L 45/00* (2006.01)
*G11C 13/00* (2006.01)
(Continued)

(52) U.S. Cl.
CPC .......... *H01L 45/06* (2013.01); *G11C 13/0097* (2013.01); *H01L 23/528* (2013.01);
(Continued)

(58) Field of Classification Search
CPC . H01L 27/2454; H01L 27/2463; H01L 45/06; H01L 45/1233; H01L 45/1253;
(Continued)

(56) References Cited

U.S. PATENT DOCUMENTS

2011/0062523 A1   3/2011  Masuoka et al.
2012/0211715 A1*  8/2012  Asano .................... H01L 45/06
                                                         257/1

FOREIGN PATENT DOCUMENTS

JP    2008-311664 A    12/2008
JP    2009-123847 A     6/2009
(Continued)

OTHER PUBLICATIONS

Search Report, and English language translation thereof, in corresponding International Application No. PCT/JP2014/055038, dated Apr. 15, 2014, 6 pages.
(Continued)

*Primary Examiner* — Shahed Ahmed
(74) *Attorney, Agent, or Firm* — Brinks Gilson & Lione

(57) ABSTRACT

A method for producing a memory device includes depositing a second interlayer insulating film on a substrate, forming contact holes, and depositing a second metal and a nitride film. The second metal and the nitride film are removed to form pillar-shaped nitride layers, and to form lower electrodes surrounding the pillar-shaped nitride layers. The second interlayer insulating film is etched back to expose upper portions of the lower electrodes. The upper portions of the lower electrodes surrounding the pillar-shaped nitride film are removed and a phase change film is deposited to surround the pillar-shaped nitride film and connect with the lower electrodes. The phase change film is etched on upper portions of the pillar-shaped nitride film, and a reset gate insulating film is formed surrounding the phase change film and forming a reset gate having a side wall shape and remaining on the upper portions of the pillar-shaped nitride film.

4 Claims, 54 Drawing Sheets

Related U.S. Application Data continuation of application No. PCT/JP2014/055038, filed on Feb. 28, 2014.

(51) Int. Cl.
*H01L 27/24* (2006.01)
*H01L 23/528* (2006.01)

(52) U.S. Cl.
CPC ...... *H01L 27/2454* (2013.01); *H01L 27/2463* (2013.01); *H01L 45/124* (2013.01); *H01L 45/126* (2013.01); *H01L 45/1206* (2013.01); *H01L 45/1286* (2013.01); *H01L 45/144* (2013.01); *H01L 45/1608* (2013.01); *H01L 45/1666* (2013.01); *H01L 45/1675* (2013.01); *G11C 13/0004* (2013.01); *G11C 2213/51* (2013.01); *G11C 2213/52* (2013.01); *G11C 2213/79* (2013.01)

(58) Field of Classification Search
CPC . H01L 45/128; H01L 45/1286; H01L 45/144; H01L 45/1658; H01L 45/1675
USPC ........ 257/225, 261, 296, 314, 324; 438/216, 438/266, 287
See application file for complete search history.

(56) References Cited

FOREIGN PATENT DOCUMENTS

| | | | |
|---|---|---|---|
| JP | 2010-225218 | A | 10/2010 |
| JP | 2010-287744 | A | 12/2010 |
| JP | 2011-199017 | A | 10/2011 |
| JP | 2012-186424 | A | 9/2012 |
| JP | 2012-204404 | A | 10/2012 |
| JP | 2004-356314 | A | 12/2014 |
| WO | WO 2013/038553 | A1 | 3/2013 |
| WO | WO 2013/093988 | A1 | 6/2013 |

OTHER PUBLICATIONS

English language translation of International Preliminary Report on Patentability in corresponding International Application No. PCT/JP2014/055038, dated Sep. 1, 2016, 9 pages.

Office Action in corresponding U.S. Appl. No. 15/140,189, dated Mar. 1, 2017, 15 pages.

* cited by examiner

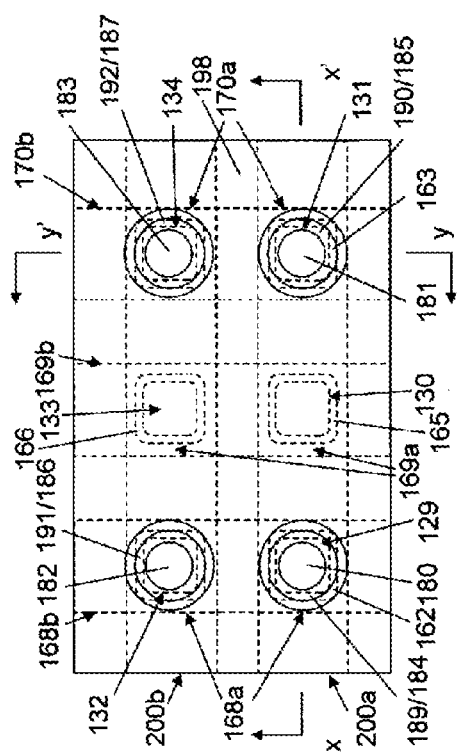
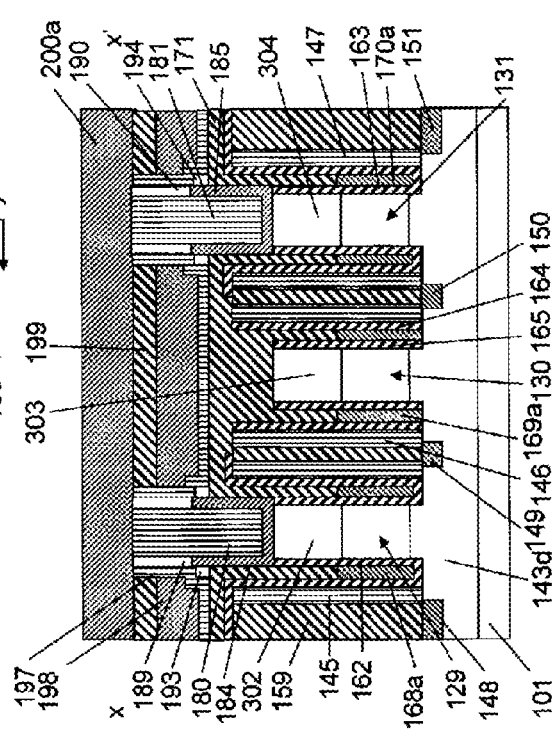
FIG. 3A
FIG. 3B
FIG. 3C

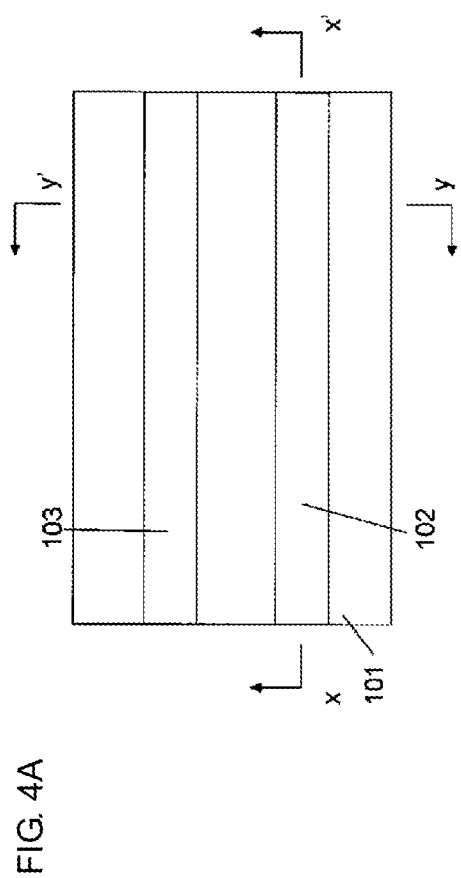
FIG. 4A
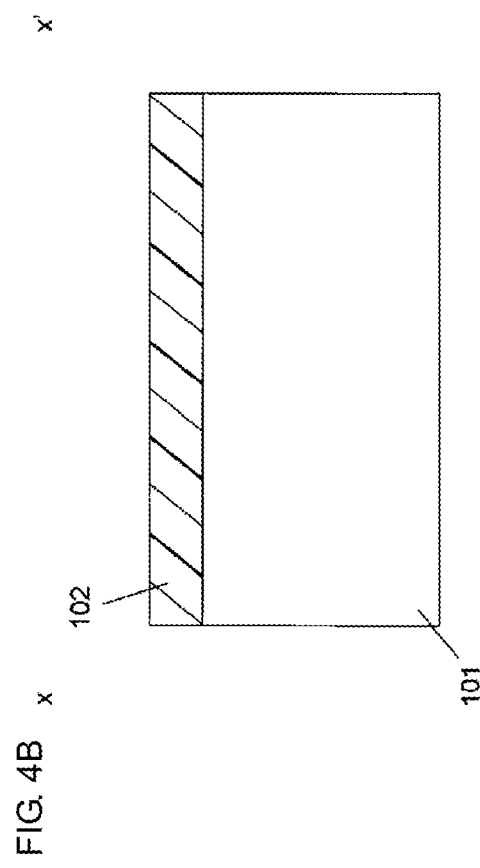
FIG. 4C
FIG. 4B

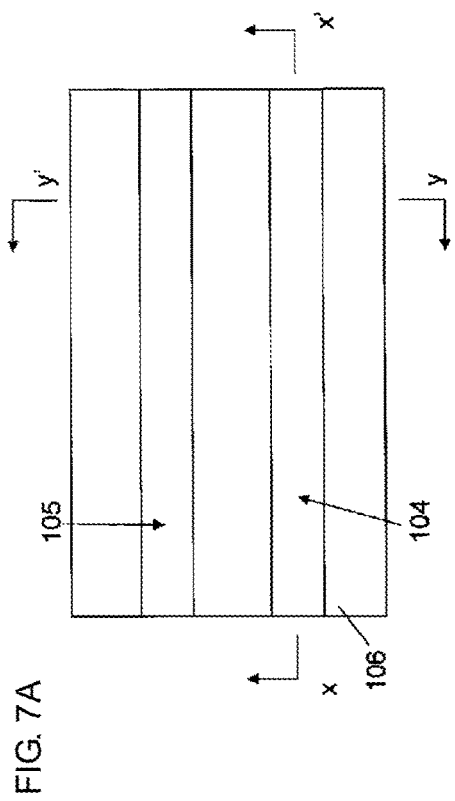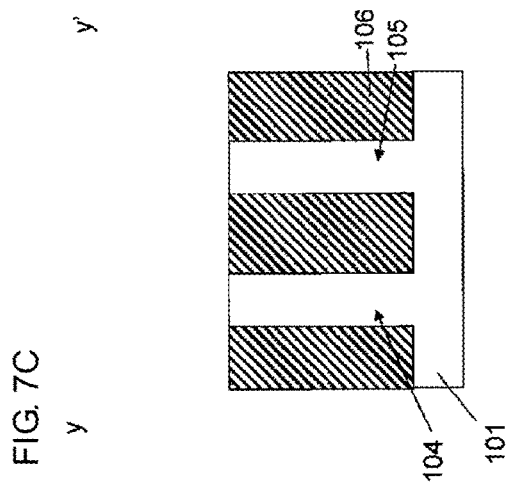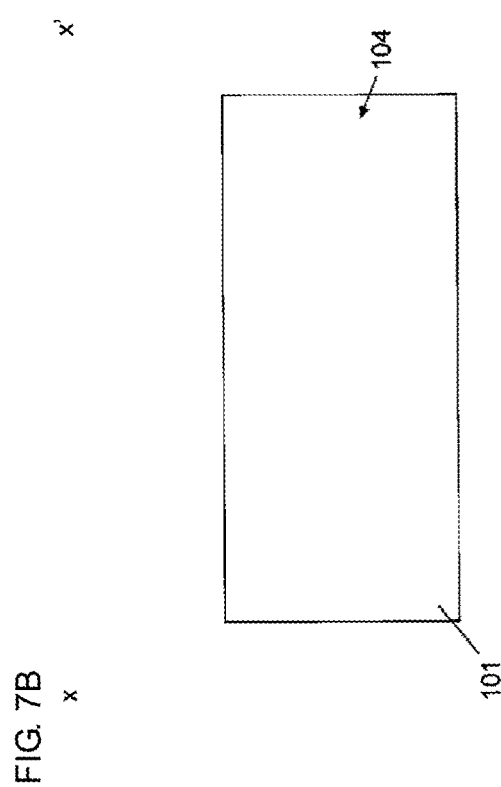

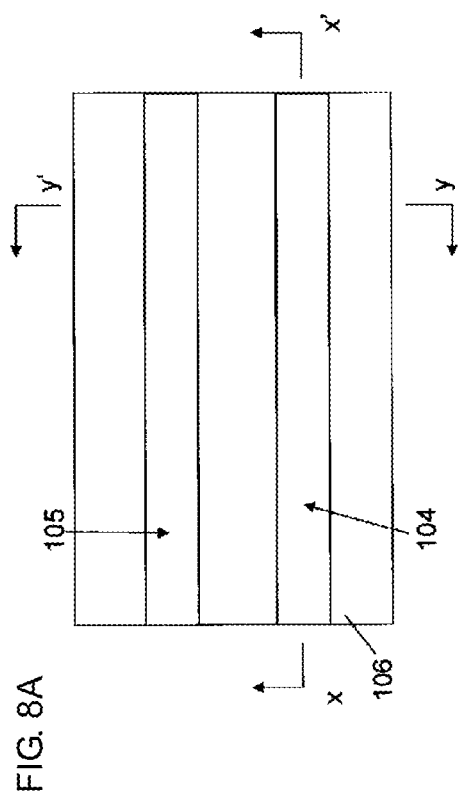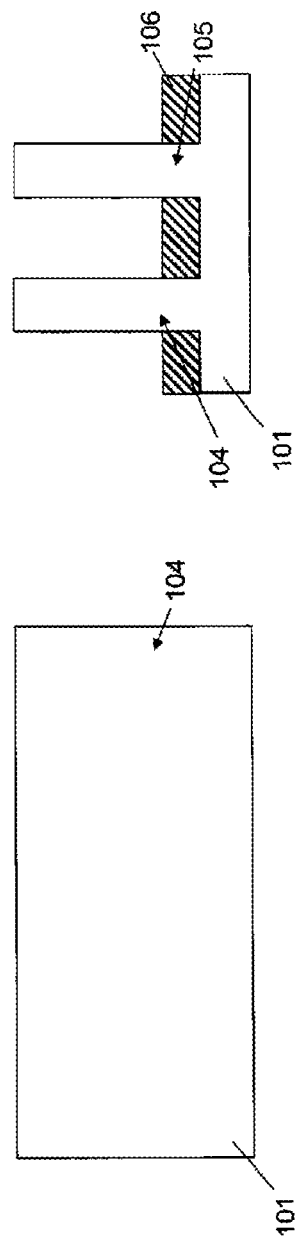
FIG. 8A
FIG. 8B
FIG. 8C

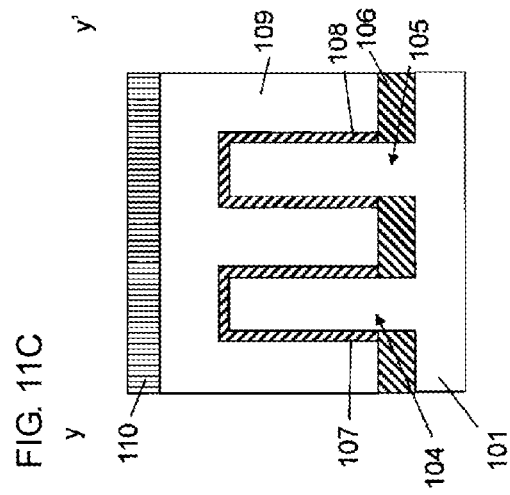
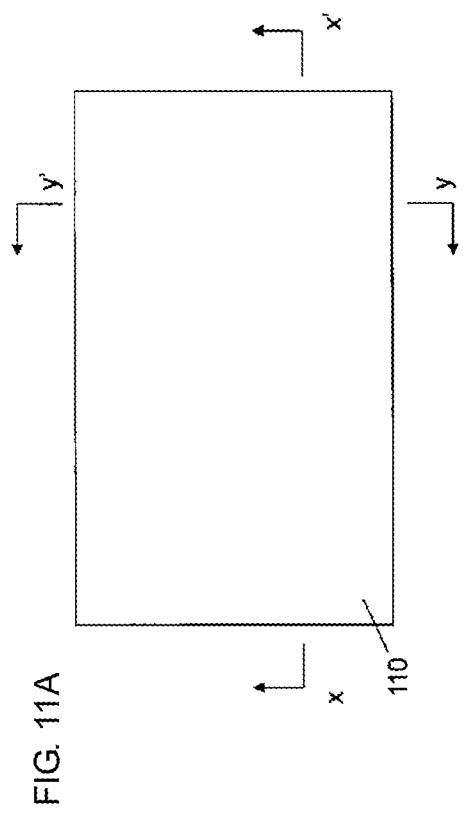
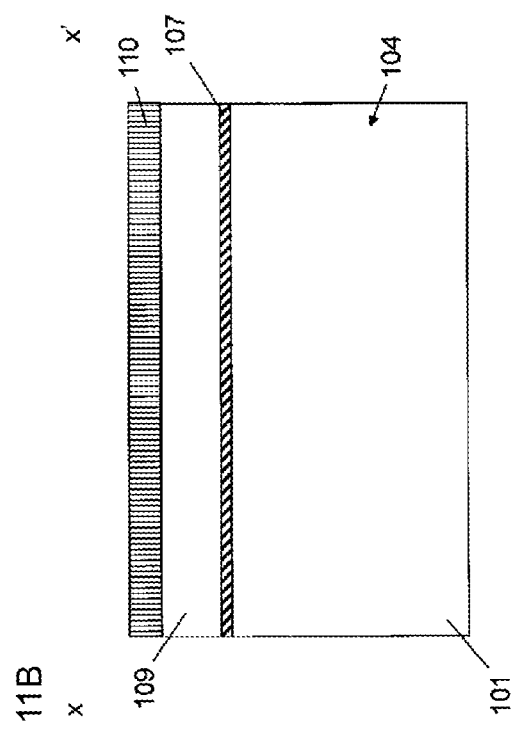

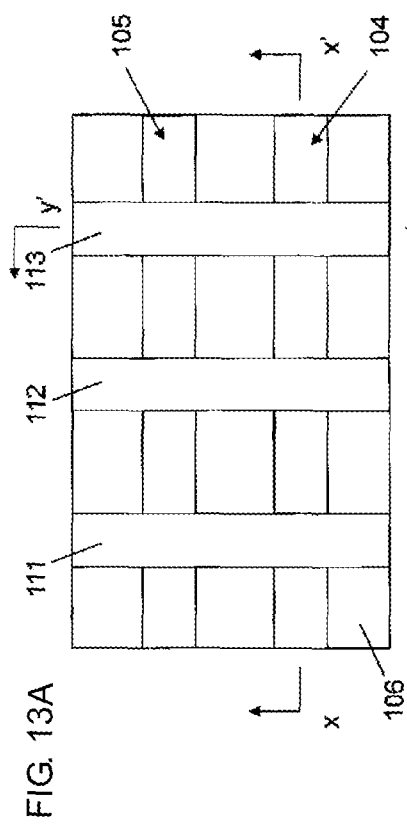
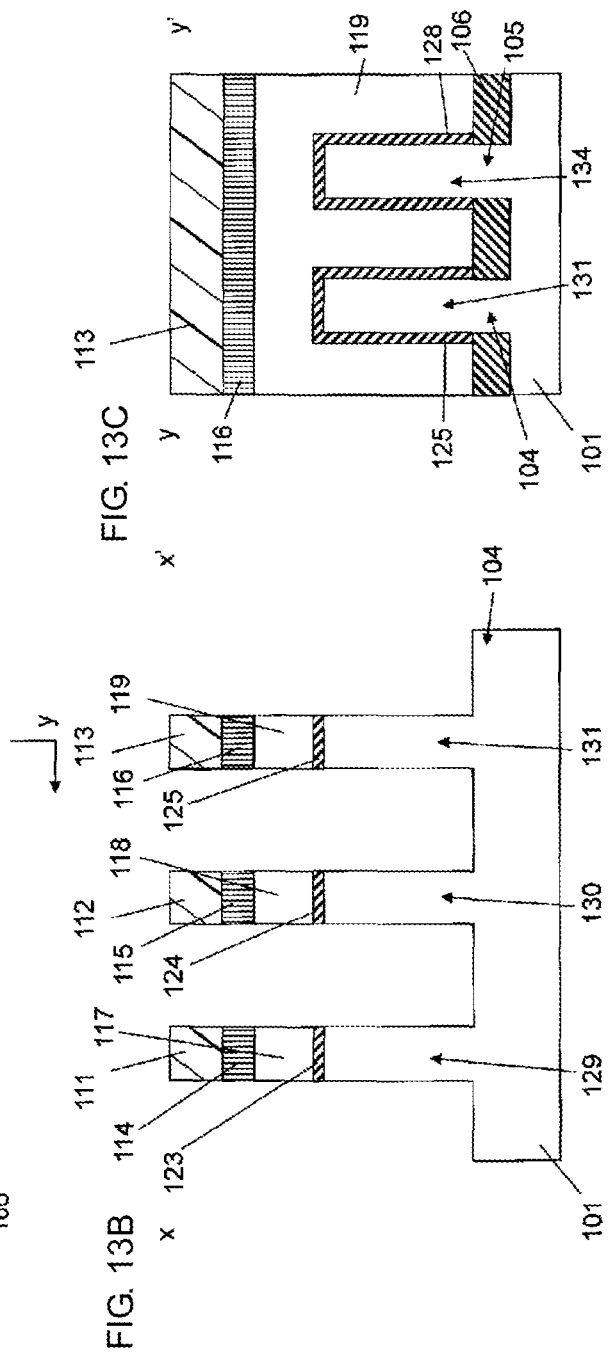
FIG. 13A
FIG. 13B
FIG. 13C

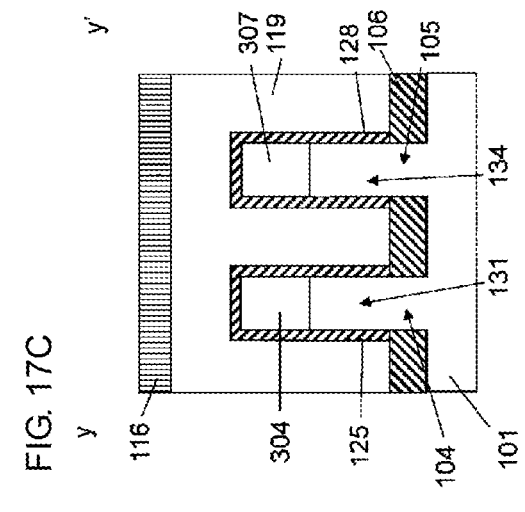
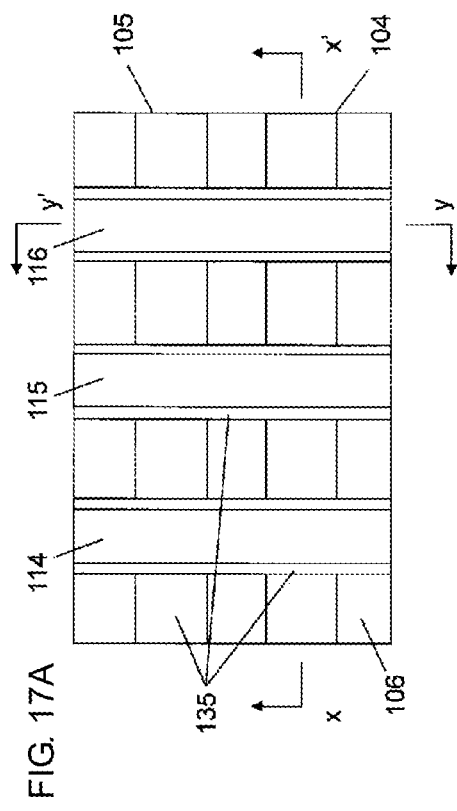
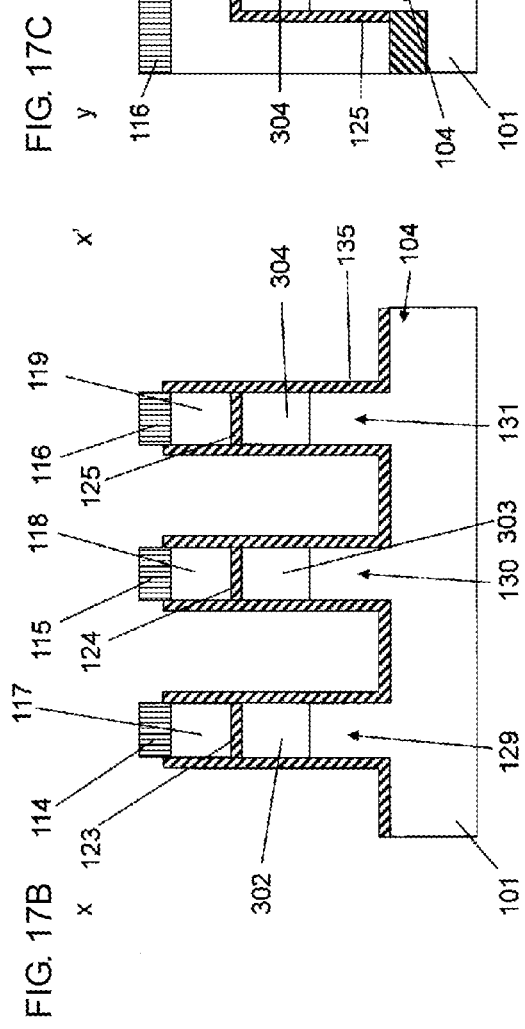
FIG. 17A
FIG. 17B
FIG. 17C

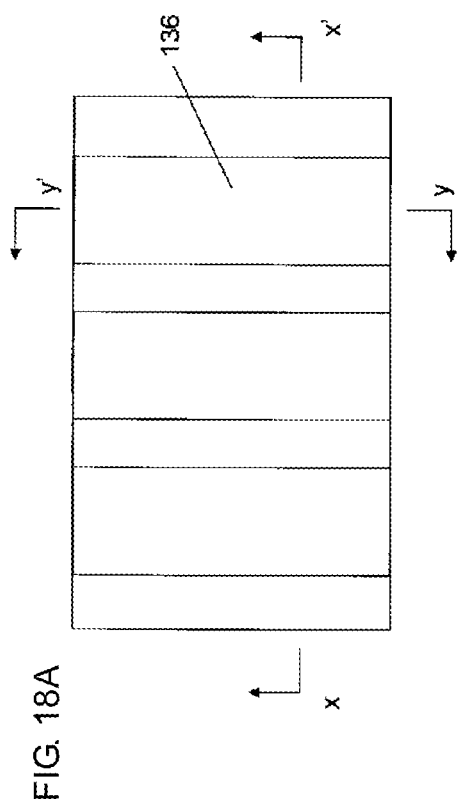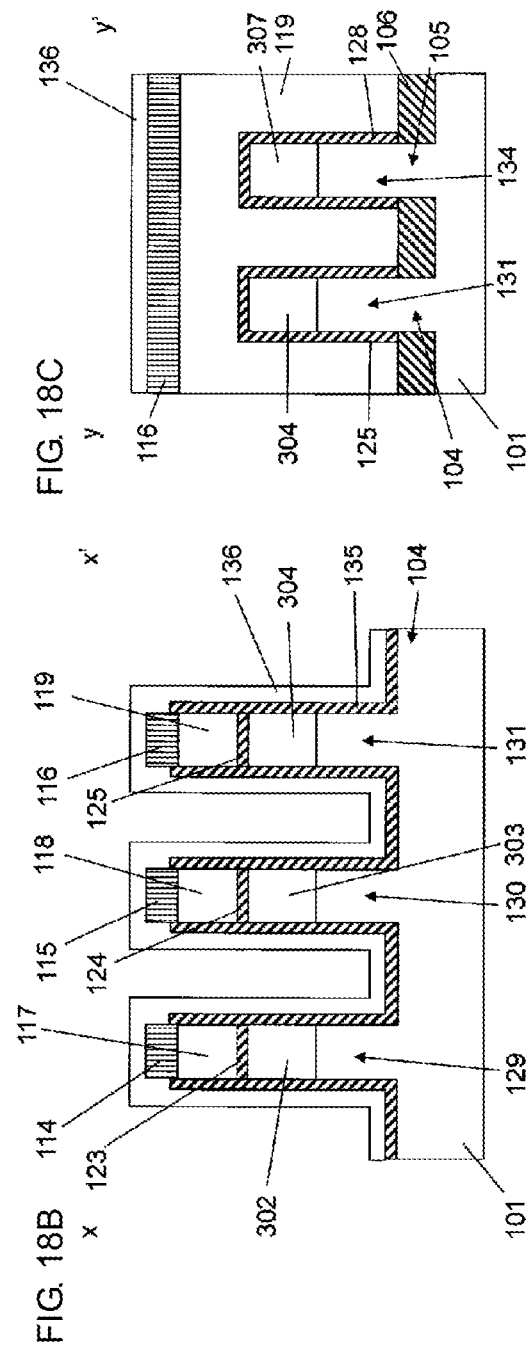

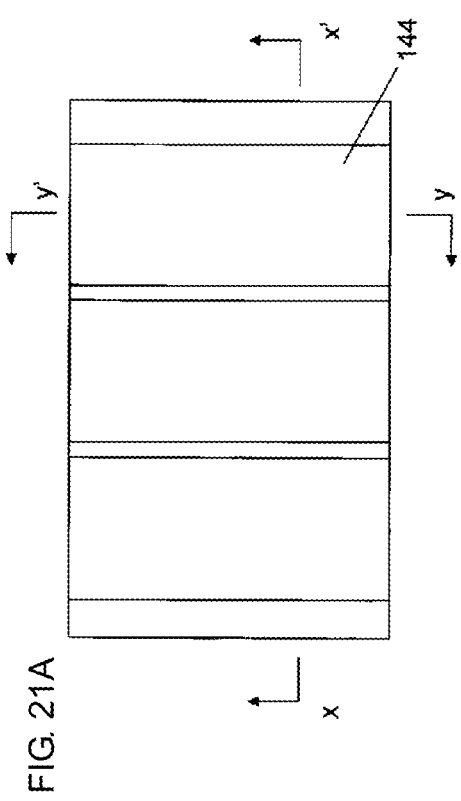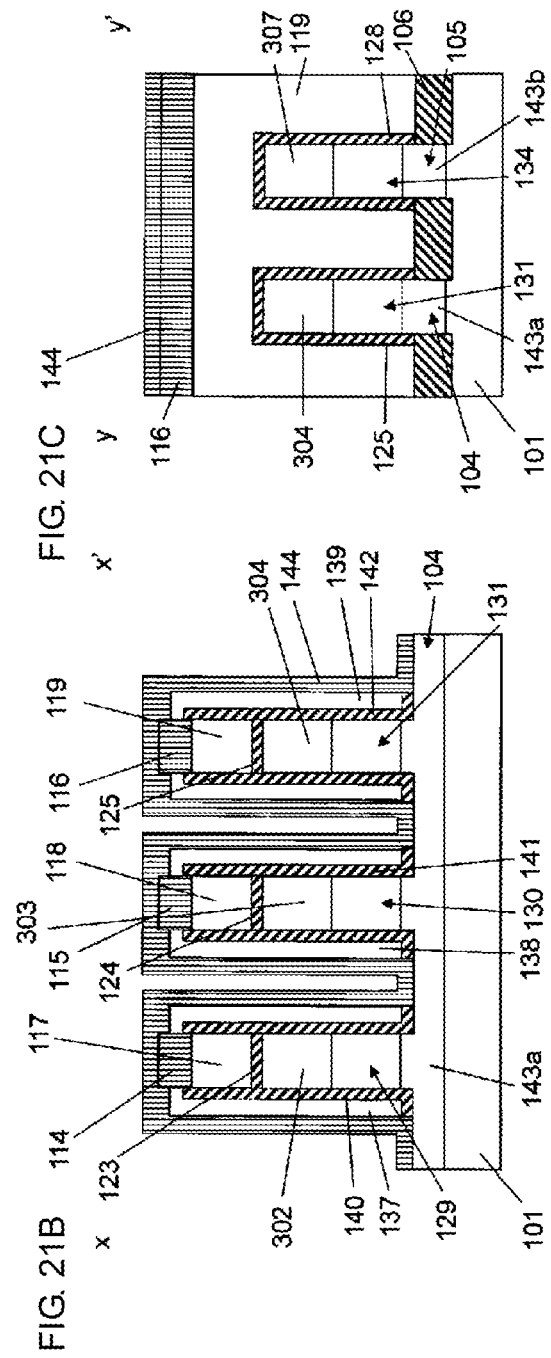

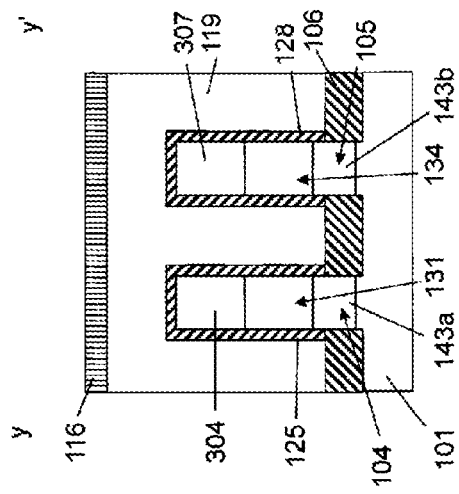

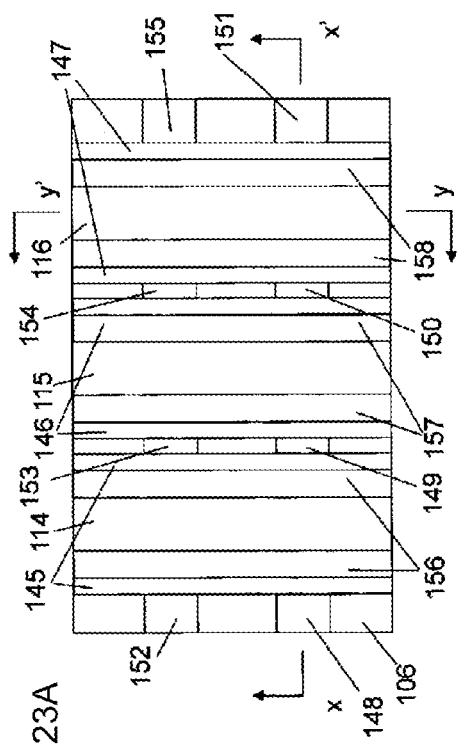
FIG. 23A
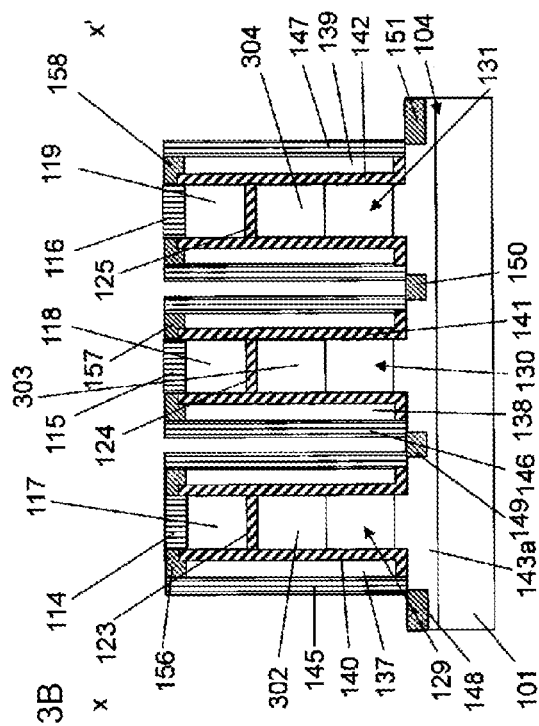
FIG. 23B
FIG. 23C

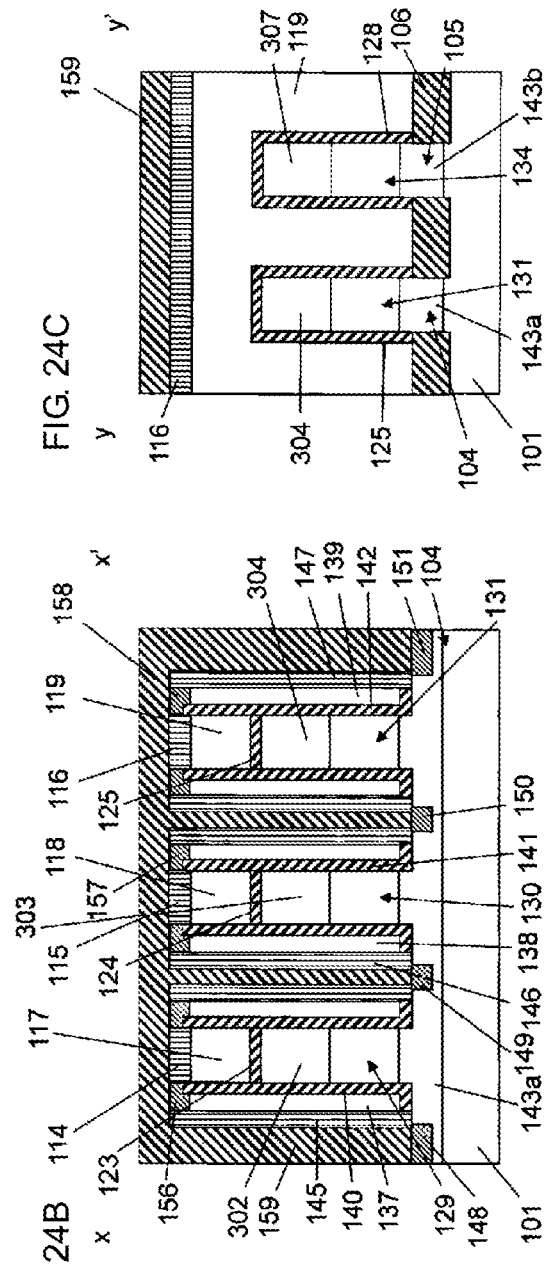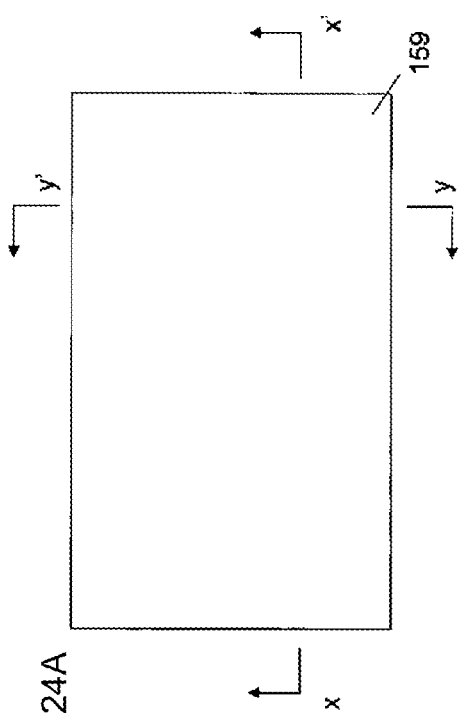

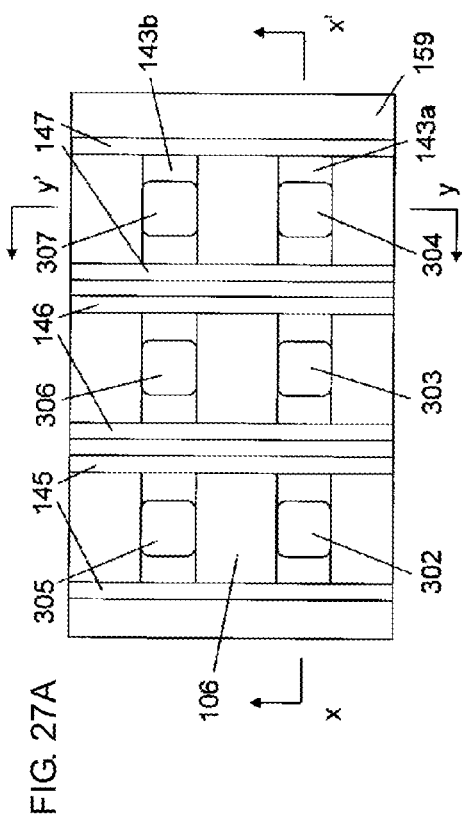
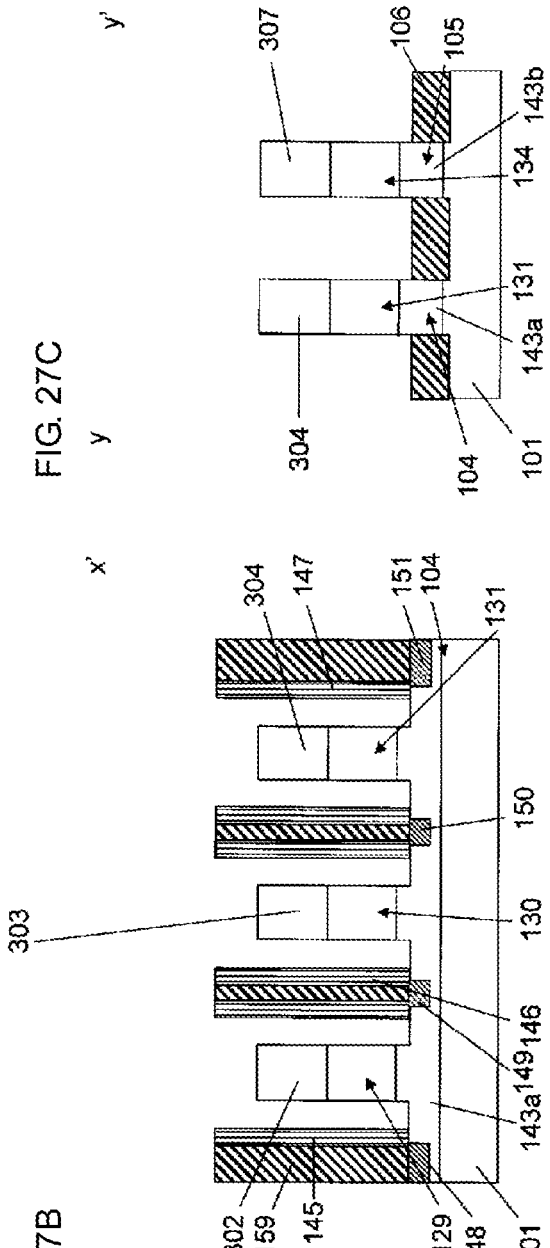
FIG. 27A
FIG. 27B
FIG. 27C

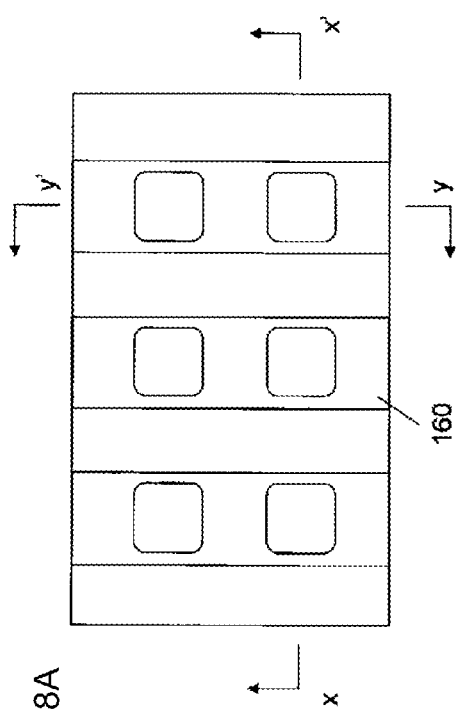
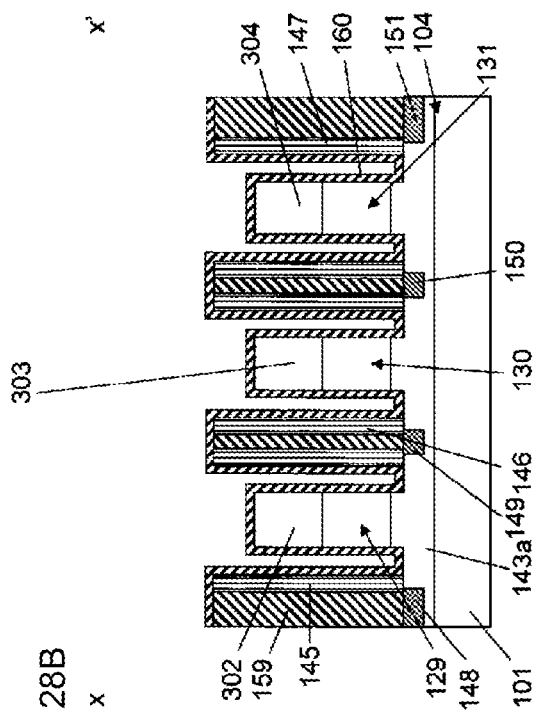
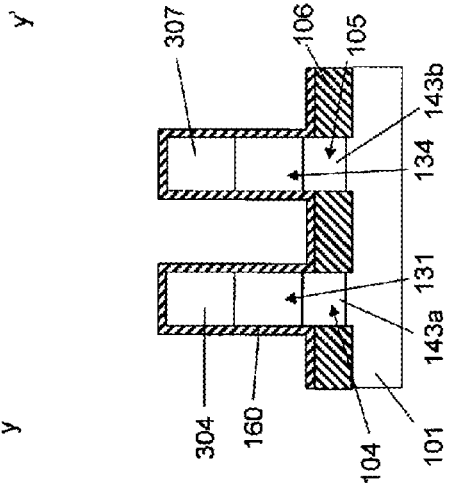
FIG. 28A
FIG. 28B
FIG. 28C

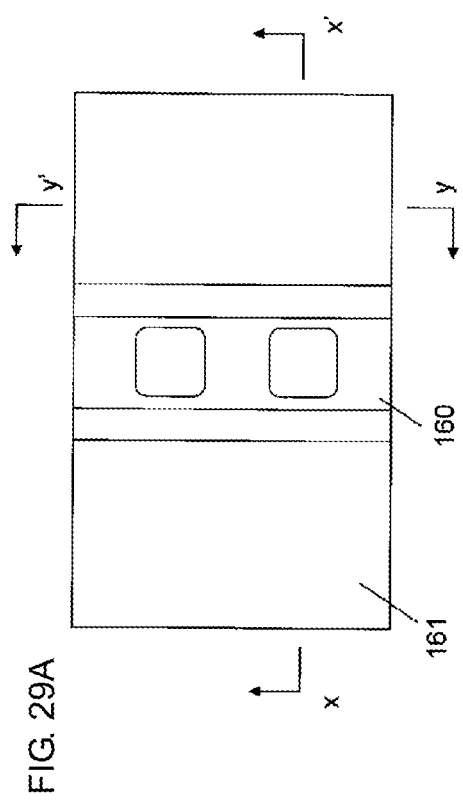
FIG. 29A
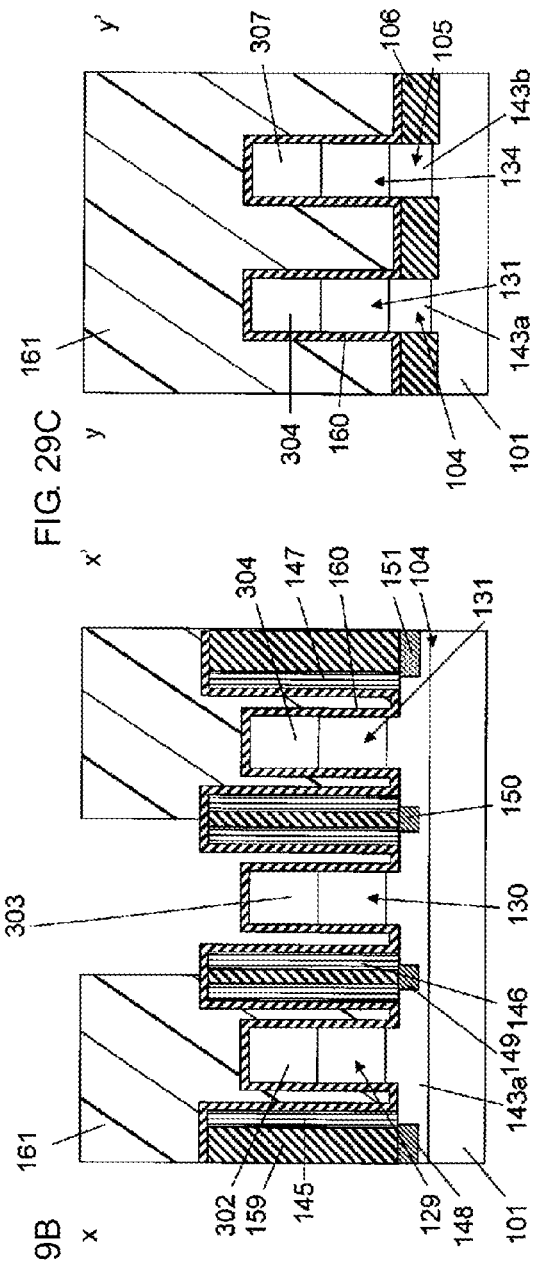
FIG. 29B
FIG. 29C

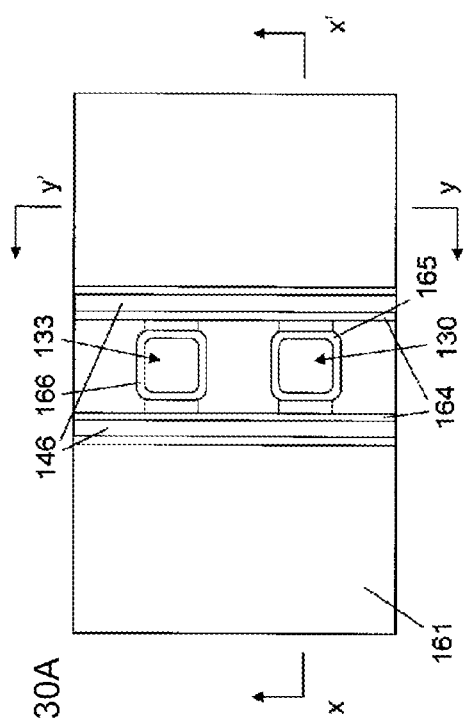
FIG. 30A
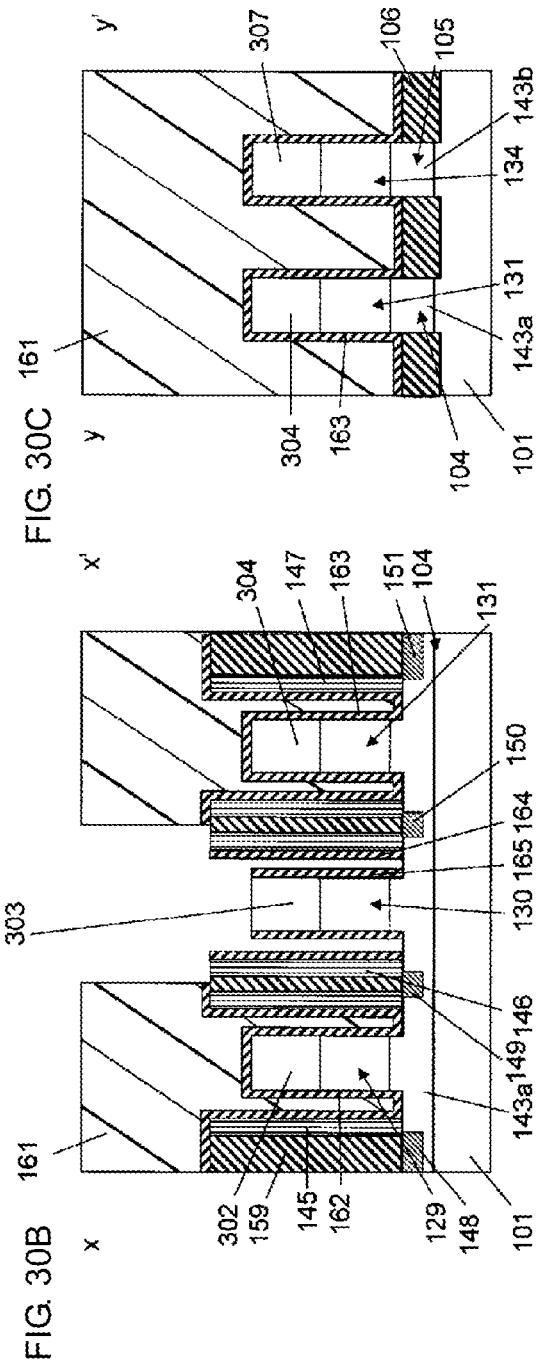
FIG. 30B
FIG. 30C

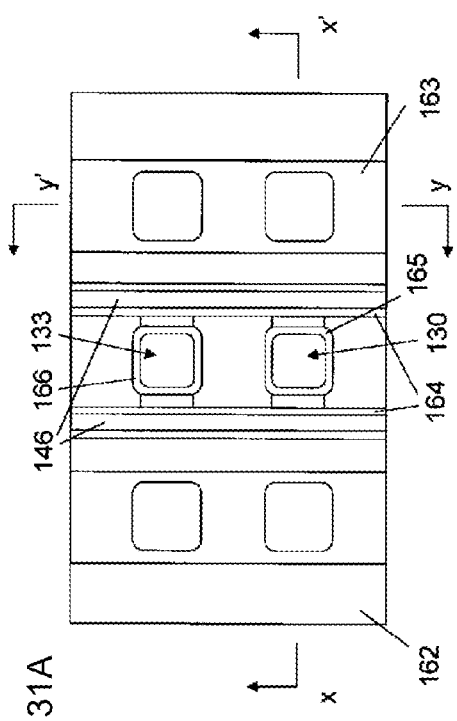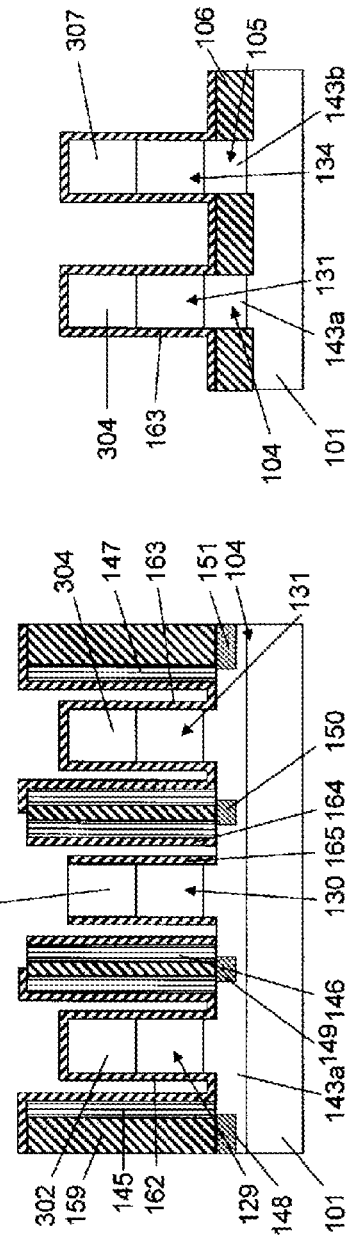
FIG. 31A
FIG. 31B
FIG. 31C

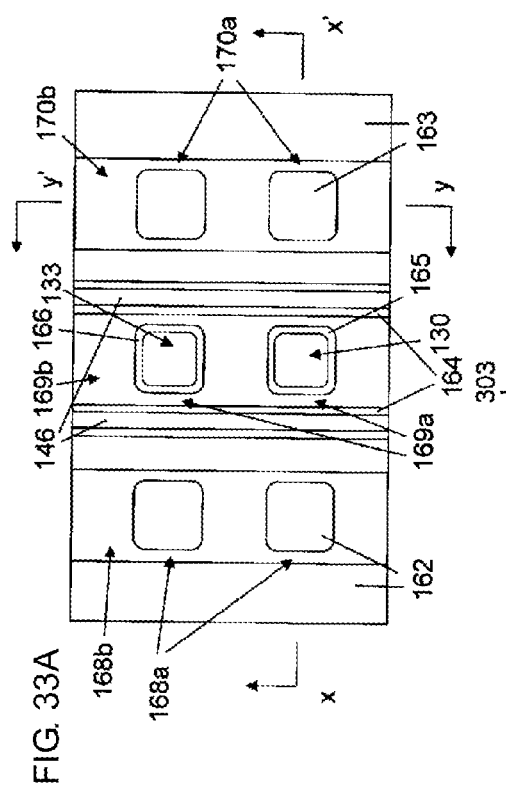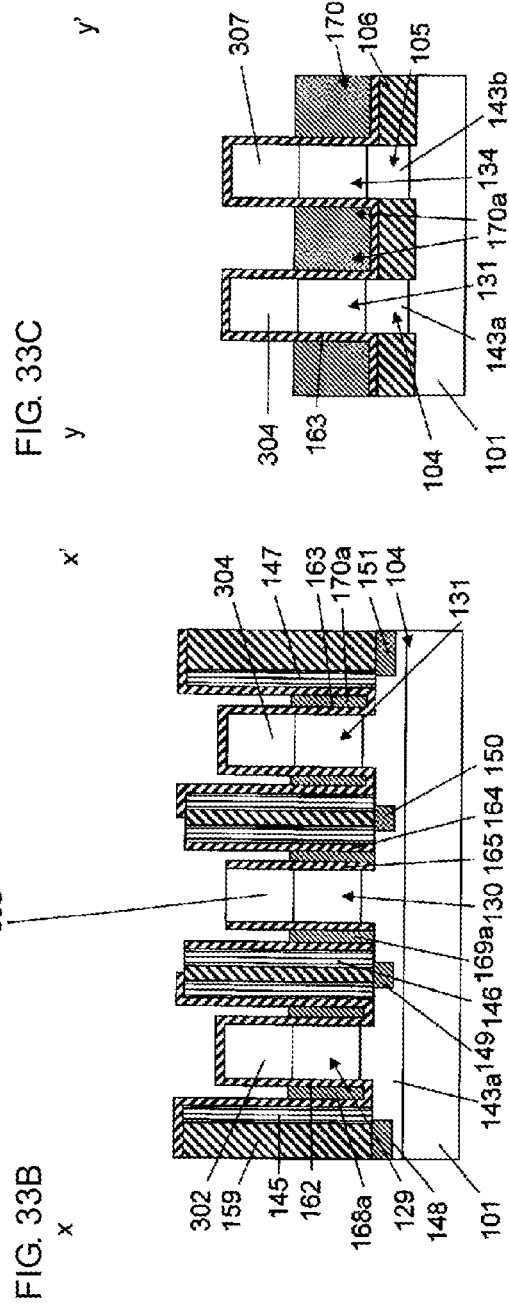
FIG. 33A
FIG. 33B
FIG. 33C

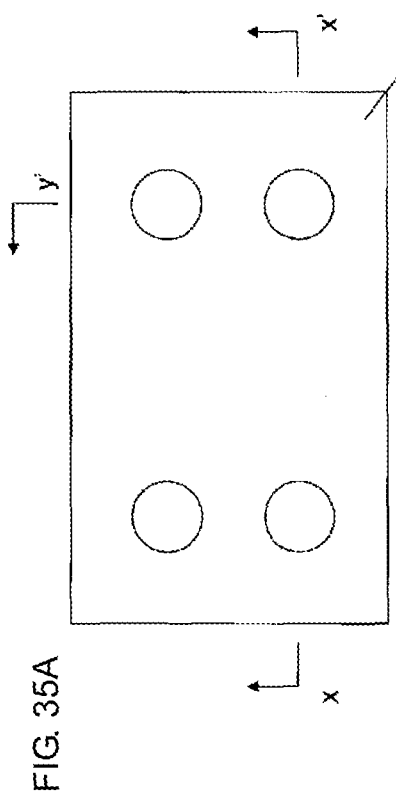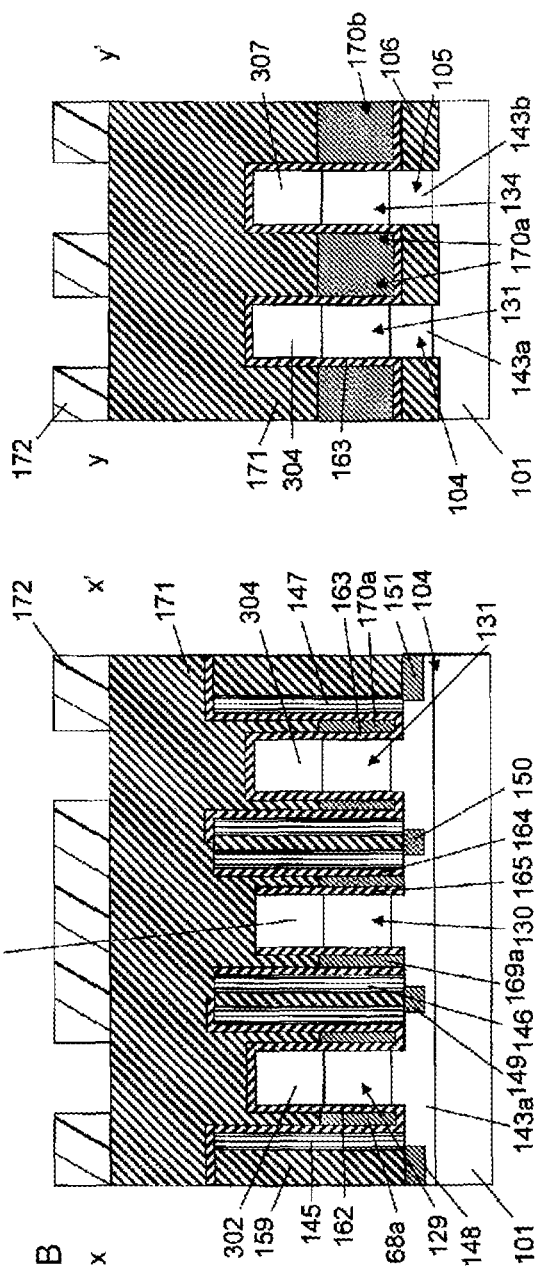
FIG. 35A
FIG. 35B
FIG. 35C

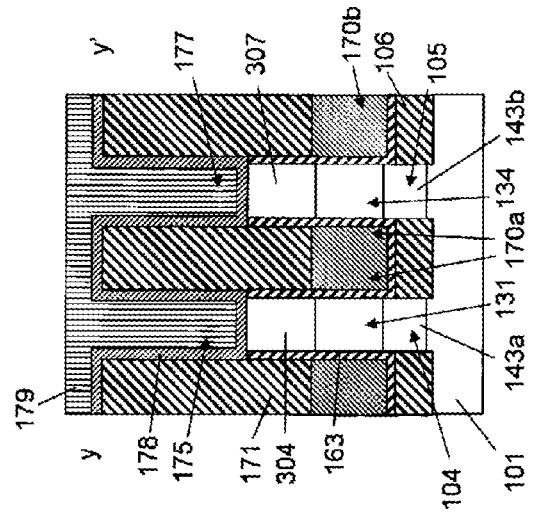
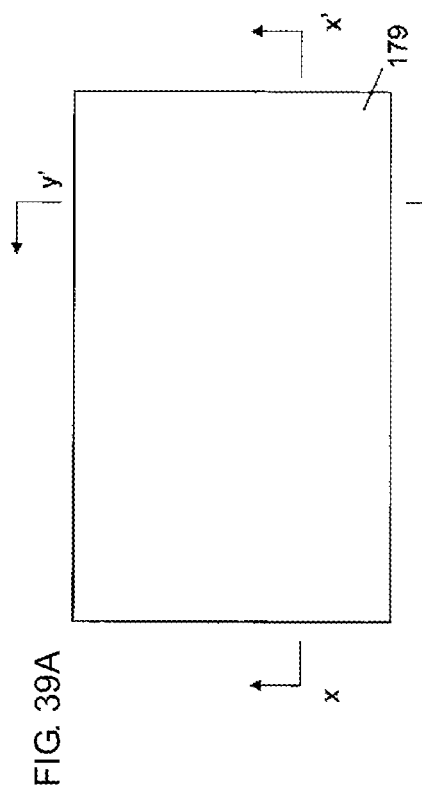
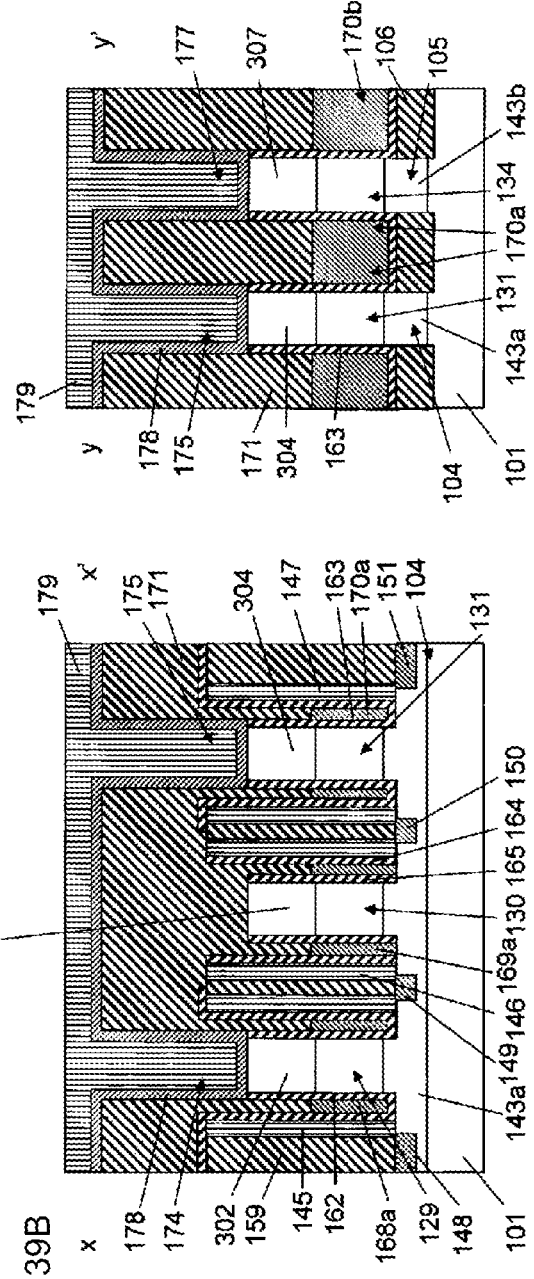
FIG. 39A
FIG. 39B
FIG. 39C

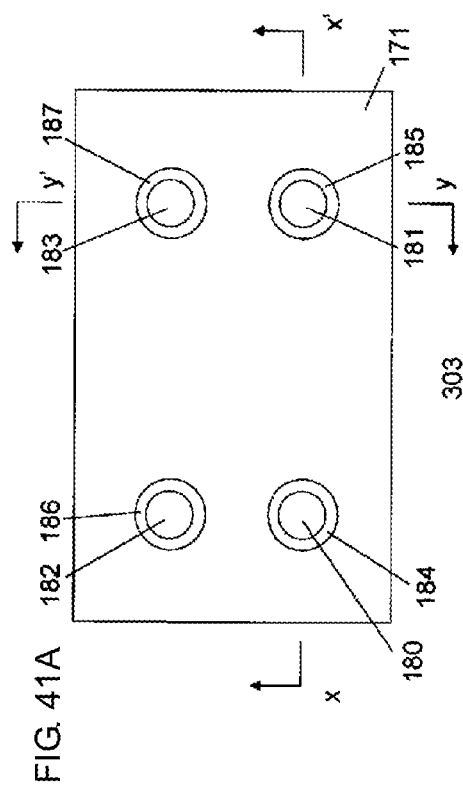
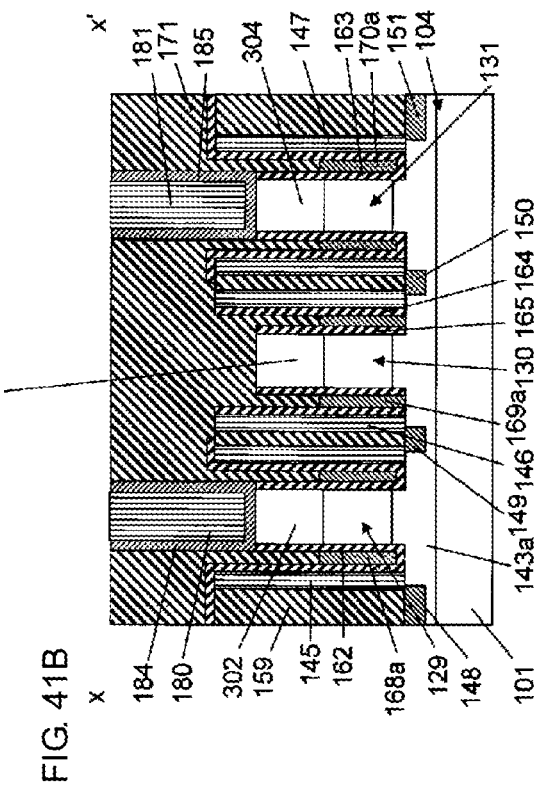
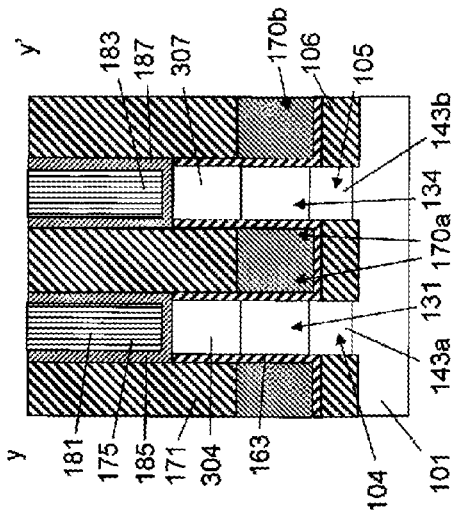
FIG. 41A
FIG. 41B
FIG. 41C

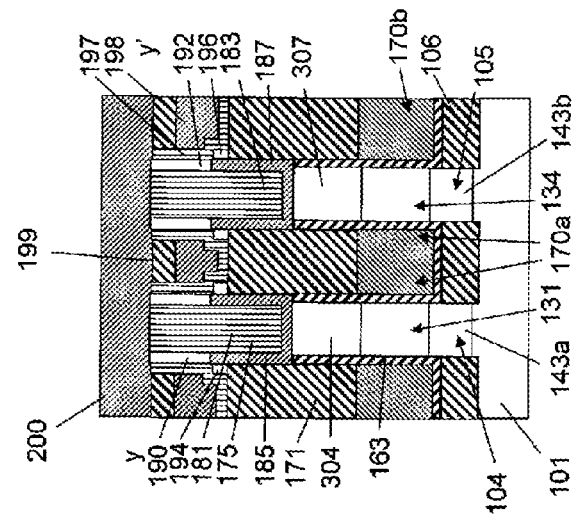
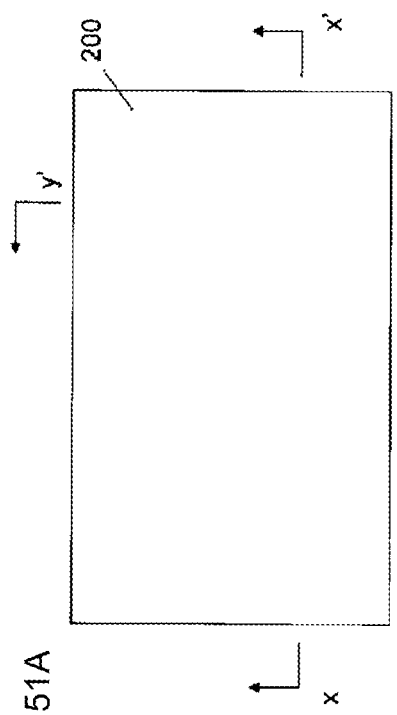
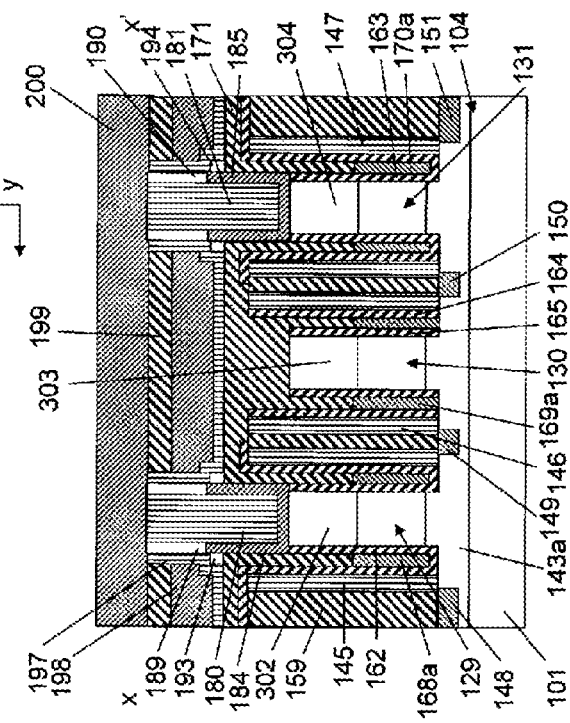
FIG. 51A
FIG. 51B
FIG. 51C

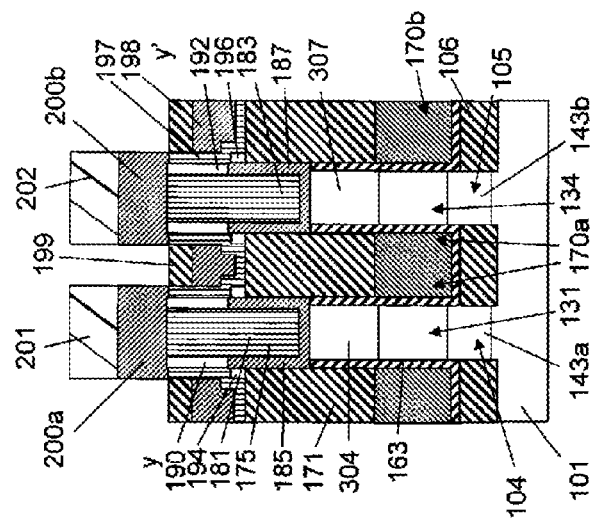
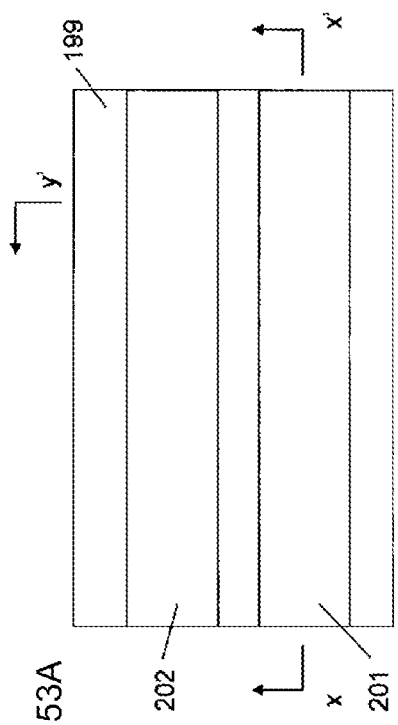
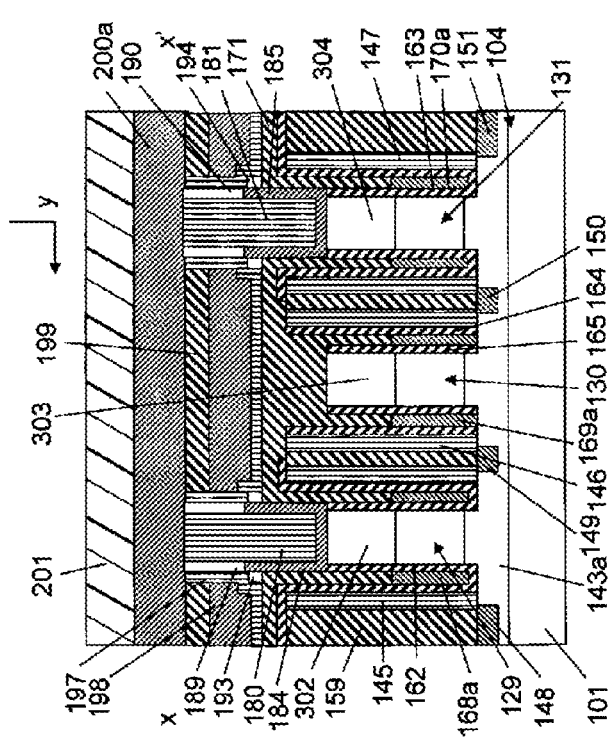

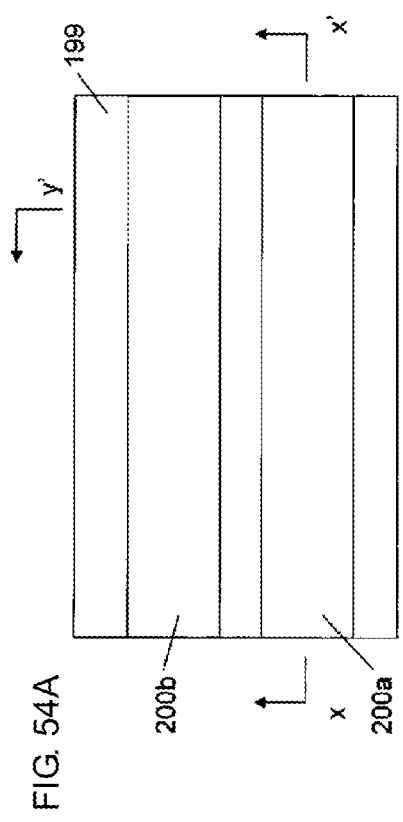
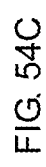
FIG. 54A
FIG. 54B
FIG. 54C

METHOD FOR PRODUCING A MEMORY DEVICE HAVING A PHASE CHANGE FILM AND RESET GATE

CROSS REFERENCES TO RELATED APPLICATION

The present application is a divisional application of U.S. patent application Ser. No. 15/140,189, filed Apr. 27, 2016, which is a continuation application of PCT/JP2014/055038, filed Feb. 28, 2014, the entire contents of which are incorporated herein by reference.

BACKGROUND

1. Technical Field

The present invention relates to a semiconductor device and a method for producing a semiconductor device.

2. Description of the Related Art

Phase-change memories are an emerging memory technology (for example, refer to Japanese Unexamined Patent Application Publication No. 2012-204404) for storing data by recording changes in resistance of data memory elements in memory cells.

The mechanism of phase-change memories involves supplying an electric current between a bit line and a source line by turning a cell transistor ON so that heat generated from a heater of a high-resistance element melts chalcogenide glass (GST: $Ge_2Sb_2Te_5$) in contact with that heater and induces transition. Melting at high temperature (high current) and cooling at a high cooling rate (stopping the supply of current) generate an amorphous state (reset operation). Melting at a relatively low high temperature (low current) and cooling at a low cooling rate (gradually decreasing the current) result in crystallization (set operation). When data is being read, a high current flowing between the bit line and the source line (low resistance=crystalline state) indicates a binary 0, and a low current (high resistance=amorphous) indicates a binary 1 (for example, refer to Japanese Unexamined Patent Application Publication No. 2012-204404).

The reset current used in these memories is as high as 200 μA, for example. In order to cause such a high reset current to flow in a cell transistor, the size of the memory cell needs to be large. A selective element of a bipolar transistor or a diode can be used (for example, refer to Japanese Unexamined Patent Application Publication No. 2012-204404) in order to allow high current to flow.

Since a diode is a two-terminal element, in order to select a memory cell, selecting one source line causes electric current of all memory cells connected to that source line to flow in that one source line. Therefore, an IR drop attributable to the resistance of the source line is large.

In contrast, a bipolar transistor is a three-terminal element. However, since current flows in the base, it is difficult to connect a large number of transistors to a word line.

Decreasing the cross-sectional areas of a GST film and a heater element in the direction of the flow of the electric current decreases the reset current and the read current. Typically, a heater element is formed on a side wall of a gate of a flat transistor and a GST film is formed on top of the gate so as to decrease the cross-sectional areas of the GST film and the heater element in the direction of the flow of the electric current. According to this approach, a cell string of flat transistors is necessary (for example, refer to Japanese Unexamined Patent Application Publication No. 2012-204404).

A surrounding gate transistor (hereinafter referred to as an SGT) that includes a source, a gate, and a drain arranged in a direction perpendicular to a substrate, and a gate electrode surrounding a pillar-shaped semiconductor layer has been proposed (for example, refer to Japanese Unexamined Patent Application Publication No. 2004-356314). Since the source, gate, and drain are arranged in a direction perpendicular to the substrate, a small cell area can be achieved.

SUMMARY

Accordingly, it is desirable to provide a memory device structure that can be reset by using a reset gate and can decrease the cross-sectional areas of the phase change film and the lower electrode in the direction of the current flow, and a method for producing the memory device.

An aspect of the present invention provides a memory device comprising a plurality of memory elements arranged in two or more rows and two or more columns. Each memory element includes a pillar-shaped insulator layer, a phase change film formed around an upper portion of the pillar-shaped insulator layer, a lower electrode formed around a lower portion of the pillar-shaped insulator layer and connected to the phase change film, a reset gate insulating film surrounding the phase change film, and a reset gate surrounding the reset gate insulating film. The reset gates are connected to one another in a row direction and a column direction, the reset gates are heaters, and the phase change films are electrically insulated from the reset gates.

The pillar-shaped insulator layer may be formed of a nitride film, and the lower electrode may also be provided under the pillar-shaped insulator layer.

The reset gate may be formed of titanium nitride.

The reset gate insulating film may be formed of a nitride film.

The lower electrode may be formed of titanium nitride.

The phase change film may be reset by feeding an electric current to the reset gate.

The memory device described above may further comprise first pillar-shaped semiconductor layers, gate insulating films formed around the first pillar-shaped semiconductor layers, gate electrodes formed around the gate insulating films, gate lines connected to the gate electrodes, first diffusion layers formed in upper portions of the first pillar-shaped semiconductor layers, and second diffusion layers formed in lower portions of the first pillar-shaped semiconductor layers, in which the memory elements are formed on the first diffusion layers.

The memory device described above may further comprise fin-shaped semiconductor layers formed on a semiconductor substrate, a first insulating film formed around the fin-shaped semiconductor layers, first pillar-shaped semiconductor layers formed on the fin-shaped semiconductor layers, gate insulating films formed around the first pillar-shaped semiconductor layers, gate electrodes formed around the gate insulating films, gate lines connected to the gate electrodes, first diffusion layers formed in upper portions of the first pillar-shaped semiconductor layers, and second diffusion layers formed in lower portions of the first pillar-shaped semiconductor layers, in which the memory elements are formed on the first diffusion layers, the gate insulating films are formed around and at bottoms of the gate electrodes and the gate lines, the gate electrodes are formed of a metal, the gate lines are formed of a metal, the gate lines extend in a direction perpendicular to a direction in which the fin-shaped semiconductor layers extend, and the second diffusion layers are also formed in the fin-shaped semiconductor layers.

The second diffusion layers may also be formed in the semiconductor substrate.

The memory device may further comprise a contact line parallel to the gate lines, the contact line being connected to the second diffusion layers.

The memory device may further comprise second pillar-shaped semiconductor layers formed on the fin-shaped semiconductor layers, and contact electrodes formed of a metal and formed around the second pillar-shaped semiconductor layers, in which the contact line is connected to the contact electrodes and formed of a metal that extends in a direction perpendicular to the direction in which the fin-shaped semiconductor layers extend, the second diffusion layers are also formed in the fin-shaped semiconductor layers and in lower portions of the second pillar-shaped semiconductor layers, and the contact electrodes are connected to the second diffusion layers.

In the memory device, an outer width of the gate electrodes is equal to a width of the gate lines, and a width of the first pillar-shaped semiconductor layers in a direction perpendicular to the direction in which the fin-shaped semiconductor layers extend is equal to a width of the fin-shaped semiconductor layers in the direction perpendicular to the direction in which the fin-shaped semiconductor layers extend.

The gate insulating films may be formed between the second pillar-shaped semiconductor layers and the contact electrodes.

A width of the second pillar-shaped semiconductor layers in the direction perpendicular to the direction in which the fin-shaped semiconductor layers extend may be equal to a width of the fin-shaped semiconductor layers in the direction perpendicular to the direction in which the fin-shaped semiconductor layers extend.

The gate insulating films may be formed around the contact electrodes and the contact line.

An outer width of the contact electrodes may be equal to a width of the contact line.

The first pillar-shaped semiconductor layers may be formed on a semiconductor substrate; the gate insulating films may also be formed around and at bottoms of the gate electrodes and the gate lines, the gate electrodes may be formed of a metal, the gate lines may be formed of a metal, and the second diffusion layers may also be formed in the semiconductor substrate.

Another aspect of the present invention provides a method for producing a memory device. The method comprises a sixth step that includes depositing a second interlayer insulating film on a substrate, forming contact holes arranged in two or more rows and two or more columns, and depositing a second metal and a nitride film; removing the second metal and the nitride film on the second interlayer insulating film so as to form, inside the contact holes, pillar-shaped nitride film layers arranged in two or more rows and two or more columns, and form lower electrodes surrounding the pillar-shaped nitride film layers and bottom portions thereof and being arranged in two or more rows and two or more columns; etching back the second interlayer insulating film so as to expose upper portions of the lower electrodes surrounding the pillar-shaped nitride film layers; removing the exposed upper portions of the lower electrodes surrounding the pillar-shaped nitride film layers; depositing a phase change film so that the phase change film surrounds the pillar-shaped nitride film layers and connects with the lower electrodes; etching the phase change film into a side wall shape remaining on upper portions of the pillar-shaped nitride film layers; and forming a reset gate insulating film that surrounds the remaining phase change film and forming a reset gate that surrounds the phase change film having the side wall shape and remaining on the upper portions of the pillar-shaped nitride film layers arranged in two or more rows and two or more columns.

Yet another aspect of the present invention provides a method for producing a memory device, the method comprising a first step of forming fin-shaped semiconductor layers on a semiconductor substrate and forming a first insulating film around the fin-shaped semiconductor layers; a second step following the first step, the second step including forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon; a third step following the second step, the third step including forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates; a fourth step of forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers; a fifth step following the fourth step, the fifth step including depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers; and the sixth step described above, the sixth step following the fifth step.

The method may further comprise forming a third insulating film on the first polysilicon after the first polysilicon is deposited and planarized on the second insulating film.

In the method described above, after the fourth insulating film is formed around the first pillar-shaped semiconductor layers, the first dummy gates, the second pillar-shaped semiconductor layers, and the second dummy gates, a third resist may be formed and etched back to expose upper portions of the first pillar-shaped semiconductor layers and first diffusion layers may be formed in the upper portions of the first pillar-shaped semiconductor layers.

BRIEF DESCRIPTION OF THE DRAWING

FIG. 3A is a plan view of yet another memory device according to the present invention, FIG. 3B is a cross-sectional view taken along line x-x' in FIG. 3A, and FIG. 3C is a cross-sectional view taken along line y-y' in FIG. 3A.

FIG. 4A is a plan view related to a method for producing a memory device according to the present invention, FIG. 4B is a cross-sectional view taken along line x-x' in FIG. 4A, and FIG. 4C is a cross-sectional view taken along line y-y' in FIG. 4A.

FIG. 7A is a plan view related to the method for producing a memory device according to the present invention, FIG. 7B is a cross-sectional view taken along line x-x' in FIG. 7A, and FIG. 7C is a cross-sectional view taken along line y-y' in FIG. 7A.

FIG. 8A is a plan view related to the method for producing a memory device according to the present invention, FIG. 8B is a cross-sectional view taken along line x-x' in FIG. 8A, and FIG. 8C is a cross-sectional view taken along line y-y' in FIG. 8A.

FIG. 11A is a plan view related to the method for producing a memory device according to the present invention, FIG. 11B is a cross-sectional view taken along line x-x' in FIG. 11A, and FIG. 11C is a cross-sectional view taken along line y-y' in FIG. 11A.

FIG. 13A is a plan view related to the method for producing a memory device according to the present invention, FIG. 13B is a cross-sectional view taken along line x-x' in FIG. 13A, and FIG. 13C is a cross-sectional view taken along line y-y' in FIG. 13A.

FIG. 17A is a plan view related to the method for producing a memory device according to the present invention, FIG. 17B is a cross-sectional view taken along line x-x' in FIG. 17A, and FIG. 17C is a cross-sectional view taken along line y-y' in FIG. 17A.

FIG. 18A is a plan view related to the method for producing a memory device according to the present invention, FIG. 18B is a cross-sectional view taken along line x-x' in FIG. 18A, and FIG. 18C is a cross-sectional view taken along line y-y' in FIG. 18A.

FIG. 21A is a plan view related to the method for producing a memory device according to the present invention, FIG. 21B is a cross-sectional view taken along line x-x' in FIG. 21A, and FIG. 21C is a cross-sectional view taken along line y-y' in FIG. 21A.

FIG. 22A is a plan view related to the method for producing a memory device according to the present invention, FIG. 22B is a cross-sectional view taken along line x-x' in FIG. 22A, and FIG. 22C is a cross-sectional view taken along line y-y' in FIG. 22A.

FIG. 23A is a plan view related to the method for producing a memory device according to the present invention, FIG. 23B is a cross-sectional view taken along line x-x' in FIG. 23A, and FIG. 23C is a cross-sectional view taken along line y-y' in FIG. 23A.

FIG. 24A is a plan view related to the method for producing a memory device according to the present invention, FIG. 24B is a cross-sectional view taken along line x-x' in FIG. 24A, and FIG. 24C is a cross-sectional view taken along line y-y' in FIG. 24A.

FIG. 27A is a plan view related to the method for producing a memory device according to the present invention, FIG. 27B is a cross-sectional view taken along line x-x' in FIG. 27A, and FIG. 27C is a cross-sectional view taken along line y-y' in FIG. 27A.

FIG. 28A is a plan view related to the method for producing a memory device according to the present invention, FIG. 28B is a cross-sectional view taken along line x-x' in FIG. 28A, and FIG. 28C is a cross-sectional view taken along line y-y' in FIG. 28A.

FIG. 29A is a plan view related to the method for producing a memory device according to the present invention, FIG. 29B is a cross-sectional view taken along line x-x' in FIG. 29A, and FIG. 29C is a cross-sectional view taken along line y-y' in FIG. 29A.

FIG. 30A is a plan view related to the method for producing a memory device according to the present invention, FIG. 30B is a cross-sectional view taken along line x-x' in FIG. 30A, and FIG. 30C is a cross-sectional view taken along line y-y' in FIG. 30A.

FIG. 31A is a plan view related to the method for producing a memory device according to the present invention, FIG. 31B is a cross-sectional view taken along line x-x' in FIG. 31A, and FIG. 31C is a cross-sectional view taken along line y-y' in FIG. 31A.

FIG. 33A is a plan view related to the method for producing a memory device according to the present invention, FIG. 33B is a cross-sectional view taken along line x-x' in FIG. 33A, and FIG. 33C is a cross-sectional view taken along line y-y' in FIG. 33A.

FIG. 35A is a plan view related to the method for producing a memory device according to the present invention, FIG. 35B is a cross-sectional view taken along line x-x' in FIG. 35A, and FIG. 35C is a cross-sectional view taken along line y-y' in FIG. 35A.

FIG. 39A is a plan view related to the method for producing a memory device according to the present invention, FIG. 39B is a cross-sectional view taken along line x-x' in FIG. 39A, and FIG. 39C is a cross-sectional view taken along line y-y' in FIG. 39A.

FIG. 41A is a plan view related to the method for producing a memory device according to the present invention, FIG. 41B is a cross-sectional view taken along line x-x' in FIG. 41A, and FIG. 41C is a cross-sectional view taken along line y-y' in FIG. 41A.

FIG. 46A is a plan view related to the method for producing a memory device according to the present invention, FIG. 46B is a cross-sectional view taken along line x-x' in FIG. 46A, and FIG. 46C is a cross-sectional view taken along line y-y' in FIG. 46A.

FIG. 51A is a plan view related to the method for producing a memory device according to the present invention, FIG. 51B is a cross-sectional view taken along line x-x' in FIG. 51A, and FIG. 51C is a cross-sectional view taken along line y-y' in FIG. 51A.

FIG. 53A is a plan view related to the method for producing a memory device according to the present invention, FIG. 53B is a cross-sectional view taken along line x-x' in FIG. 53A, and FIG. 53C is a cross-sectional view taken along line y-y' in FIG. 53A.

FIG. 54A is a plan view related to the method for producing a memory device according to the present invention, FIG. 54B is a cross-sectional view taken along line x-x' in FIG. 54A, and FIG. 54C is a cross-sectional view taken along line y-y' in FIG. 54A.

DETAILED DESCRIPTION OF THE PREFERRED EMBODIMENTS

Figure 1C:
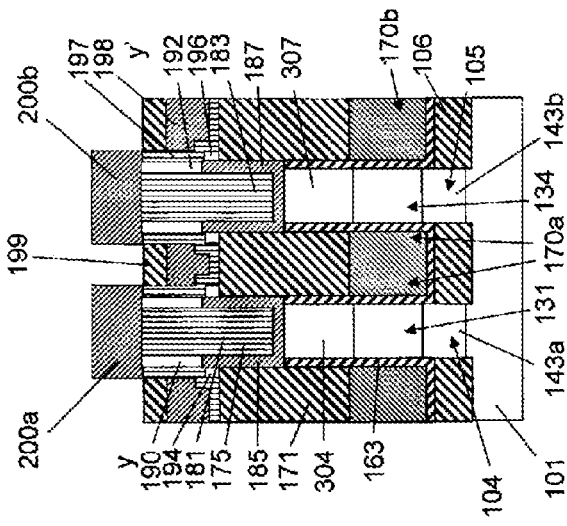
FIG. 1C is a cross-sectional view taken along line y-y' in FIG. 1A.
Figure 1A:
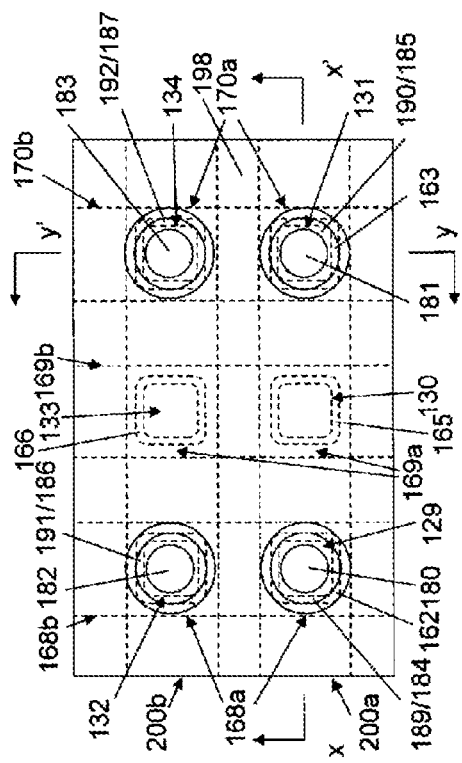
FIG. 1A is a plan view of a memory device according to the present invention.
Figure 1B:
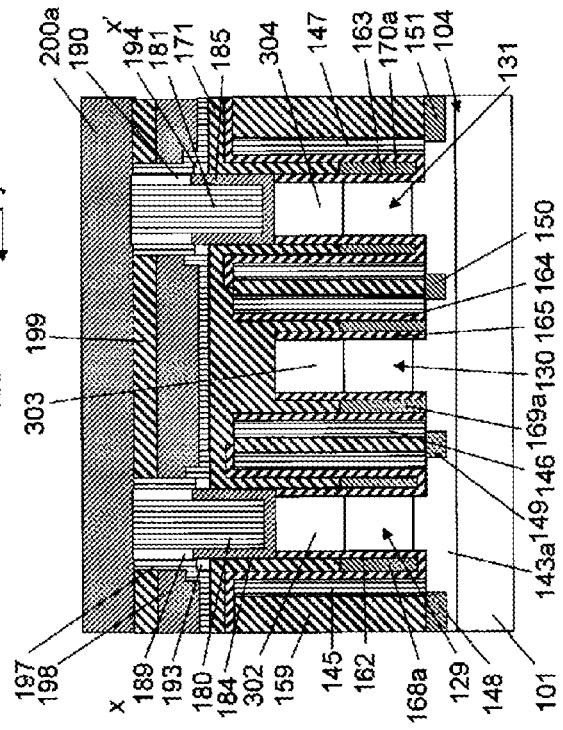
FIG. 1B is a cross-sectional view taken along line x-x' in FIG. 1A.

Referring to FIGS. 1A to 1C, memory cells, which are memory devices according to the present invention, are placed in the first row of the first column, in the first row of the third column, in the second row of the first column, and in the second row of the third column. Contact devices each having a contact electrode and a contact line for connecting source lines to each other are placed in the first row of the second column and in the second row of the second column.

The memory cell in the second row of the first column includes a fin-shaped semiconductor layer 104 formed on a semiconductor substrate 101, a first insulating film 106 formed around the fin-shaped semiconductor layer 104, a first pillar-shaped semiconductor layer 129 formed on the fin-shaped semiconductor layer 104, a gate insulating film 162 formed around the first pillar-shaped semiconductor layer 129, a gate electrode 168a formed of a metal formed around the gate insulating film 162, a gate line 168b formed of a metal connected to the gate electrode 168a, the gate insulating film 162 formed around and at bottoms of the gate electrode 168a and the gate line 168b, a first diffusion layer 302 formed in an upper portion of the first pillar-shaped semiconductor layer 129, and a second diffusion layer 143a formed in a lower portion of the first pillar-shaped semiconductor layer 129. The width of the first pillar-shaped semiconductor layer 129 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The gate line 168b extends in a direction perpendicular to the direction in which the fin-shaped semiconductor layer 104 extends. The outer width of the gate electrode 168a is equal to the width of the gate line 168b. The second diffusion layer 143a is also formed in the fin-shaped semiconductor layer 104.

The memory cell further includes a pillar-shaped insulator layer 180 formed of a nitride film on the first diffusion layer 302, a phase change film 189 formed around an upper portion of the pillar-shaped insulator layer 180, a lower electrode 184 formed around a lower portion of the pillar-shaped insulator layer 180 and connected to the phase change film 189, a reset gate insulating film 197 surrounding the phase change film 189, and a reset gate 198 surrounding the reset gate insulating film 197. The lower electrode 184 is also provided under the pillar-shaped insulator layer 180.

The phase change film 189 is preferably a phase change film formed of chalcogenide glass (GST: $Ge_2Sb_2Te_5$). The lower electrode 184 serving as a heater element is preferably composed of, for example, titanium nitride.

The memory cell in the second row of the third column includes the fin-shaped semiconductor layer 104 formed on the semiconductor substrate 101, the first insulating film 106 formed around the fin-shaped semiconductor layer 104, a first pillar-shaped semiconductor layer 131 formed on the fin-shaped semiconductor layer 104, a gate insulating film 163 formed around the first pillar-shaped semiconductor layer 131, a gate electrode 170a formed of a metal formed around the gate insulating film 163, a gate line 170b formed of a metal connected to the gate electrode 170a, the gate insulating film 163 formed around and at bottoms of the gate electrode 170a and the gate line 170b, a first diffusion layer 304 formed in an upper portion of the first pillar-shaped semiconductor layer 131, and the second diffusion layer 143a formed in a lower portion of the first pillar-shaped semiconductor layer 131. The second diffusion layer 143a is also formed in the fin-shaped semiconductor layer 104. The width of the first pillar-shaped semiconductor layer 131 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The gate line 170b extends in the direction perpendicular to the direction in which the fin-shaped semiconductor layer 104 extends. The outer width of the gate electrode 170a is equal to the width of the gate line 170b.

The memory cell further includes a pillar-shaped insulator layer 181 formed of a nitride film on the first diffusion layer 304, a phase change film 190 formed around an upper portion of the pillar-shaped insulator layer 181, a lower electrode 185 formed around a lower portion of the pillar-shaped insulator layer 181 and connected to the phase change film 190, the reset gate insulating film 197 surrounding the phase change film 190, and the reset gate 198 surrounding the reset gate insulating film 197. The lower electrode 185 is also provided under the pillar-shaped insulator layer 181.

The phase change film 189 is connected to the phase change film 190 via a bit line 200a.

The memory cell in the first row of the first column includes a fin-shaped semiconductor layer 105 formed on the semiconductor substrate 101, the first insulating film 106 formed around the fin-shaped semiconductor layer 105, a first pillar-shaped semiconductor layer 132 formed on the fin-shaped semiconductor layer 105, the gate insulating film 162 formed around the first pillar-shaped semiconductor layer 132, the gate electrode 168a formed of a metal formed around the gate insulating film 162, the gate line 168b formed of a metal connected to the gate electrode 168a, the gate insulating film 162 formed around and at bottoms of the gate electrode 168a and the gate line 168b, a first diffusion layer 305 formed in an upper portion of the first pillar-shaped semiconductor layer 132, and a second diffusion layer 143b formed in a lower portion of the first pillar-shaped semiconductor layer 132. The second diffusion layer 143b is also formed in the fin-shaped semiconductor layer 105. The width of the first pillar-shaped semiconductor layer 132 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The gate line 168b extends in a direction perpendicular to the direction in which the fin-shaped semiconductor layer 105 extends. The outer width of the gate electrode 168a is equal to the width of the gate line 168b.

The memory cell further includes a pillar-shaped insulator layer 182 formed of a nitride film on the first diffusion layer 305, a phase change film 191 formed around an upper portion of the pillar-shaped insulator layer 182, a lower electrode 186 formed around a lower portion of the pillar-shaped insulator layer 182 and connected to the phase change film 191, the reset gate insulating film 197 surrounding the phase change film 191, and the reset gate 198 surrounding the reset gate insulating film 197. The lower electrode 186 is also provided under the pillar-shaped insulator layer 182.

The memory cell in the first row of the third column includes the fin-shaped semiconductor layer 105 formed on the semiconductor substrate 101, the first insulating film 106 formed around the fin-shaped semiconductor layer 105, a first pillar-shaped semiconductor layer 134 formed on the fin-shaped semiconductor layer 105, the gate insulating film 163 formed around the first pillar-shaped semiconductor layer 134, the gate electrode 170a formed of a metal formed around the gate insulating film 163, the gate line 170b formed of a metal connected to the gate electrode 170a, the gate insulating film 163 formed around and at bottoms of the gate electrode 170a and the gate line 170b, a first diffusion layer 307 formed in an upper portion of the first pillar-shaped semiconductor layer 134, and the second diffusion layer 143b formed in a lower portion of the first pillar-shaped semiconductor layer 134. The second diffusion layer 143b is also formed in the fin-shaped semiconductor layer 105. The width of the first pillar-shaped semiconductor layer 134 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The gate line 170b extends in a direction perpendicular to the direction in which the fin-shaped semiconductor layer 105 extends. The outer width of the gate electrode 170a is equal to the width of the gate line 170b.

The memory cell further includes a pillar-shaped insulator layer 183 formed of a nitride film on the first diffusion layer 307, a phase change film 192 formed around an upper portion of the pillar-shaped insulator layer 183, a lower electrode 187 formed around a lower portion of the pillar-shaped insulator layer 183 and connected to the phase change film 192, the reset gate insulating film 197 surrounding the phase change film 192, and the reset gate 198 surrounding the reset gate insulating film 197. The lower electrode 187 is also provided under the pillar-shaped insulator layer 183.

The phase change film 191 is connected to the phase change film 192 via a bit line 200b.

The memory elements that include the pillar-shaped insulator layers 180, 181, 182, and 183, the phase change films 189, 190, 191, and 192 formed around upper portions of the pillar-shaped insulator layers 180, 181, 182, and 183, the lower electrodes 184, 185, 186, and 187 formed around lower portions of the pillar-shaped insulator layers 180, 181, 182, and 183 and connected to the phase change films 189, 190, 191, and 192, the reset gate insulating film 197 surrounding the phase change films 189, 190, 191, and 192, and the reset gate 198 surrounding the reset gate insulating film 197 are arranged in two or more rows and two or more columns. The reset gate 198 provides connections in the row direction and in the column direction. When electric current flows in the reset gate 198, the reset gate 198 serving as a heater generates heat which melts the chalcogenide glass (GST: $Ge_2Sb_2Te_5$) forming the phase change film in contact with this heater and thereby induces phase transition. Since the reset gate 198 is shared by the memory elements in the row direction and the column direction, the memory elements arranged in two or more rows and two or more columns can be reset at once.

The reset gate 198 may be formed of any material that allows electric current to flow and generates heat. For example, titanium nitride can be used.

The reset gate insulating film 197 may be any insulating film that has good heat conductivity. For example, a nitride film can be used.

The lower electrodes 184, 185, 186, and 187 may be formed of any material that allows electric current to flow and generates heat. for example, titanium nitride can be used.

Since the pillar-shaped insulator layers 180, 181, 182, and 183, the phase change films 189, 190, 191, and 192 formed around upper portions of the pillar-shaped insulator layers 180, 181, 182, and 183, and the lower electrodes 184, 185, 186, and 187 formed around lower portions of the pillar-shaped insulator layers 180, 181, 182, and 183 and connected to the phase change films 189, 190, 191, and 192 are provided, the cross-sectional areas of the phase change films and the lower electrodes serving as heater elements in a direction of the current flow can be decreased.

When the pillar-shaped insulator layers 180, 181, 182, and 183 are nitride films, the phase change films can be cooled more quickly. Since the lower electrodes 184, 185, 186, and 187 are also provided under the pillar-shaped insulator layers 180, 181, 182, and 183, the contact resistance between the selective transistor and the corresponding one of the lower electrodes 184, 185, 186, and 187 can be decreased.

Since the gate electrodes 168a and 170a are formed of metal and the gate lines 168b and 170b are formed of metal, cooling can be accelerated. Since the gate insulating films 162 and 163 formed around and at bottoms of the gate electrodes 168a and 170a and the gate lines are provided, metal gates are formed by a gate-last process. Thus, the metal gate process and the high-temperature process can be both employed.

The gate insulating films 162 and 163 are formed around and at bottoms of the gate electrodes 168a and 170a and the gate lines 168b and 170b, the gate electrodes 168a and 170a are formed of a metal, the gate lines 168b and 170b are formed of a metal, the gate lines 168b and 170b extend in a direction perpendicular to the direction in which the fin-shaped semiconductor layers 104 and 105 extend, the second diffusion layers 143a and 143b are also formed in the fin-shaped semiconductor layers 104 and 105, the outer width of the gate electrodes 168a and 170a is equal to the width of the gate lines 168b and 170b, and the width of the first pillar-shaped semiconductor layers 129, 131, 132, and 134 is equal to the width of the fin-shaped semiconductor layers 104 and 105. Due to these features, the fin-shaped semiconductor layers 104 and 105, the first pillar-shaped semiconductor layers 129, 131, 132, and 134, the gate electrodes 168a and 170a, and the gate lines 168b and 170b of this semiconductor device are formed by self-alignment using two masks. Thus, the number of steps can be reduced.

The contact device in the second row of the second column includes the fin-shaped semiconductor layer 104 formed on the semiconductor substrate 101, the first insulating film 106 formed around the fin-shaped semiconductor layer 104, a second pillar-shaped semiconductor layer 130 formed on the fin-shaped semiconductor layer 104, a contact electrode 169a formed of a metal formed around the second pillar-shaped semiconductor layer 130, a gate insulating film 165 formed between the second pillar-shaped semiconductor layer 130 and the contact electrode 169a, a contact line 169b connected to the contact electrode 169a and formed of a metal extending in a direction perpendicular to the direction in which the fin-shaped semiconductor layer 104 extends, a gate insulating film 164 formed around the contact electrode 169a and the contact line 169b, and the second diffusion layer 143a formed in the fin-shaped semiconductor layer 104 and in a lower portion of the second pillar-shaped semiconductor layer 130. The width of the second pillar-shaped semiconductor layer 130 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The outer width of the contact electrode 169a is equal to the width of the contact line 169b. The contact electrode 169a is connected to the second diffusion layer 143a.

The contact device in the first row of the second column includes the fin-shaped semiconductor layer 105 formed on the semiconductor substrate 101, the first insulating film 106 formed around the fin-shaped semiconductor layer 105, a second pillar-shaped semiconductor layer 133 formed on the fin-shaped semiconductor layer 105, the contact electrode 169a formed of a metal formed around the second pillar-shaped semiconductor layer 133, a gate insulating film 166 formed between the second pillar-shaped semiconductor layer 133 and the contact electrode 169a, the contact line 169b connected to the contact electrode 169a and formed of a metal extending in a direction perpendicular to the direction in which the fin-shaped semiconductor layer 105 extends, the gate insulating film 164 formed around the contact electrode 169a and the contact line 169b, and the second diffusion layer 143b formed in the fin-shaped semiconductor layer 105 and in a lower portion of the second pillar-shaped semiconductor layer 133. The width of the second pillar-shaped semiconductor layer 133 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The outer width of the contact electrode 169a is equal to the width of the contact line 169b. The contact electrode 169a is connected to the second diffusion layer 143b.

Since the contact line 169b is parallel to the gate lines 168b and 170b and connected to the second diffusion layers 143a and 143b, the second diffusion layers 143a and 143b are connected to each other and thus the resistance of the source line can be decreased and the increase in source voltage caused by current at the time of the set operation can be reduced. The contact line 169b parallel to the gate lines 168b and 170b is preferably provided one for each two, four, eight, sixteen, thirty-two, or sixty-four memory cells arranged in one column in the direction of the bit lines 200a and 200b, for example.

The structure formed by the second pillar-shaped semiconductor layers 130 and 133, and the contact electrodes 169a and the contact line 169b formed around the second pillar-shaped semiconductor layers 130 and 133 is identical to the transistor structure except that the contact electrodes 169a are connected to the second diffusion layers 143a and 143b. All source lines formed of the second diffusion layers 143a and 143b parallel to the gate lines 168b and 170b are connected to the contact line 169b. Thus, the number of steps can be reduced.

Figure 2C:
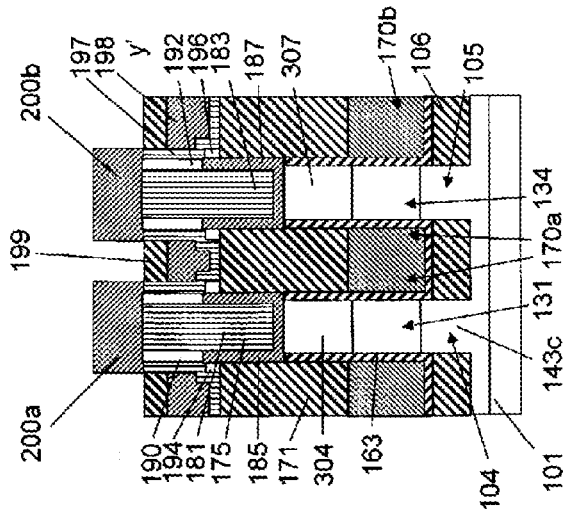
FIG. 2C is a cross-sectional view taken along line y-y' in FIG. 2A.
Figure 2A:
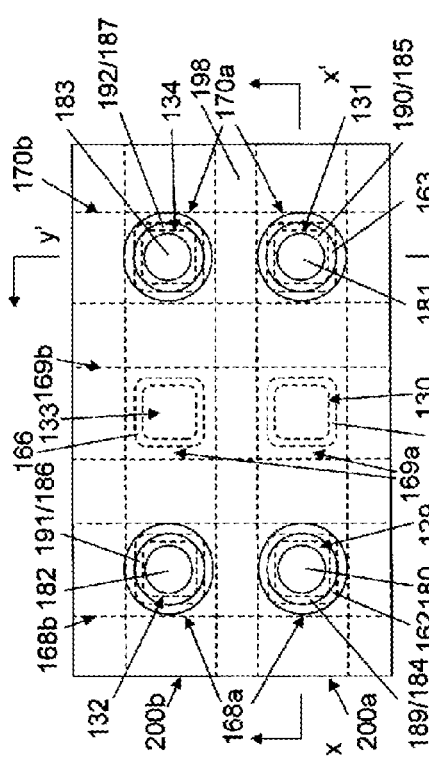
FIG. 2A is a plan view of another memory device according to the present invention.
Figure 2B:
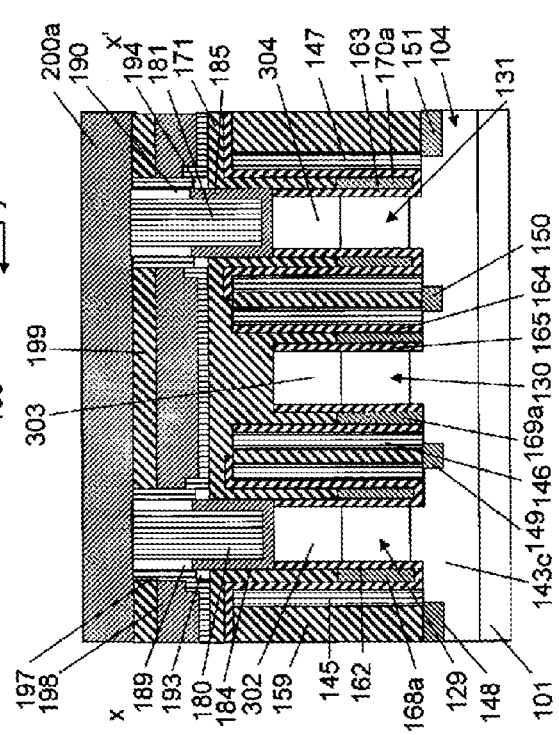
FIG. 2B is a cross-sectional view taken along line x-x' in FIG. 2A.

FIGS. 2A to 2C show a structure in which a second diffusion layer 143c is formed down to a deeper position in the semiconductor substrate 101 so that the second diffusion layers 143a and 143b shown in FIGS. 1A to 1C are connected into one layer. According to this structure, the source resistance can be further reduced.

FIGS. 3A to 3C show a structure obtained by omitting the fin-shaped semiconductor layer 105 and the first insulating film 106 formed around the fin-shaped semiconductor layer 105 from the structure shown in FIGS. 2A to 2C and forming a second diffusion layer 143d on the semiconductor substrate 101. According to this structure, the source resistance can be further reduced.

The steps for producing a memory device structure according to an embodiment of the present invention will now be described with reference to FIGS. 4A to 54C.

To begin with, a first step of forming fin-shaped semiconductor layers on a semiconductor substrate and forming a first insulating film around the fin-shaped semiconductor layers is described. In this embodiment, a silicon substrate is used; alternatively, the substrate may be composed of a semiconductor other than silicon.

Referring to FIGS. 4A to 4C, first resists 102 and 103 for forming fin-shaped silicon layers are formed on a semiconductor substrate 101.

Figure 5C:
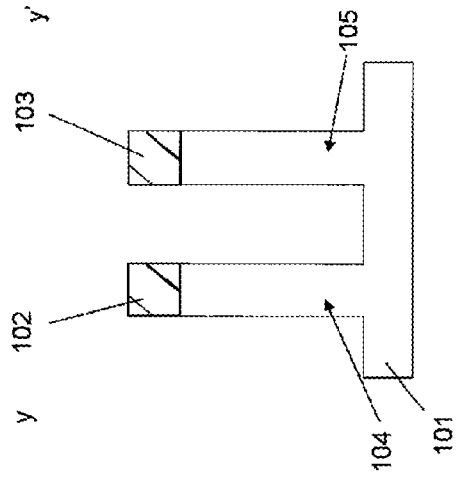
FIG. 5C is a cross-sectional view taken along line y-y' in FIG. 5A.
Figure 5A:
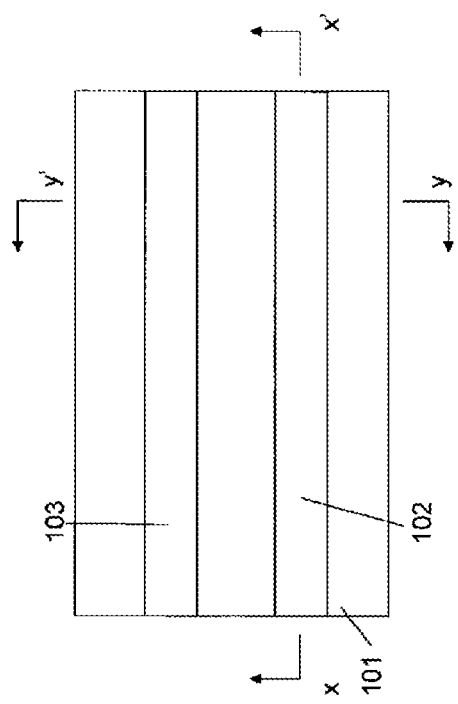
FIG. 5A is a plan view related to the method for producing a memory device according to the present invention.
Figure 5B:
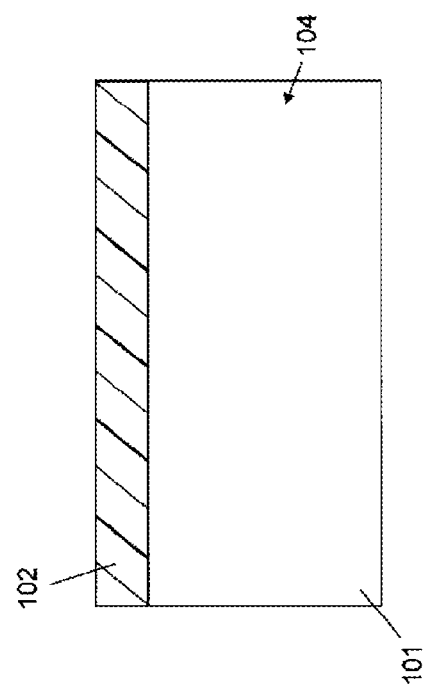
FIG. 5B is a cross-sectional view taken along line x-x' in FIG. 5A.

Referring to FIGS. 5A to 5C, the semiconductor substrate 101 is etched to form fin-shaped silicon layers 104 and 105. Alternatively, a hard mask such as an oxide film or a nitride film may be used to form the fin-shaped silicon layers instead of the resist mask used in this embodiment.

Figure 6C:
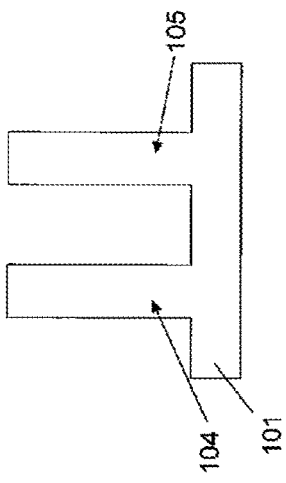
FIG. 6C is a cross-sectional view taken along line y-y' in FIG. 6A.
Figure 6A:
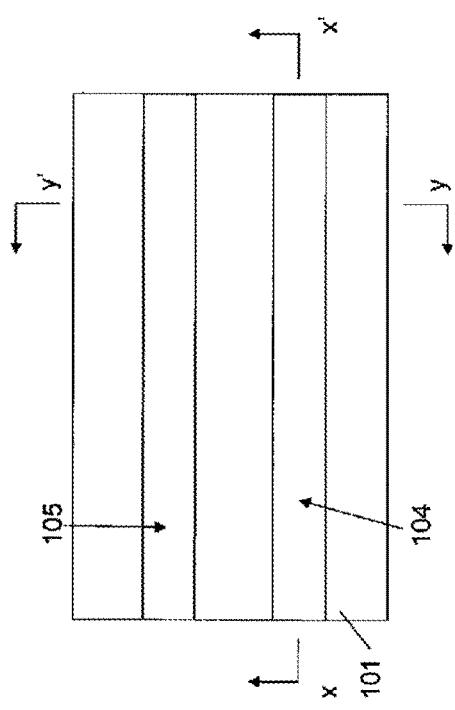
FIG. 6A is a plan view related to the method for producing a memory device according to the present invention.
Figure 6B:
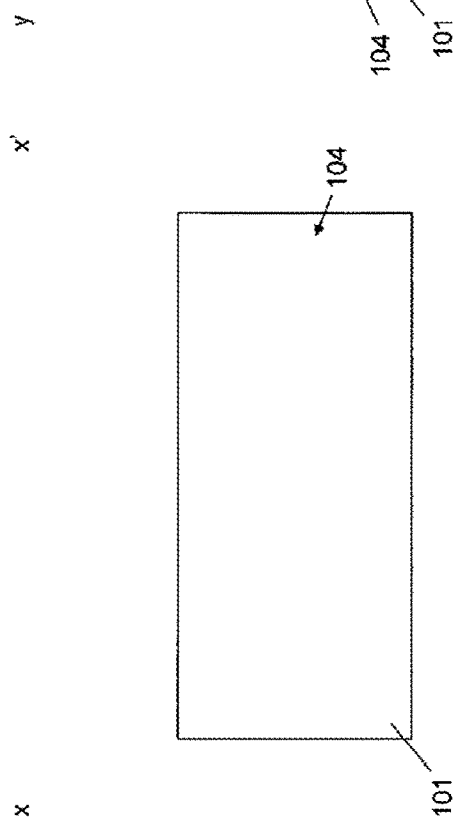
FIG. 6B is a cross-sectional view taken along line x-x' in FIG. 6A.

Referring to FIGS. 6A to 6C, the first resists 102 and 103 are removed.

Referring to FIGS. 7A to 7C, a first insulating film 106 is deposited around the fin-shaped silicon layers 104 and 105. The first insulating film may be an oxide film formed by a high-density plasma process or an oxide film formed by low-pressure chemical vapor deposition (CVD).

Referring to FIGS. 8A to 8C, the first insulating film 106 is etched back to expose upper portions of the fin-shaped silicon layers 104 and 105.

The description up to this paragraph is the description of the first step of forming fin-shaped semiconductor layers on a semiconductor substrate and forming a first insulating film around the fin-shaped semiconductor layers.

Next, a second step following the first step is described. The second step includes forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon.

Figure 9A:
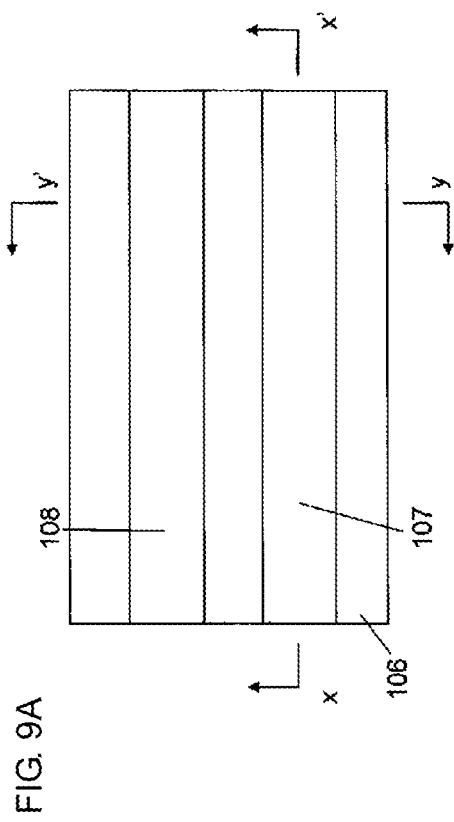
FIG. 9A is a plan view related to the method for producing a memory device according to the present invention.
Figure 9C:
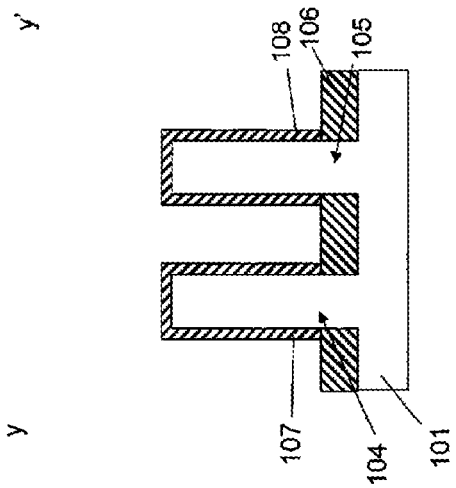
FIG. 9C is a cross-sectional view taken along line y-y' in FIG. 9A.
Figure 9B:
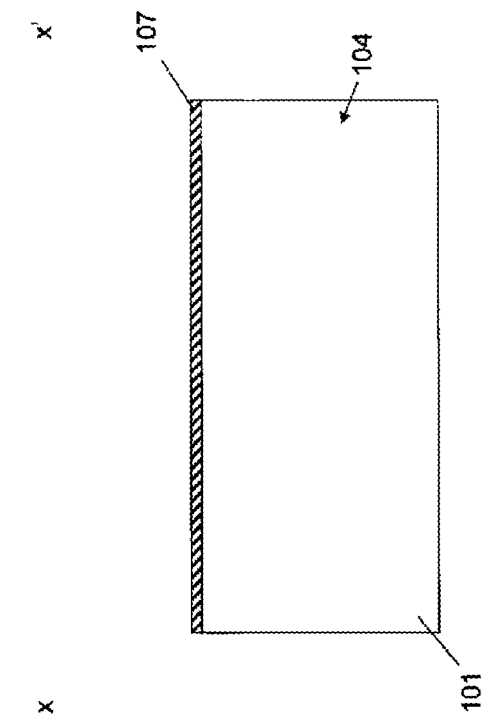
FIG. 9B is a cross-sectional view taken along line x-x' in FIG. 9A.

Referring now to FIGS. 9A to 9C, second insulating films 107 and 108 are formed around the fin-shaped silicon layers 104 and 105. The second insulating films 107 and 108 are preferably oxide films.

Figure 10A:
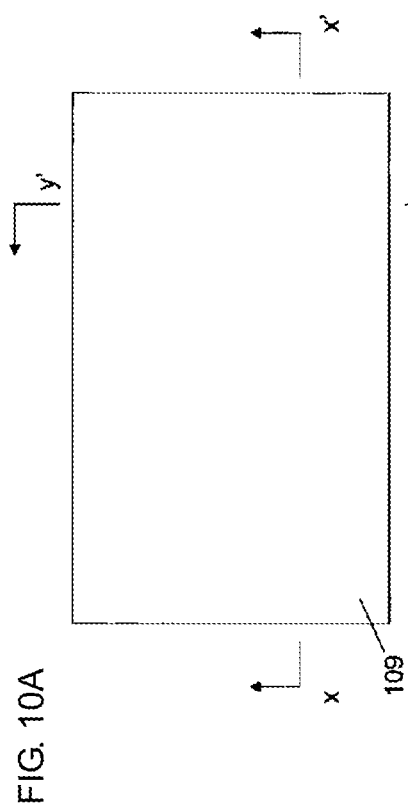
FIG. 10A is a plan view related to the method for producing a memory device according to the present invention.
Figure 10C:
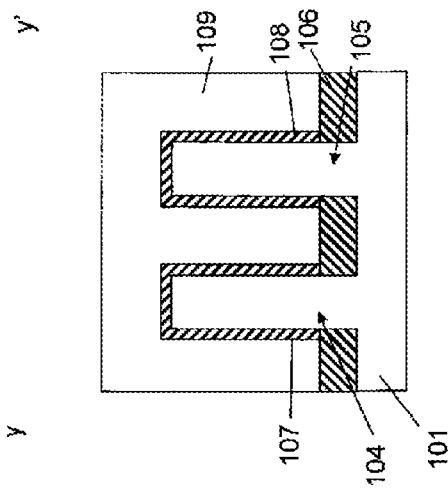
FIG. 10C is a cross-sectional view taken along line y-y' in FIG. 10A.
Figure 10B:
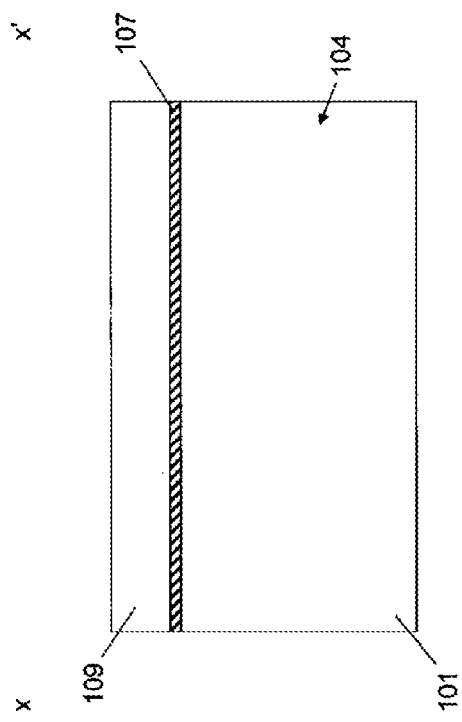
FIG. 10B is a cross-sectional view taken along line x-x' in FIG. 10A.

Referring to FIGS. 10A to 10C, a first polysilicon 109 is deposited on the second insulating films 107 and 108 and the deposited first polysilicon 109 is planarized.

Referring to FIGS. 11A to 11C, a third insulating film 110 is formed on the first polysilicon 109. The third insulating film 110 is preferably a nitride film.

Figure 12A:
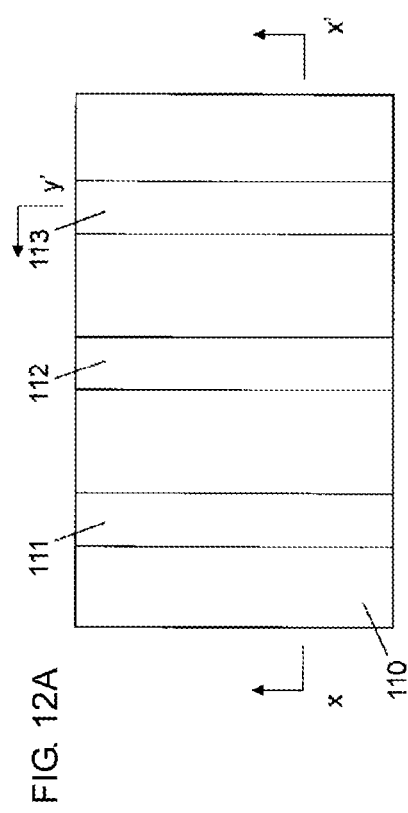
FIG. 12A is a plan view related to the method for producing a memory device according to the present invention.
Figure 12C:
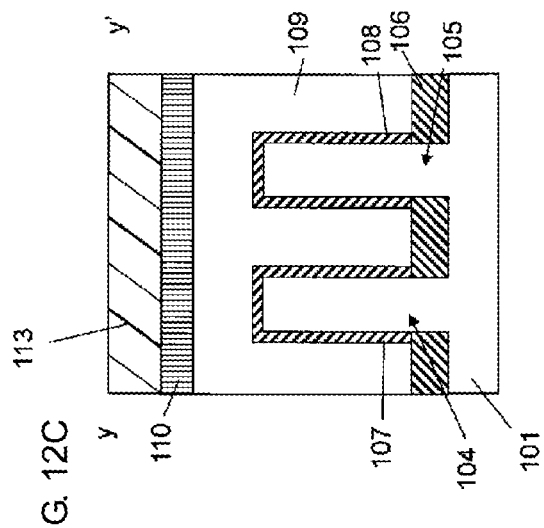
FIG. 12C is a cross-sectional view taken along line y-y' in FIG. 12A.
Figure 12B:
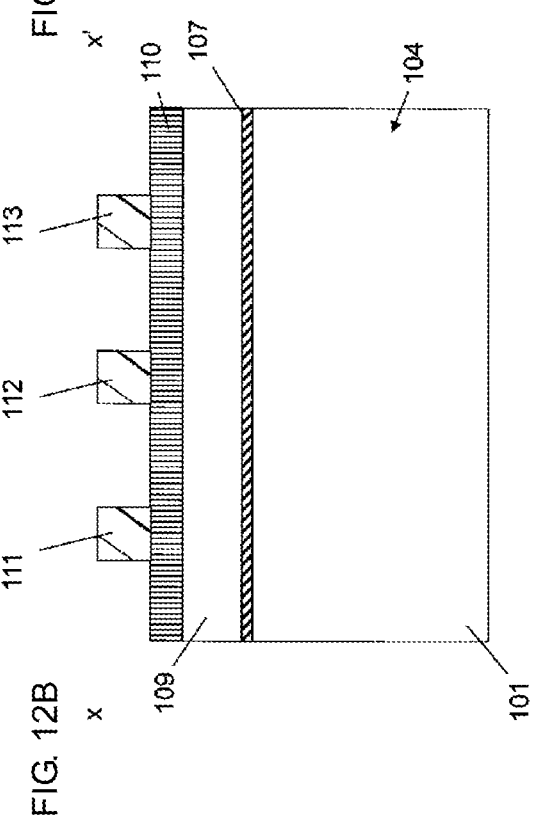
FIG. 12B is a cross-sectional view taken along line x-x' in FIG. 12A.

Referring to FIGS. 12A to 12C, second resists 111, 112, and 113 for forming gate lines 168b and 170b, first pillar-shaped semiconductor layers 129, 131, 132, and 134, second pillar-shaped semiconductor layers 130 and 133, and a contact line 169b are formed in a direction perpendicular to the direction in which the fin-shaped silicon layers 104 and 105 extend.

Referring to FIGS. 13A to 13C, the third insulating film 110, the first polysilicon 109, the second insulating films 107 and 108, and the fin-shaped silicon layers 104 and 105 are etched to form first pillar-shaped silicon layers 129, 131, 132, and 134, first dummy gates 117 and 119 formed of the first polysilicon, second pillar-shaped silicon layers 130 and 133, and a second dummy gate 118 formed of the first polysilicon. During this process, the third insulating film 110 is divided into third insulating films 114, 115, and 116. Moreover, the second insulating films 107 and 108 are divided into second insulating films 123, 124, 125, 126, 127, and 128. If the second resists 111, 112, and 113 are removed during the process of etching, the third insulating films 114, 115, and 116 serve as a hard mask. There is no need to use third insulating films if the second resists are not removed by etching.

Figure 14A:
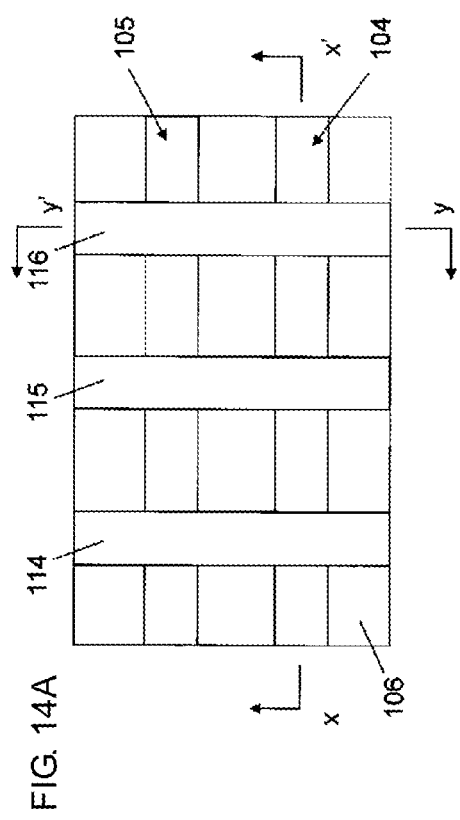
FIG. 14A is a plan view related to the method for producing a memory device according to the present invention.
Figure 14B:
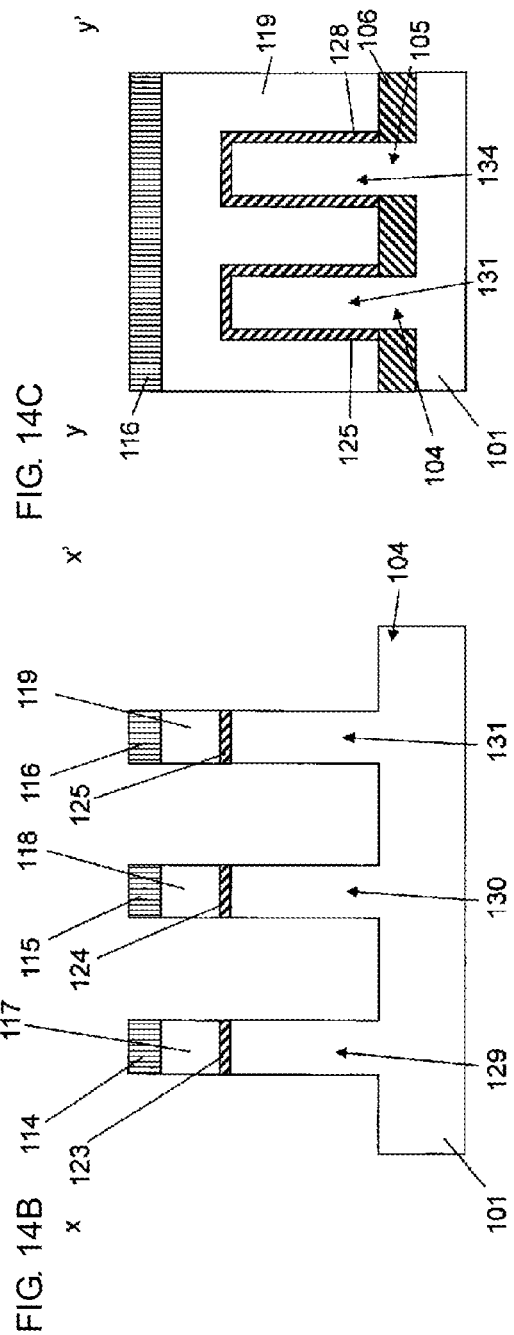
FIG. 14B is a cross-sectional view taken along line x-x' in FIG. 14A.
Figure 14C:
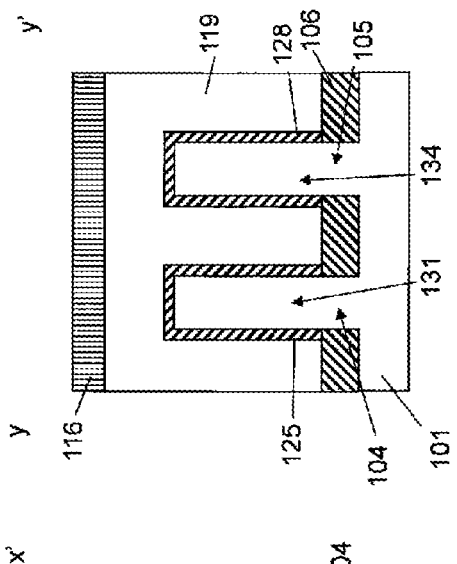
FIG. 14C is a cross-sectional view taken along line y-y' in FIG. 14A.

Referring to FIGS. 14A to 14C, the second resists 114, 115, and 116 are removed.

The description up to this paragraph is the description of the second step following the first step, the second step including forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon.

Next, a third step following the second step is described. The third step includes forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates.

Figure 15C:
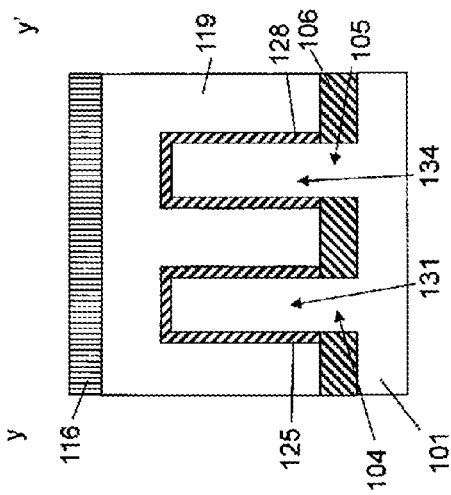
FIG. 15C is a cross-sectional view taken along line y-y' in FIG. 15A.
Figure 15A:
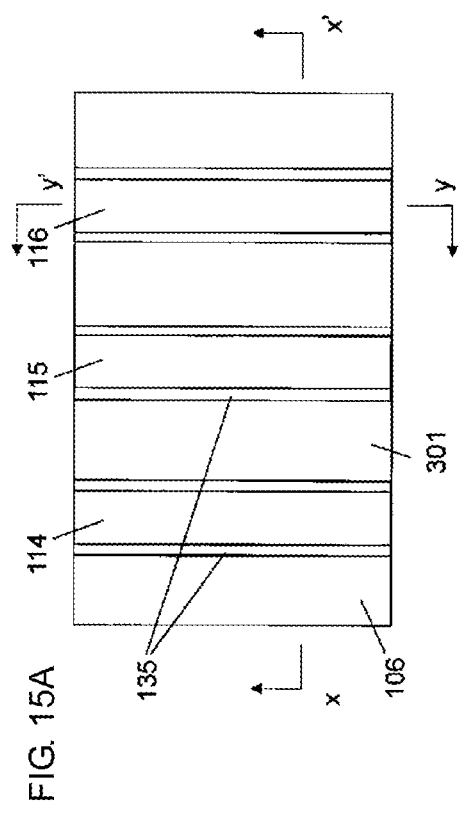
FIG. 15A is a plan view related to the method for producing a memory device according to the present invention.
Figure 15B:
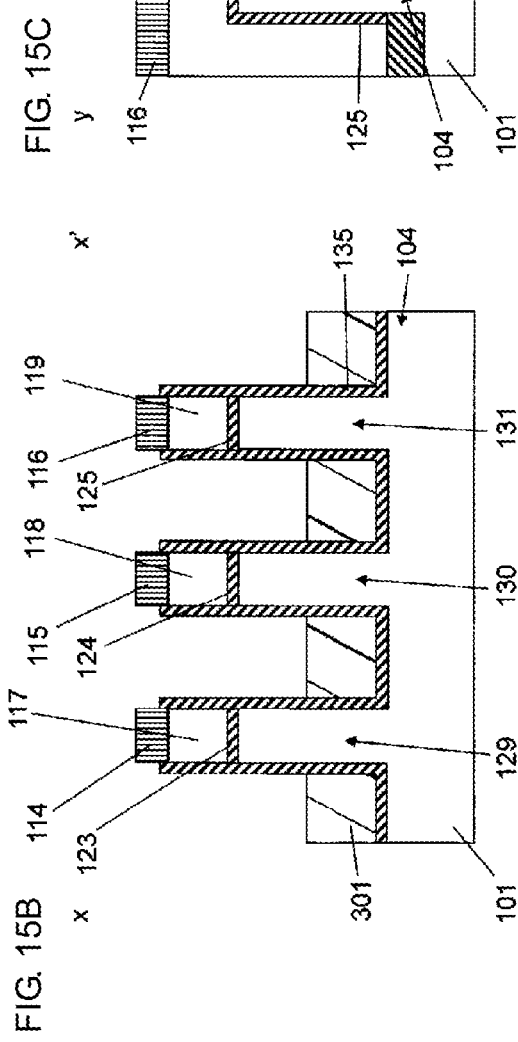
FIG. 15B is a cross-sectional view taken along line x-x' in FIG. 15A.

Referring to FIGS. 15A to 15C, a fourth insulating film 135 is formed around the first pillar-shaped silicon layers 129, 131, 132, and 134, the second pillar-shaped silicon layers 130 and 133, the first dummy gates 117 and 119, and the second dummy gate 118. The fourth insulating film 135 is preferably an oxide film. A third resist 301 is formed and etching-back is performed so as to expose upper portions of the first pillar-shaped silicon layers 129, 131, 132, and 134. During this process, upper portions of the second pillar-shaped silicon layers 130 and 133 may also be exposed.

Figure 16C:
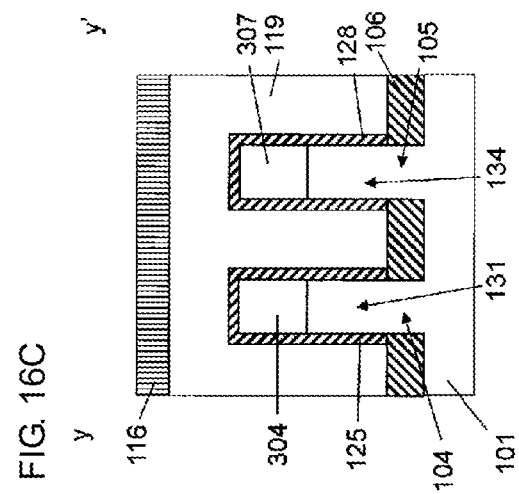
FIG. 16C is a cross-sectional view taken along line y-y' in FIG. 16A.
Figure 16A:
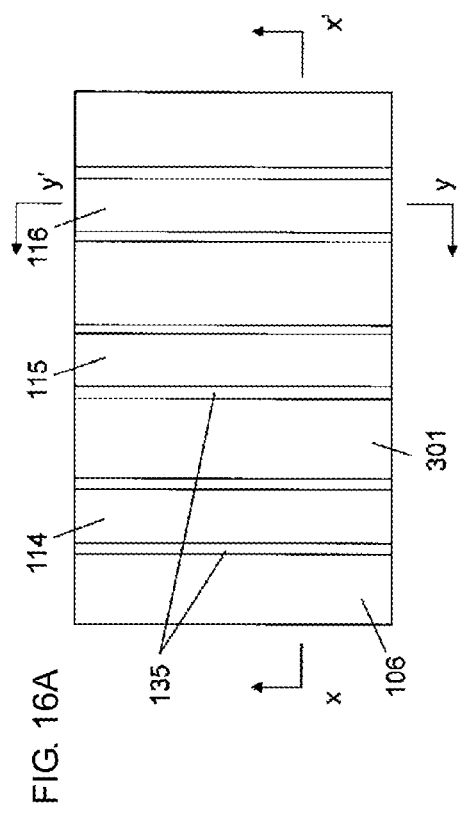
FIG. 16A is a plan view related to the method for producing a memory device according to the present invention.
Figure 16B:
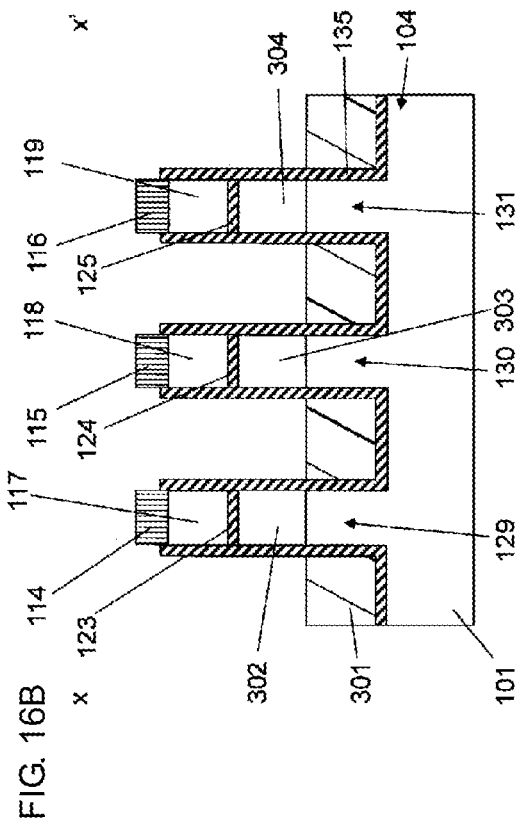
FIG. 16B is a cross-sectional view taken along line x-x' in FIG. 16A.

Referring to FIGS. 16A to 16C, an impurity is introduced so as to form first diffusion layers 302, 304, 305, and 307 in upper portions of the first pillar-shaped silicon layers 129, 131, 132, and 134. First diffusion layers 303 and 306 may be formed in upper portions of the second pillar-shaped silicon layers 130 and 133. To form n-type diffusion layers, arsenic or phosphorus is preferably introduced. To form p-type diffusion layers, boron is preferably introduced.

Referring to FIGS. 17A to 17C, the third resist 301 is removed.

Referring to FIGS. 18A to 18C, a second polysilicon 136 is deposited around the fourth insulating film 135.

Figure 19C:
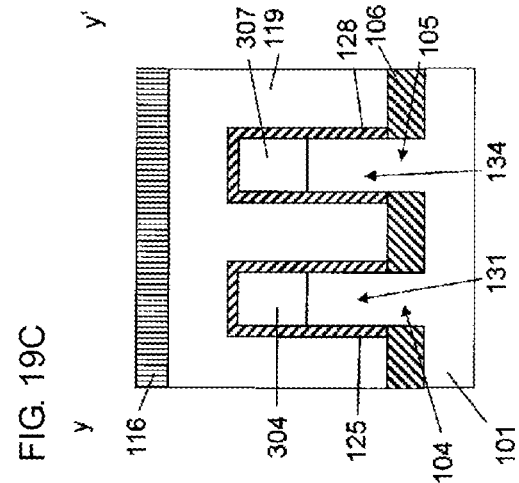
FIG. 19C is a cross-sectional view taken along line y-y' in FIG. 19A.
Figure 19A:
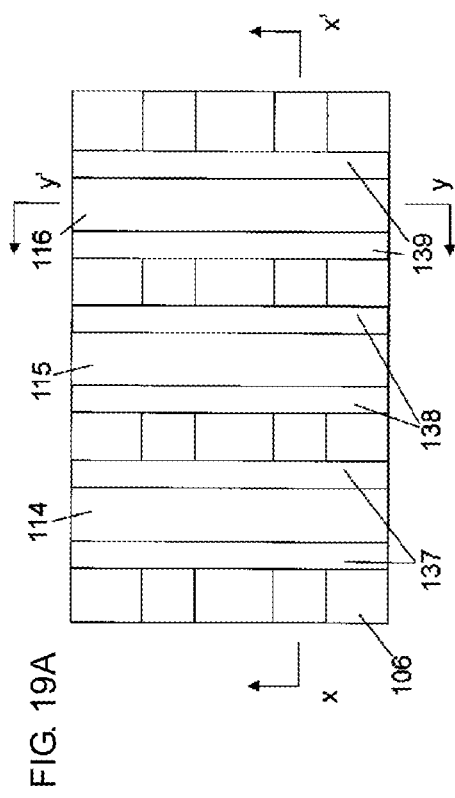
FIG. 19A is a plan view related to the method for producing a memory device according to the present invention.
Figure 19B:
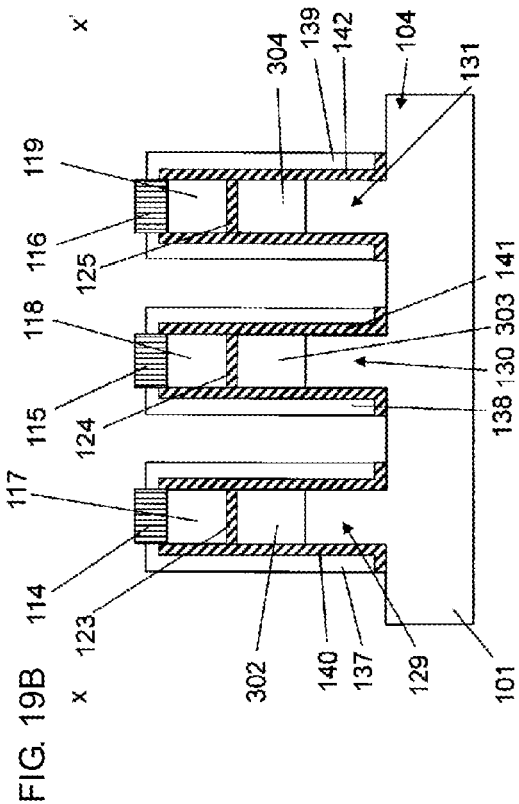
FIG. 19B is a cross-sectional view taken along line x-x' in FIG. 19A.

Referring to FIGS. 19A to 19C, the second polysilicon 136 is etched so that the second polysilicon 136 remains on the side walls of the first dummy gates 117 and 119, the first pillar-shaped silicon layers 129, 131, 132, and 134, the second dummy gate 118, and the second pillar-shaped silicon layers 130 and 133, and forms third dummy gates 137 and 139 and a fourth dummy gate 138. During this process, the fourth insulating film 135 may be divided into fourth insulating films 140, 141, and 142.

The description up to this paragraph is the description of the third step following the second step, the third step including forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates.

Next, a fourth step is described which includes forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers.

Figure 20A:
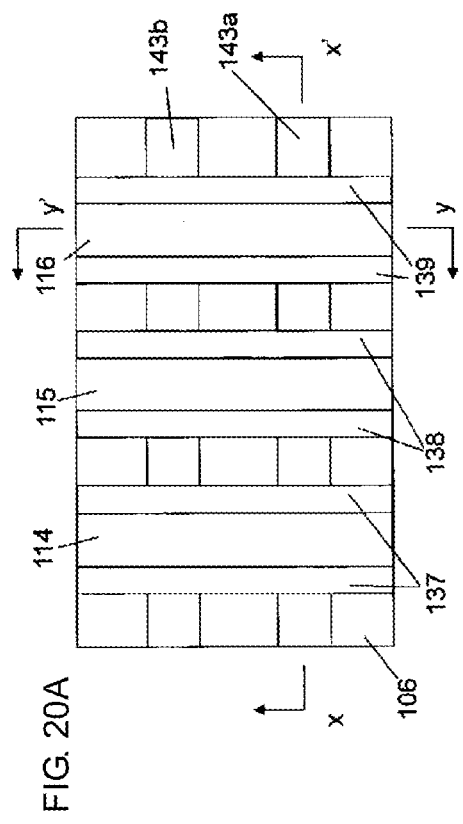
FIG. 20A is a plan view related to the method for producing a memory device according to the present invention.
Figure 20B:
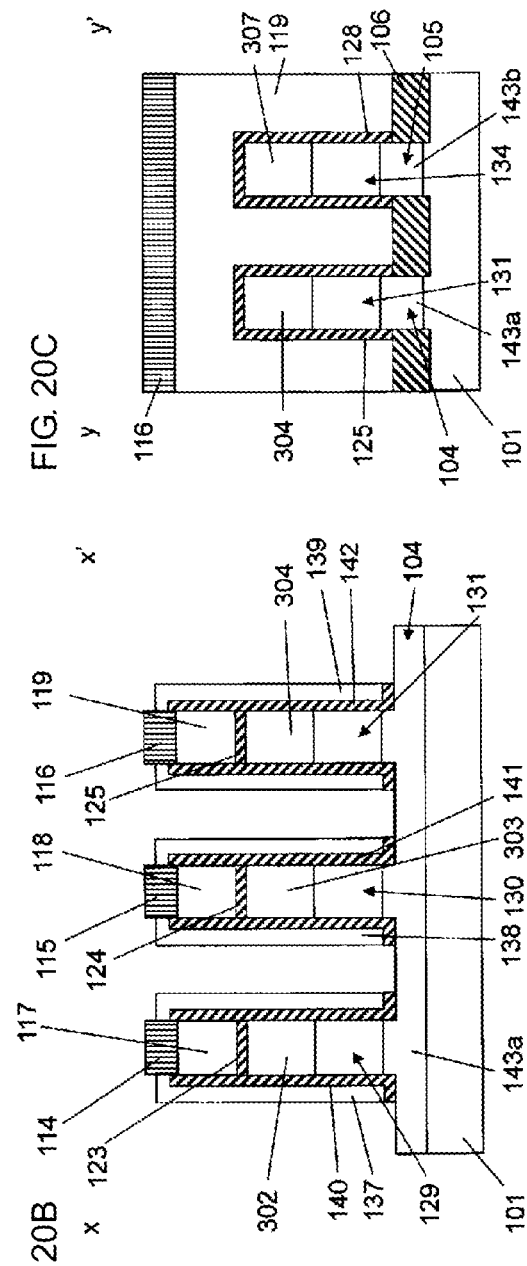
FIG. 20B is a cross-sectional view taken along line x-x' in FIG. 20A.
Figure 20C:
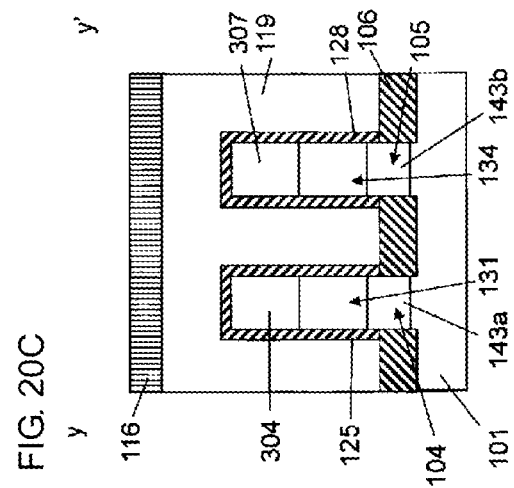
FIG. 20C is a cross-sectional view taken along line y-y' in FIG. 20A.

Referring to FIGS. 20A to 20C, an impurity is introduced to form second diffusion layers 143a and 143b in lower portions of the first pillar-shaped silicon layers 129, 131, 132, and 134 and in lower portions of the second pillar-shaped silicon layers 130 and 133. To form n-type diffusion layers, arsenic or phosphorus is preferably introduced. To form p-type diffusion layers, boron is preferably introduced. Alternatively, the diffusion layers may be formed after forming side walls formed of the fifth insulating film as described below.

Referring to FIGS. 21A to 21C, a fifth insulating film 144 is formed around the third dummy gates 137 and 139 and the fourth dummy gate 138. The fifth insulating film 144 is preferably a nitride film.

Referring to FIGS. 22A to 22C, the fifth insulating film 144 is etched into a side wall shape so that the remaining fifth insulating film 144 forms side walls 145, 146, and 147.

Referring to FIGS. 23A to 23C, metal-semiconductor compounds 148, 149, 150, 151, 152, 153, 154, and 155 are formed in upper portions of the second diffusion layers 143a and 143b. During this process, metal-semiconductor compounds 156, 158, and 157 are formed in upper portions of the third dummy gates 137 and 139 and in an upper portion of the fourth dummy gate 138.

The description up to this paragraph is the description of the fourth step including forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers.

Next, a fifth step following the fourth step is described. The fifth step includes depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers.

Referring to FIGS. 24A to 24C, an interlayer insulating film 159 is deposited. A contact stopper film may be used.

Figure 25C:
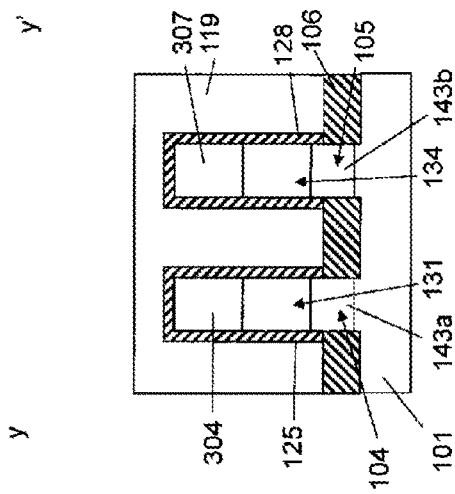
FIG. 25C is a cross-sectional view taken along line y-y' in FIG. 25A.
Figure 25A:
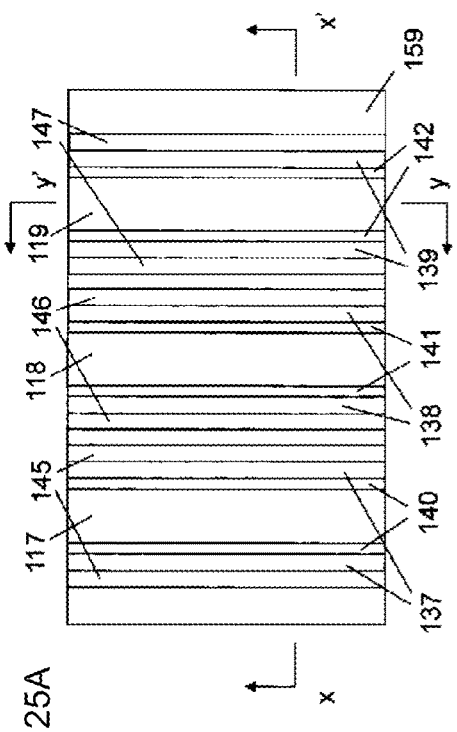
FIG. 25A is a plan view related to the method for producing a memory device according to the present invention.
Figure 25B:
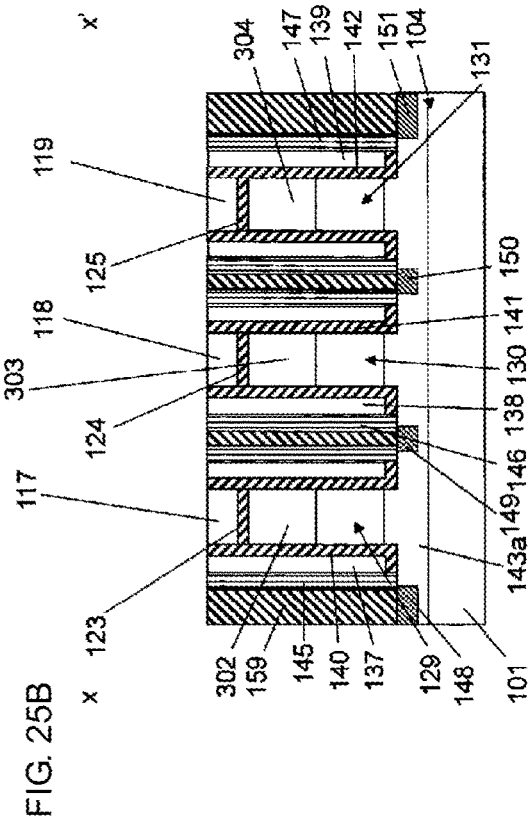
FIG. 25B is a cross-sectional view taken along line x-x' in FIG. 25A.

Referring to FIGS. 25A to 25C, chemical mechanical polishing is conducted to expose upper portions of the first dummy gates 117 and 119, the second dummy gate 118, the third dummy gates 137 and 139, and the fourth dummy gate 138. During this process, the metal-semiconductor compounds 156, 158, and 157 in the upper portions of the third dummy gates 137 and 139 and the fourth dummy gate 138 are removed.

Figure 26A:
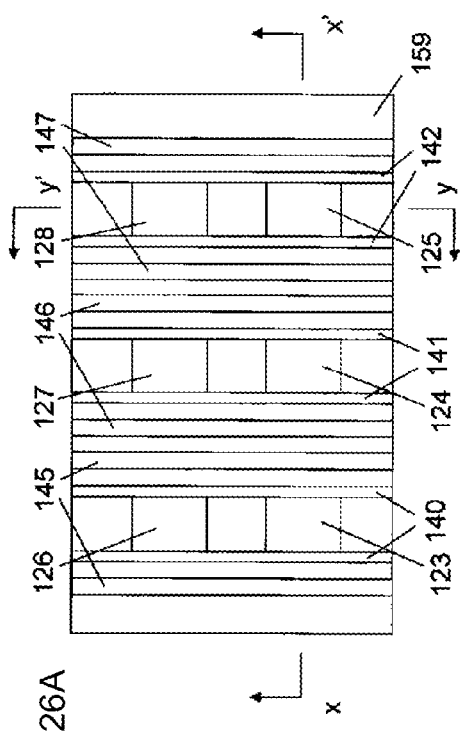
FIG. 26A is a plan view related to the method for producing a memory device according to the present invention.
Figure 26C:
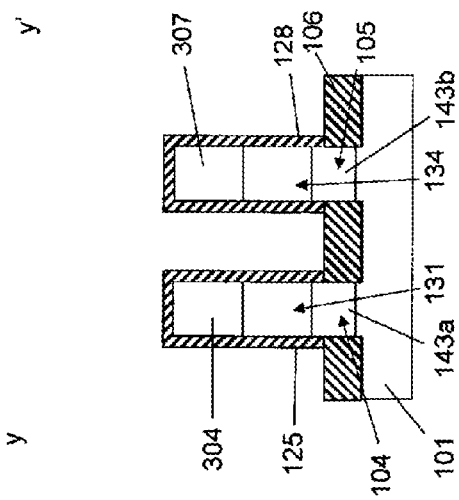
FIG. 26C is a cross-sectional view taken along line y-y' in FIG. 26A.
Figure 26B:
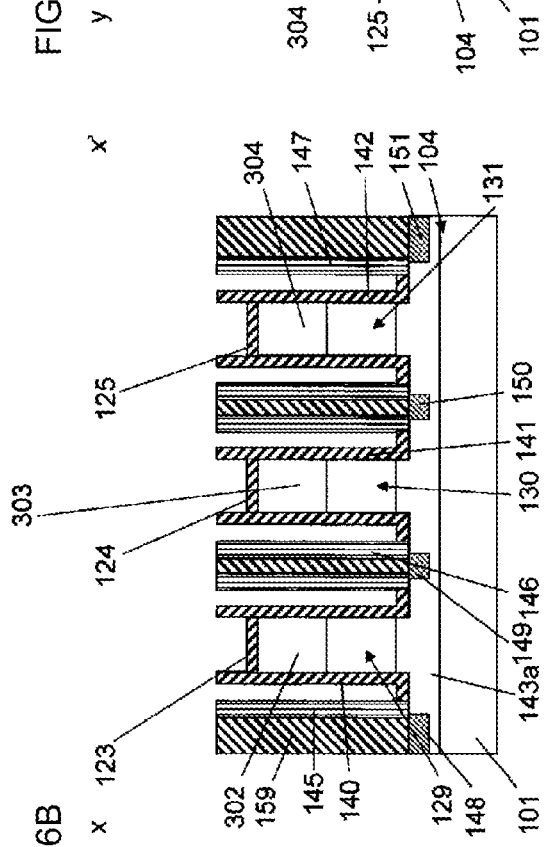
FIG. 26B is a cross-sectional view taken along line x-x' in FIG. 26A.

Referring to FIGS. 26A to 26C, the first dummy gates 117 and 119, the second dummy gate 118, the third dummy gates 137 and 139, and the fourth dummy gate 138 are removed.

Referring to FIGS. 27A to 27C, the second insulating films 123, 124, 125, 126, 127, and 128 and the fourth insulating films 140, 141, and 142 are removed.

Referring to FIGS. 28A to 28C, a gate insulating film 160 is formed around the first pillar-shaped silicon layers 129, 131, 132, and 134, around the second pillar-shaped silicon layers 130 and 133, and on the inner sides of the fifth insulating films 145, 146, and 147.

Referring to FIGS. 29A to 29C, a fourth resist 161 for removing the gate insulating film 160 around the bottom portions of the second pillar-shaped silicon layers 130 and 133 is formed.

Referring to FIGS. 30A to 30C, the gate insulating film 160 around the bottom portions of the second pillar-shaped silicon layers 130 and 133 is removed. The gate insulating film is divided into gate insulating films 162, 163, 164, 165, and 166 as a result. The gate insulating films 164, 165, and 166 may be removed by isotropic etching.

Referring to FIGS. 31A to 31C, the fourth resist 161 is removed.

Figure 32A:
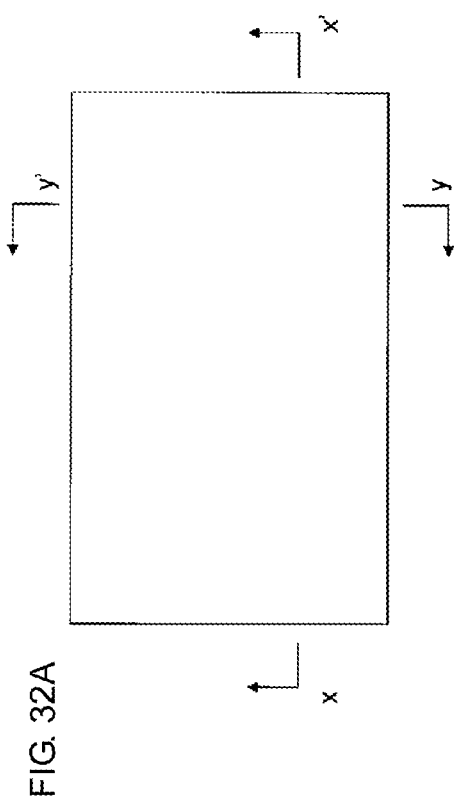
FIG. 32A is a plan view related to the method for producing a memory device according to the present invention.
Figure 32C:
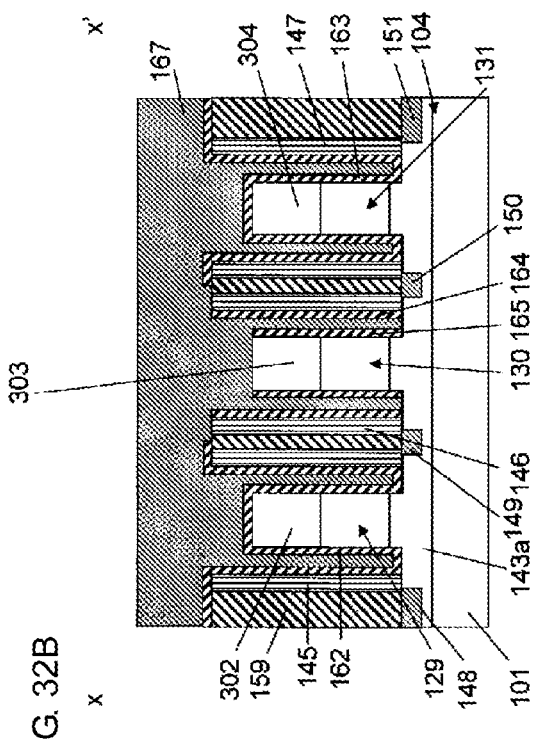
FIG. 32C is a cross-sectional view taken along line y-y' in FIG. 32A.
Figure 32B:
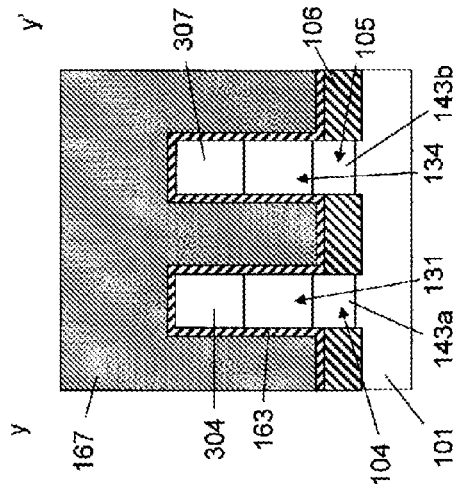
FIG. 32B is a cross-sectional view taken along line x-x' in FIG. 32A.

Referring to FIGS. 32A to 32C, a metal 167 is deposited.

Referring to FIGS. 33A to 33C, the metal 167 is etched back to form gate electrodes 168a and 170a and gate lines 168b and 170b around the first pillar-shaped silicon layers 129, 131, 132, and 134 and form a contact electrode 169a and a contact line 169b around the second pillar-shaped silicon layers 130 and 133.

The description up to this paragraph is the description of the fifth step following the fourth step, the fifth step including depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers.

Next, a sixth step is described which includes depositing a second interlayer insulating film on a substrate, forming contact holes arranged in two or more rows and two or more columns, and depositing a second metal and a nitride film; removing the second metal and the nitride film on the second interlayer insulating film so as to form, inside the contact holes, pillar-shaped nitride film layers arranged in two or more rows and two or more columns, and form lower electrodes surrounding the pillar-shaped nitride film layers and bottom portions thereof; etching back the second interlayer insulating film so as to expose upper portions of the lower electrodes surrounding the pillar-shaped nitride film layers; removing the exposed upper portions of the lower electrodes surrounding the pillar-shaped nitride film layers; depositing a phase change film so that the phase change film surrounds the pillar-shaped nitride film layers and connects with the lower electrodes; etching the phase change film into a side wall shape remaining on upper portions of the pillar-shaped nitride film layers; and forming a reset gate insulating film that surrounds the remaining phase change film and forming a reset gate that surrounds the phase change film having the side wall shape and remaining on the upper portions of the pillar-shaped nitride film layers.

Figure 34A:
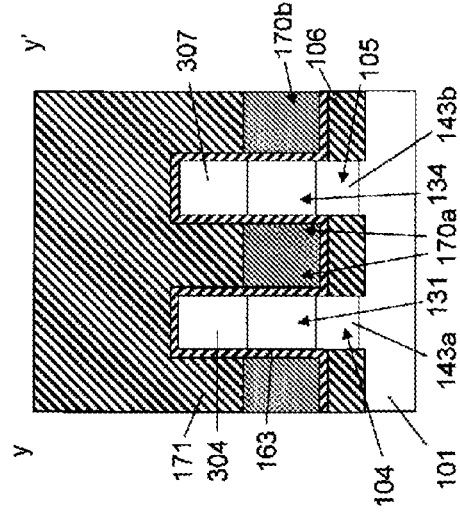
FIG. 34A is a plan view related to the method for producing a memory device according to the present invention.
Figure 34B:
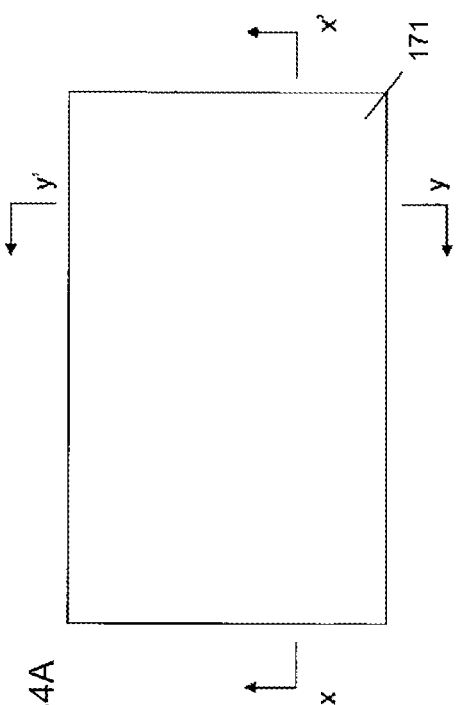
FIG. 34B is a cross-sectional view taken along line x-x' in FIG. 34A.
Figure 34C:
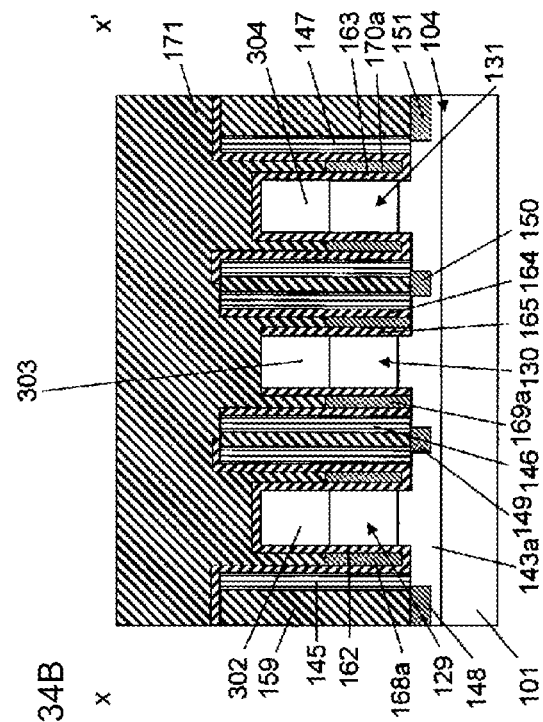
FIG. 34C is a cross-sectional view taken along line y-y' in FIG. 34A.

Referring to FIGS. 34A to 34C, a second interlayer insulating film 171 is deposited.

Referring to FIGS. 35A to 35C, a fifth resist 172 for forming contact holes is formed.

Figure 36C:
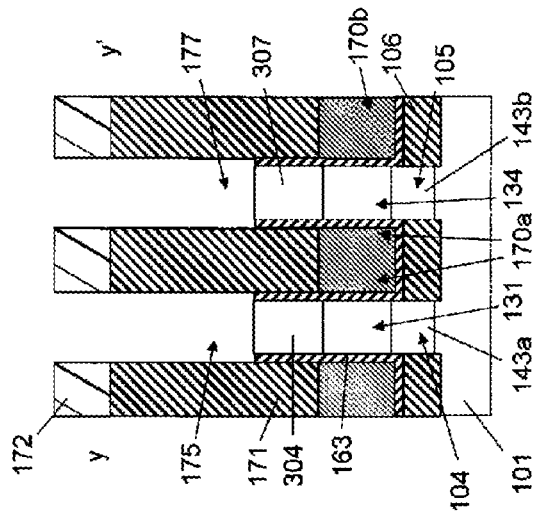
FIG. 36C is a cross-sectional view taken along line y-y' in FIG. 36A.
Figure 36A:
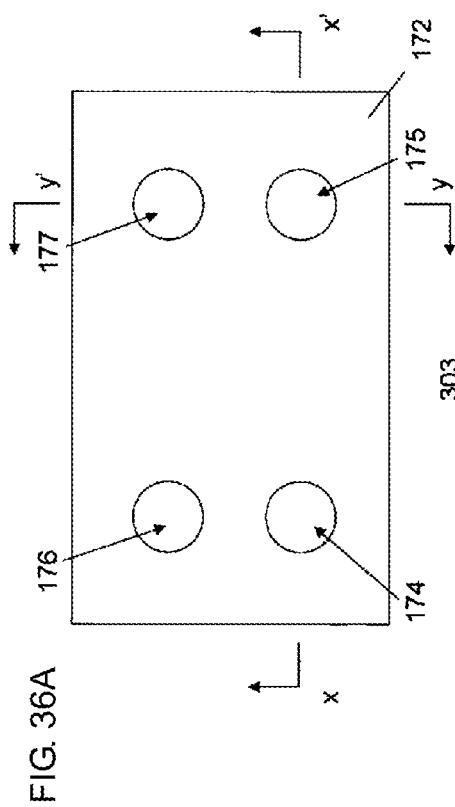
FIG. 36A is a plan view related to the method for producing a memory device according to the present invention.
Figure 36B:
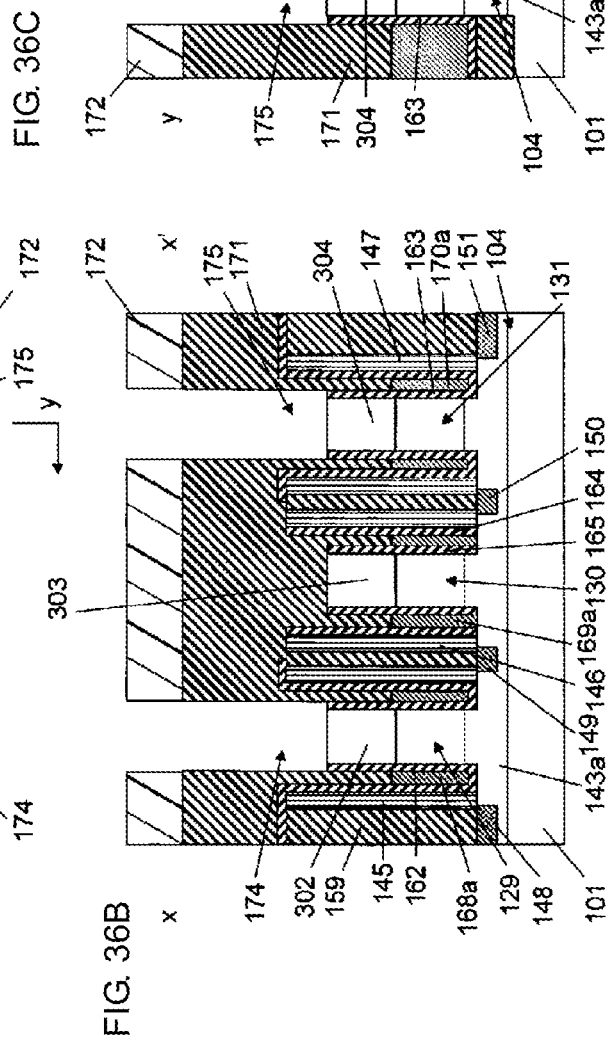
FIG. 36B is a cross-sectional view taken along line x-x' in FIG. 36A.

Referring to FIGS. 36A to 36C, contact holes 174, 175, 176, and 177 are formed.

Figure 37C:
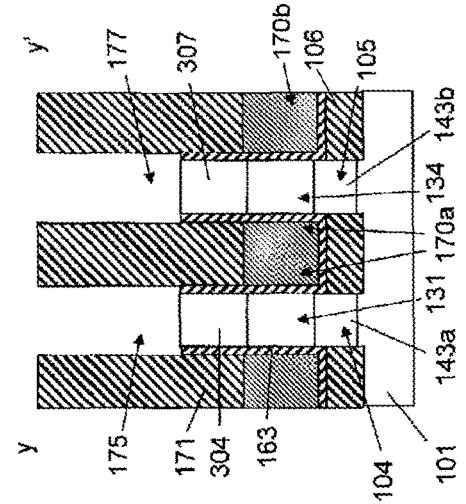
FIG. 37C is a cross-sectional view taken along line y-y' in FIG. 37A.
Figure 37A:
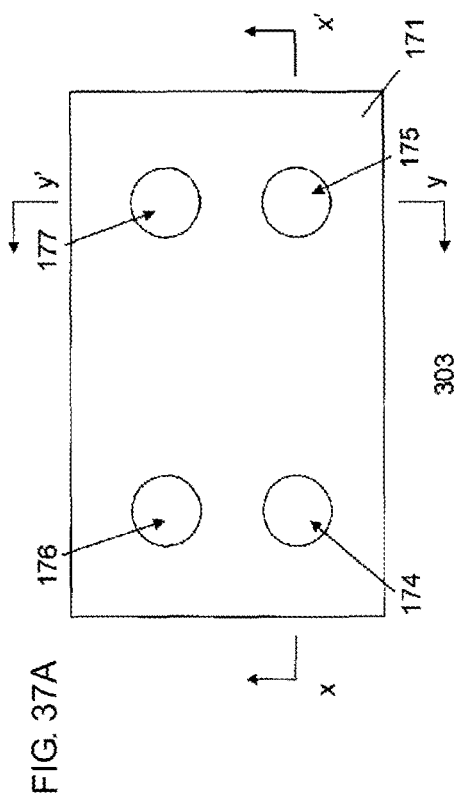
FIG. 37A is a plan view related to the method for producing a memory device according to the present invention.
Figure 37B:
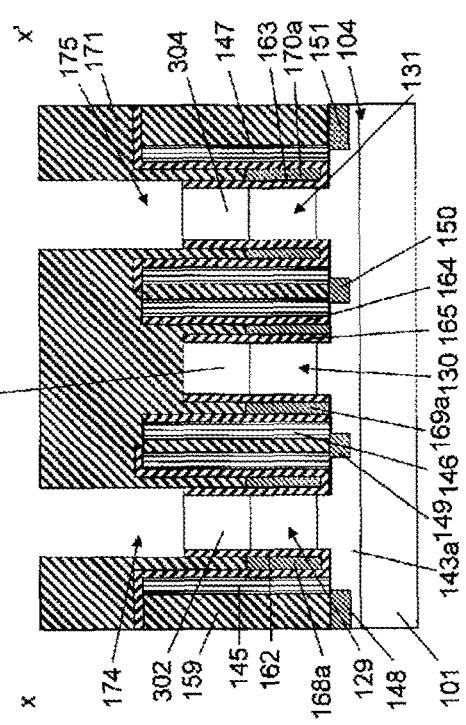
FIG. 37B is a cross-sectional view taken along line x-x' in FIG. 37A.

Referring to FIGS. 37A to 37C, the fifth resist 172 is removed.

Figure 38A:
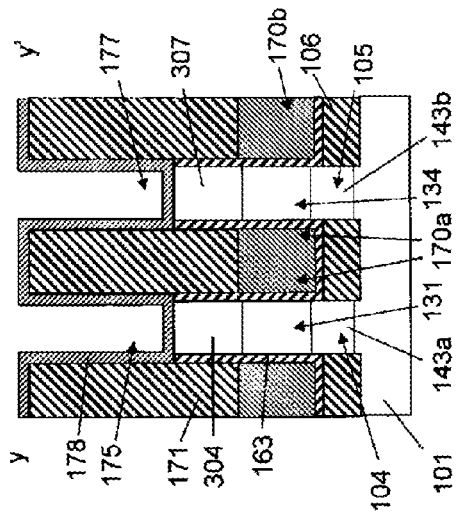
FIG. 38A is a plan view related to the method for producing a memory device according to the present invention.
Figure 38B:
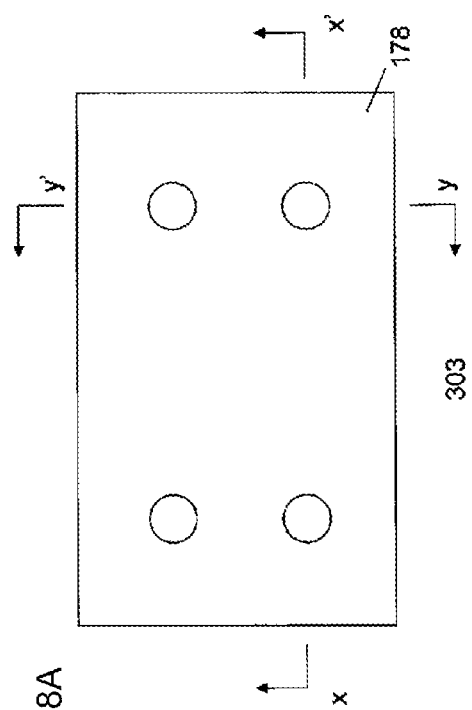
FIG. 38B is a cross-sectional view taken along line x-x' in FIG. 38A.
Figure 38C:
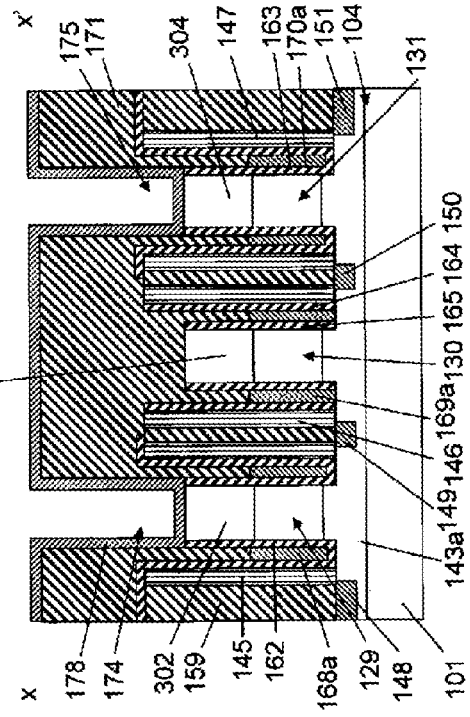
FIG. 38C is a cross-sectional view taken along line y-y' in FIG. 38A.

Referring to FIGS. 38A to 38C, a second metal 178 is deposited. The second metal 178 is preferably titanium nitride.

Referring to FIGS. 39A to 39C, a nitride film 179 is deposited.

Figure 40A:
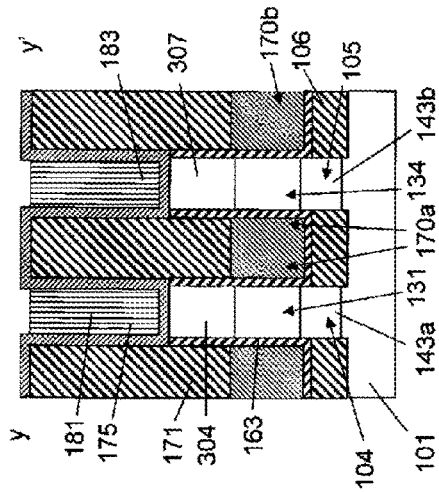
FIG. 40A is a plan view related to the method for producing a memory device according to the present invention.
Figure 40B:
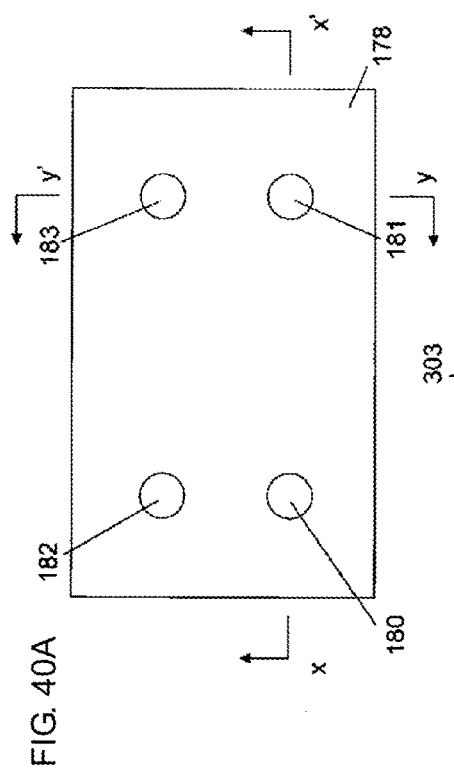
FIG. 40B is a cross-sectional view taken along line x-x' in FIG. 40A.
Figure 40C:
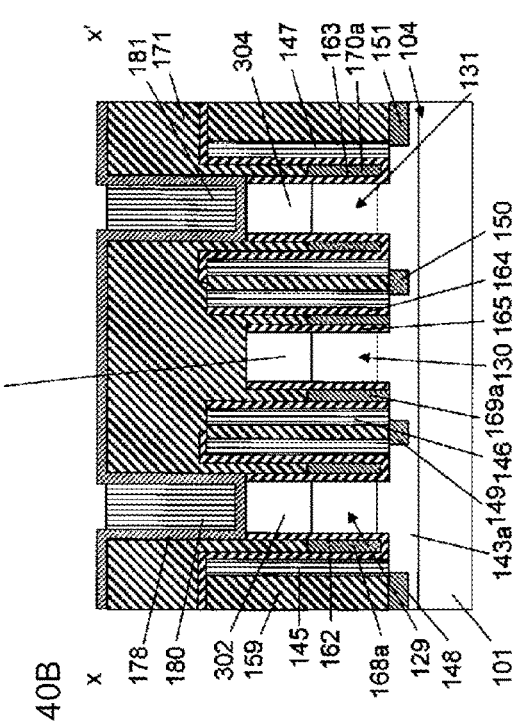
FIG. 40C is a cross-sectional view taken along line y-y' in FIG. 40A.

Referring to FIGS. 40A to 40C, the nitride film 179 is etched back to remove the nitride film 179 on the second interlayer insulating film 171. As a result, pillar-shaped nitride film layers 180, 181, 182, and 183 are formed.

Referring to FIGS. 41A to 41C, the second metal 178 on the second interlayer insulating film 171 is removed. As a result, lower electrodes 184, 185, 186, and 187 that surround the pillar-shaped nitride film layers 180, 181, 182, and 183 and their bottom portions are formed.

Figure 42A:
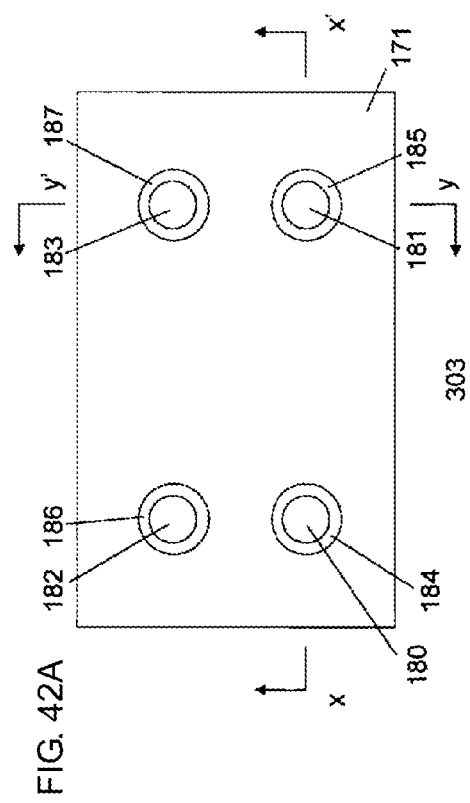
FIG. 42A is a plan view related to the method for producing a memory device according to the present invention.
Figure 42C:
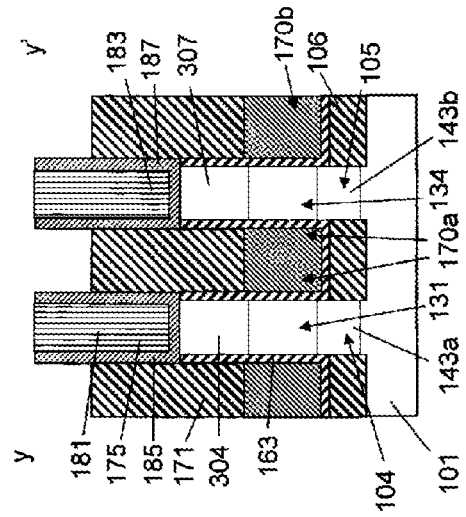
FIG. 42C is a cross-sectional view taken along line y-y' in FIG. 42A.
Figure 42B:
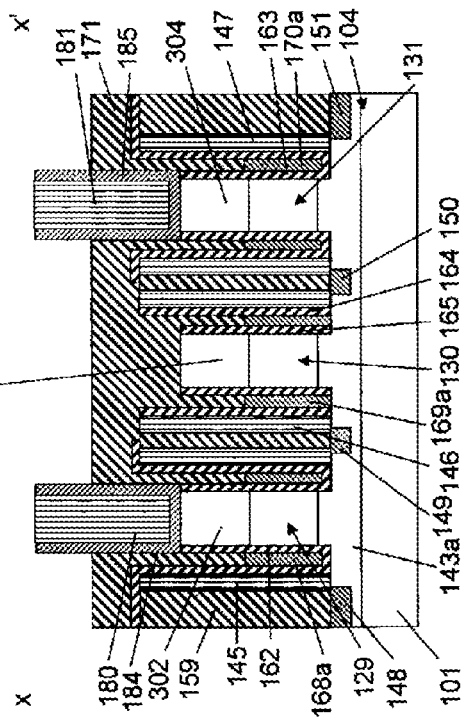
FIG. 42B is a cross-sectional view taken along line x-x' in FIG. 42A.

Referring to FIGS. 42A to 42C, the second interlayer insulating film 171 is etched back to expose upper portions of the lower electrodes 184, 185, 186, and 187 surrounding the pillar-shaped nitride film layers 180, 181, 182, and 183.

Figure 43A:
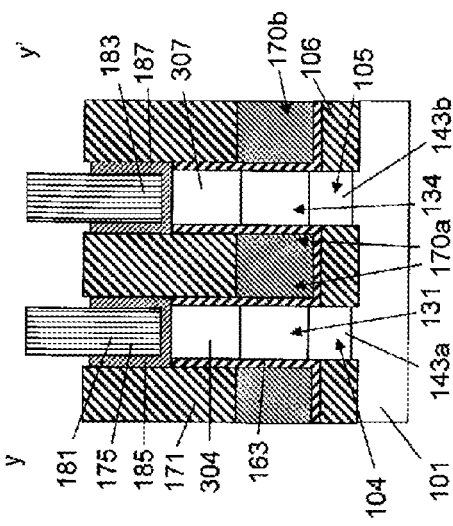
FIG. 43A is a plan view related to the method for producing a memory device according to the present invention.
Figure 43B:
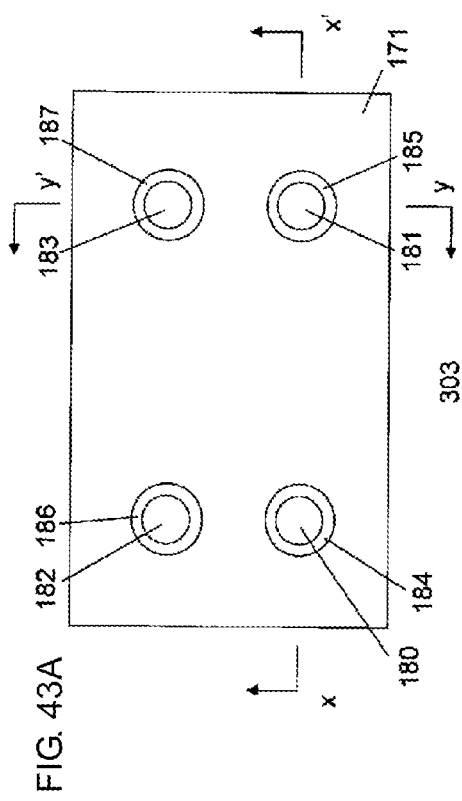
FIG. 43B is a cross-sectional view taken along line x-x' in FIG. 43A.
Figure 43C:
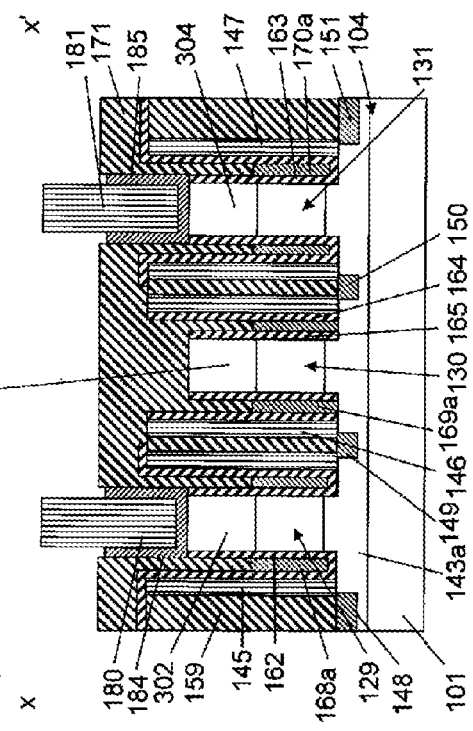
FIG. 43C is a cross-sectional view taken along line y-y' in FIG. 43A.

Referring to FIGS. 43A to 43C, exposed upper portions of the lower electrodes 184, 185, 186, and 187 surrounding the pillar-shaped nitride film layers 180, 181, 182, and 183 are removed.

Figure 44A:
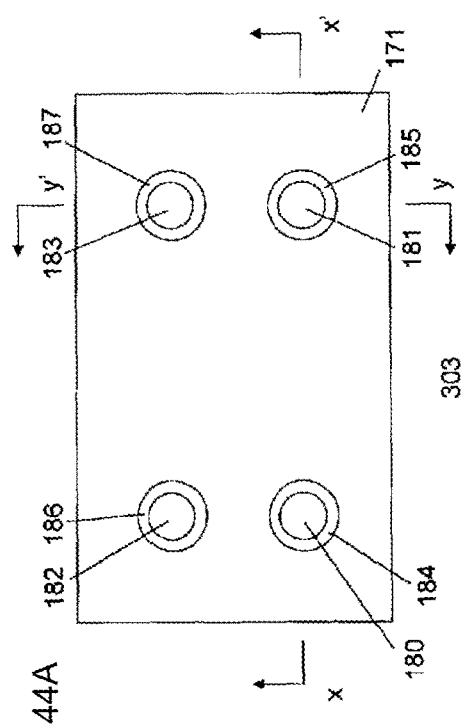
FIG. 44A is a plan view related to the method for producing a memory device according to the present invention.
Figure 44C:
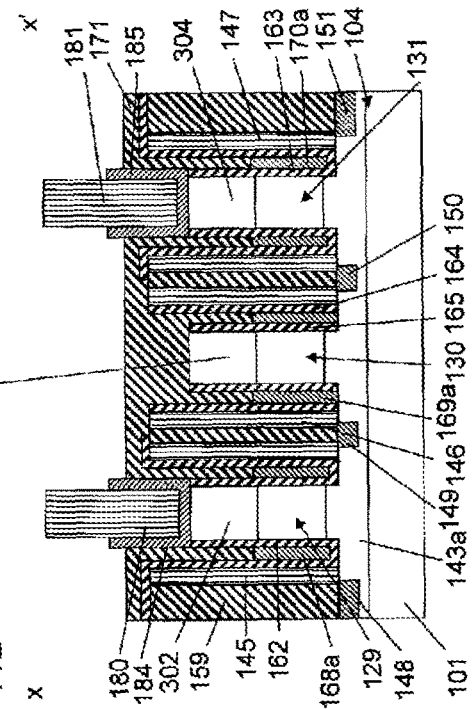
FIG. 44C is a cross-sectional view taken along line y-y' in FIG. 44A.
Figure 44B:
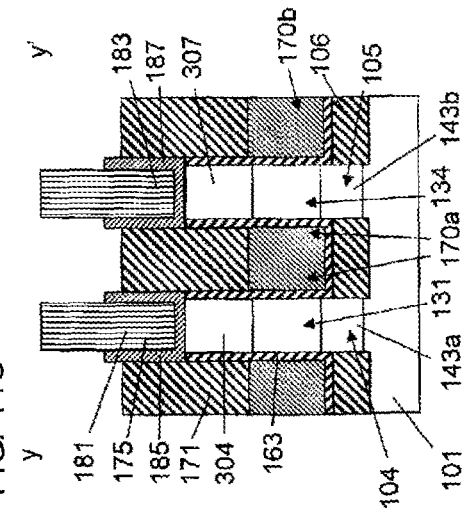
FIG. 44B is a cross-sectional view taken along line x-x' in FIG. 44A.

Referring to FIGS. 44A to 44C, the second interlayer insulating film 171 is etched back to expose upper portions of the lower electrodes 184, 185, 186, and 187 surrounding the pillar-shaped nitride film layers 180, 181, 182, and 183. If upper portions of the lower electrodes 184, 185, 186, and 187 are exposed as a result of the step shown in FIGS. 43A to 43C, this step shown in FIGS. 44A to 44C is unnecessary.

Figure 45A:
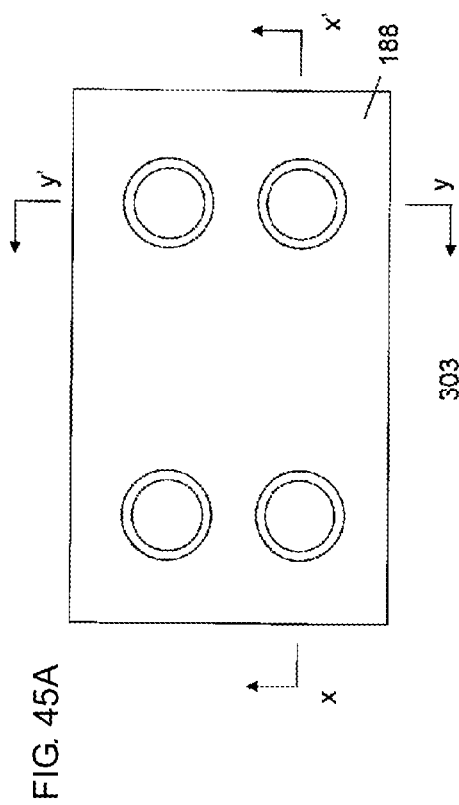
FIG. 45A is a plan view related to the method for producing a memory device according to the present invention.
Figure 45C:
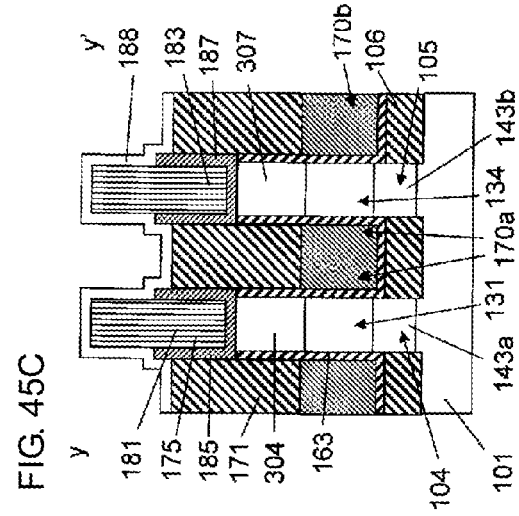
FIG. 45C is a cross-sectional view taken along line y-y' in FIG. 45A.
Figure 45B:
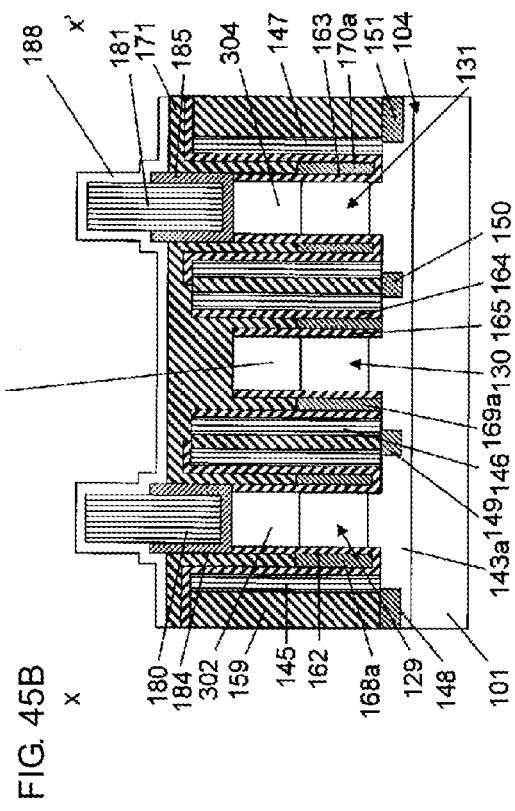
FIG. 45B is a cross-sectional view taken along line x-x' in FIG. 45A.

Referring to FIGS. 45A to 45C, a phase change film 188 is deposited so that the phase change film 188 surrounds the pillar-shaped nitride film layers 180, 181, 182, and 183 and is connected to the lower electrodes 184, 185, 186, and 187. The phase change film 188 is preferably formed of chalcogenide glass (GST: $Ge_2Sb_2Te_5$).

Figures 46A, 46B, 46C:
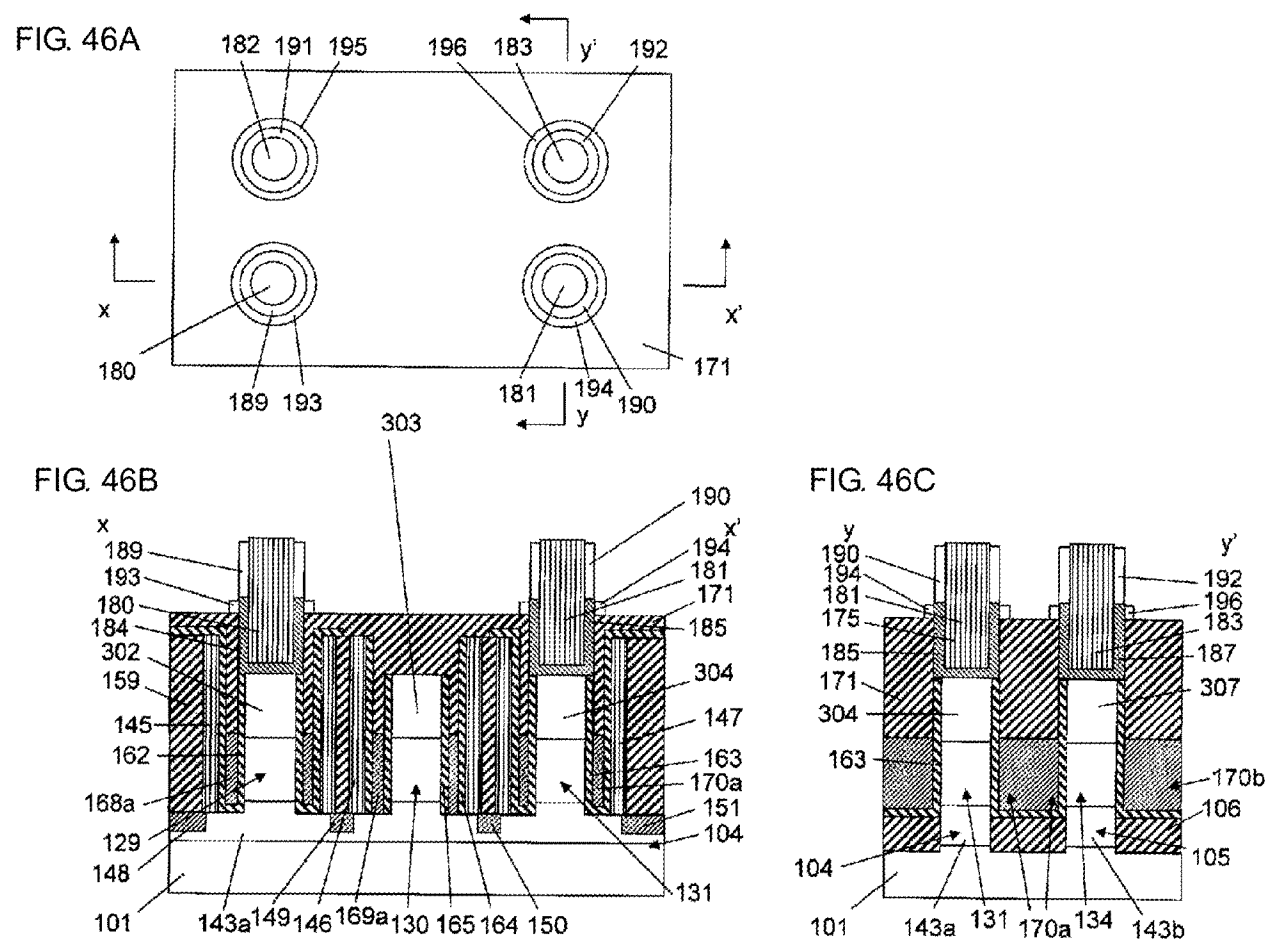

Referring to FIGS. 46A to 46C, the phase change film 188 is etched into a side wall shape so as to remain around upper portions of the pillar-shaped nitride film layers 180, 181, 182, and 183. As a result, the phase change film 188 is divided into phase change films 189, 190, 191, and 192. The phase change film 188 may remain on upper portions of side walls of the lower electrodes 184, 185, 186, and 187 so as to form phase change films 193, 194, 195, and 196.

Figure 47C:
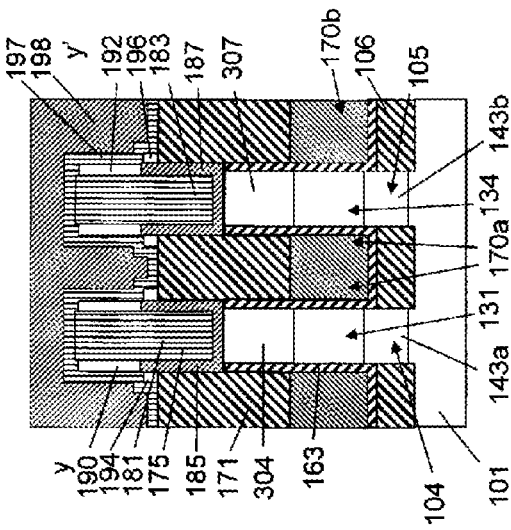
FIG. 47C is a cross-sectional view taken along line y-y' in FIG. 47A.
Figure 47A:
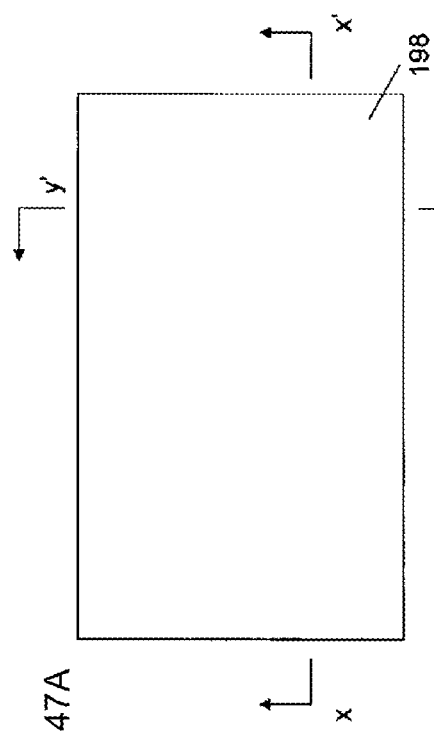
FIG. 47A is a plan view related to the method for producing a memory device according to the present invention.
Figure 47B:
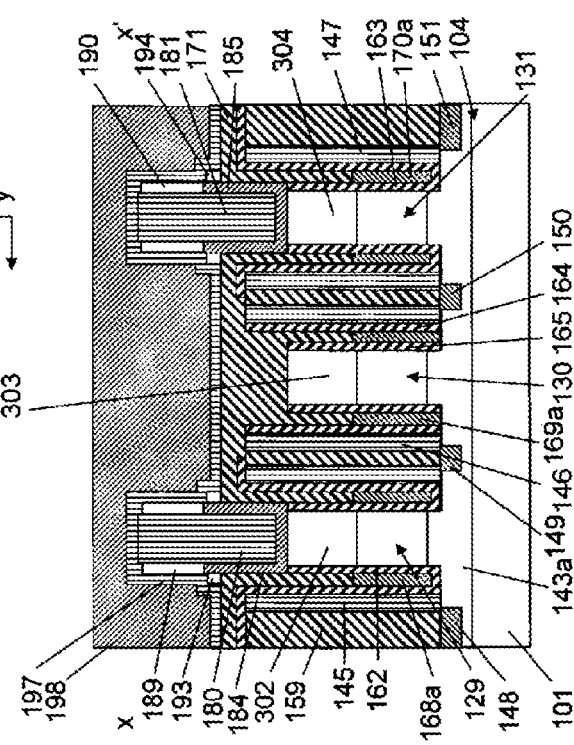
FIG. 47B is a cross-sectional view taken along line x-x' in FIG. 47A.

Referring to FIGS. 47A to 47C, a reset gate insulating film 197 is deposited, and a reset gate 198 is deposited. The reset gate insulating film 197 is preferably a nitride film. The reset gate 198 is preferably formed of titanium nitride.

Figure 48C:
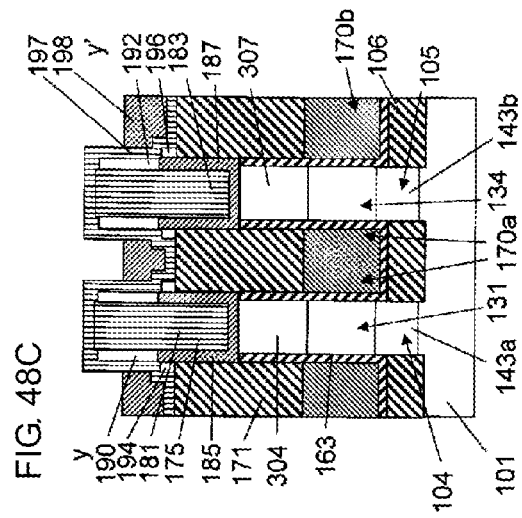
FIG. 48C is a cross-sectional view taken along line y-y' in FIG. 48A.
Figure 48A:
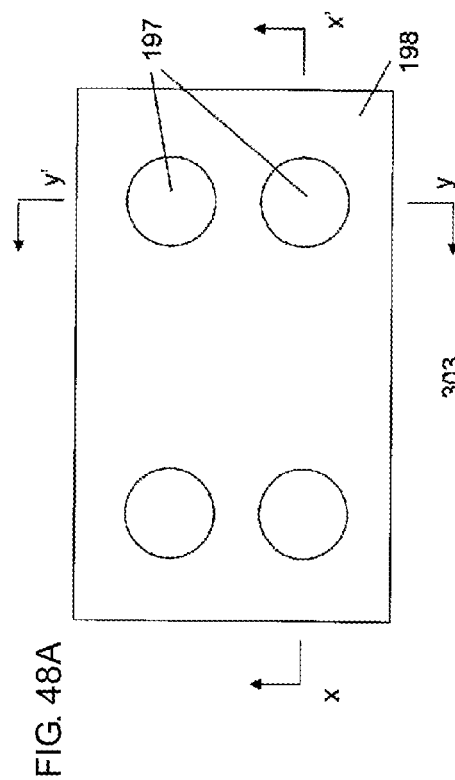
FIG. 48A is a plan view related to the method for producing a memory device according to the present invention.
Figure 48B:
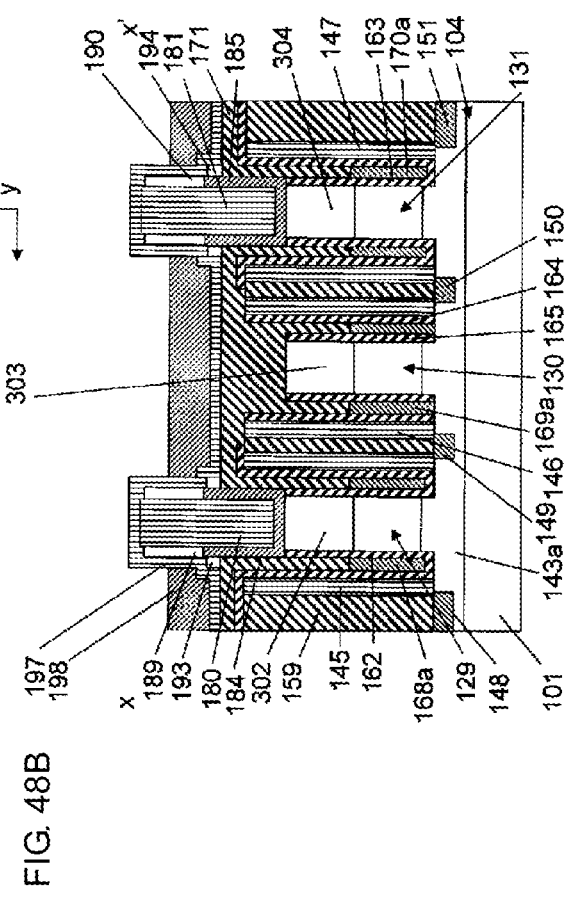
FIG. 48B is a cross-sectional view taken along line x-x' in FIG. 48A.

Referring to FIGS. 48A to 48C, the reset gate 198 is etched back.

Figure 49A:
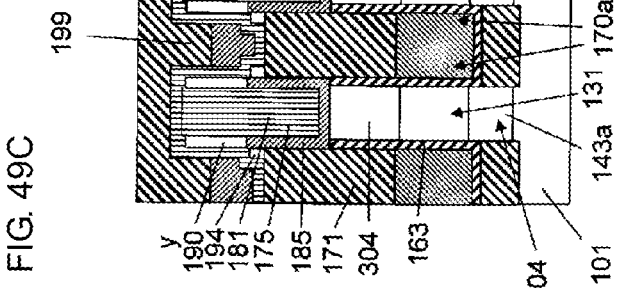
FIG. 49A is a plan view related to the method for producing a memory device according to the present invention.
Figure 49B:
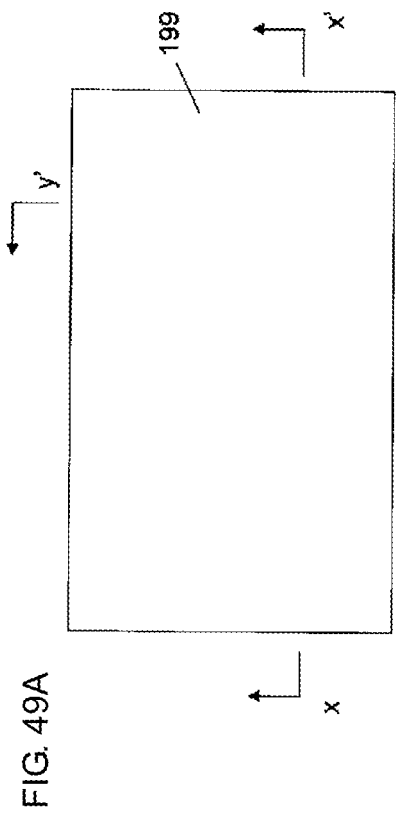
FIG. 49B is a cross-sectional view taken along line x-x' in FIG. 49A.
Figure 49C:
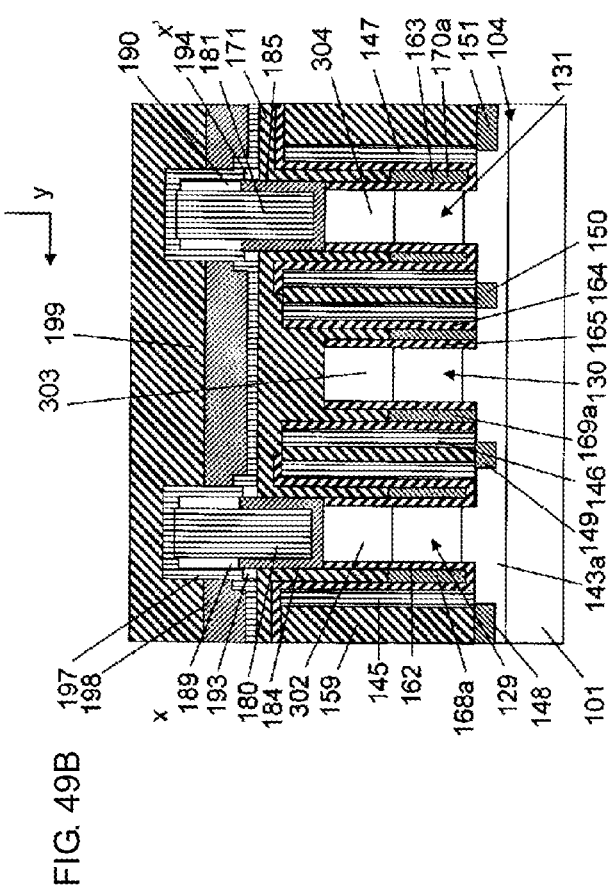
FIG. 49C is a cross-sectional view taken along line y-y' in FIG. 49A.

Referring to FIGS. 49A to 49C, a third interlayer insulating film 199 is deposited.

Figure 50A:
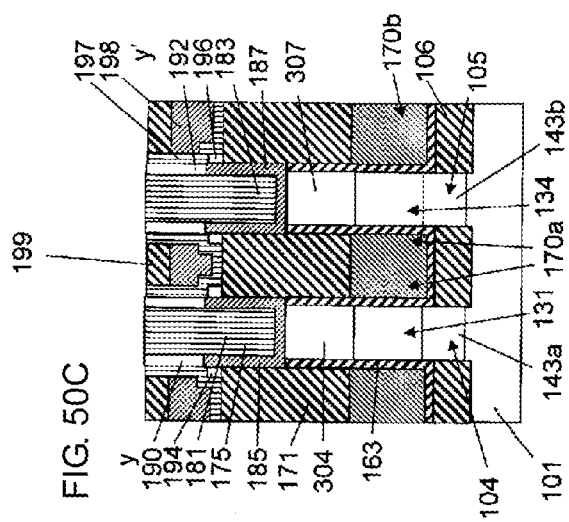
FIG. 50A is a plan view related to the method for producing a memory device according to the present invention.
Figure 50B:
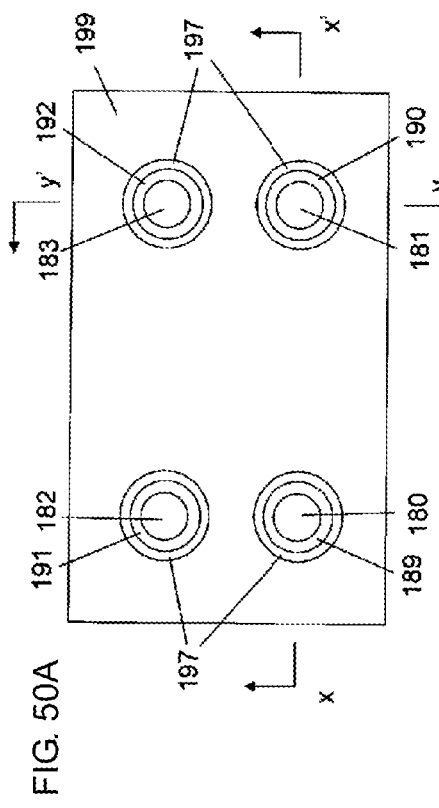
FIG. 50B is a cross-sectional view taken along line x-x' in FIG. 50A.
Figure 50C:
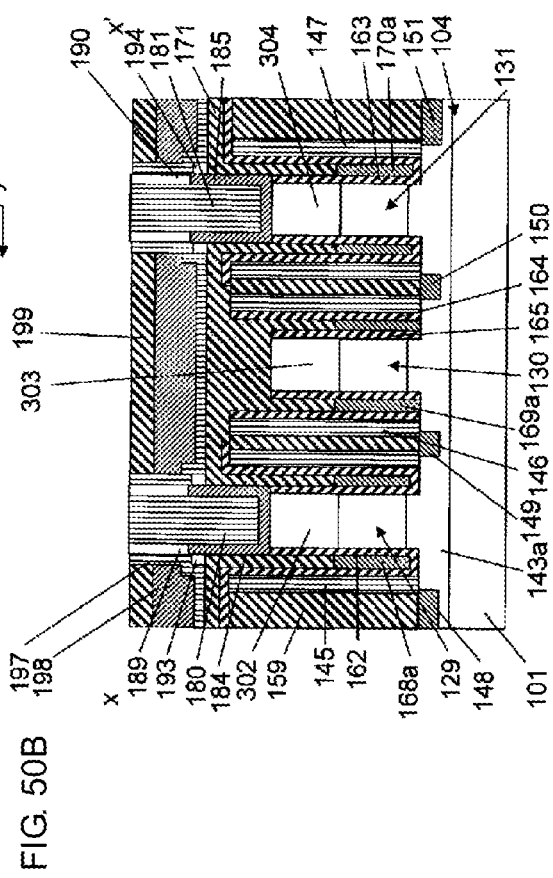
FIG. 50C is a cross-sectional view taken along line y-y' in FIG. 50A.

Referring to FIGS. 50A to 50C, the third interlayer insulating film 199 is planarized to expose the upper portions of the phase change films 189, 190, 191, and 192.

Referring to FIGS. 51A to 51C, a metal 200 is deposited.

Figure 52A:
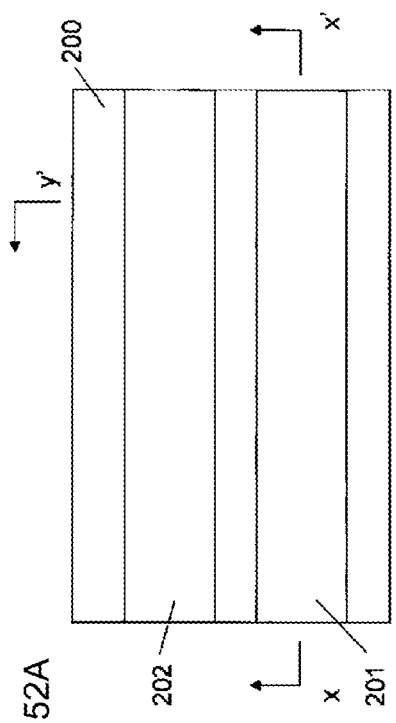
FIG. 52A is a plan view related to the method for producing a memory device according to the present invention.
Figure 52C:
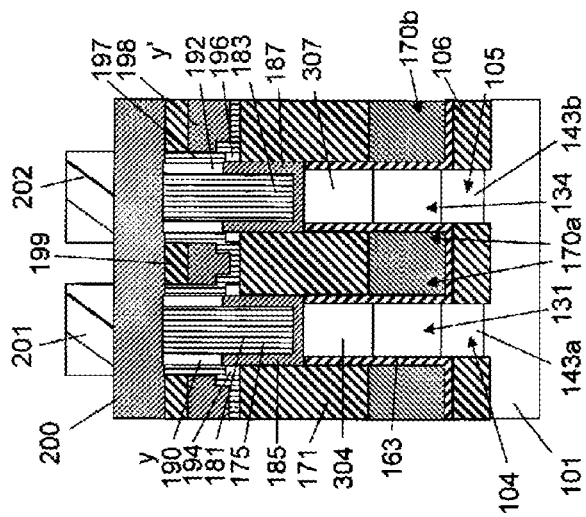
FIG. 52C is a cross-sectional view taken along line y-y' in FIG. 52A.
Figure 52B:
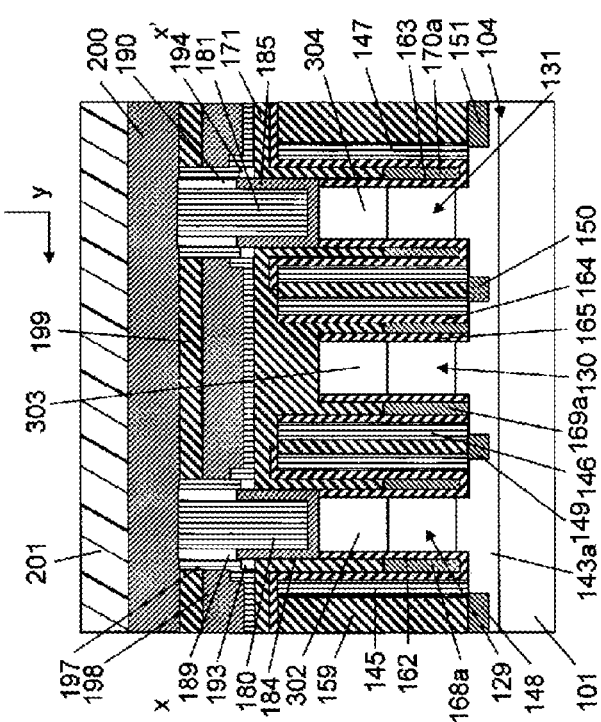
FIG. 52B is a cross-sectional view taken along line x-x' in FIG. 52A.

Referring to FIGS. 52A to 52C, sixth resists 201 and 202 for forming bit lines are formed.

Referring to FIGS. 53A to 53C, the metal 200 is etched to form bit lines 200a and 200b.

Referring to FIGS. 54A to 54C, the sixth resists 201 and 202 are removed.

The description up to this paragraph is the description of the sixth step that includes depositing a second interlayer insulating film on a substrate, forming contact holes arranged in two or more rows and two or more columns, and depositing a second metal and a nitride film; removing the second metal and the nitride film on the second interlayer insulating film so as to form, inside the contact holes, pillar-shaped nitride film layers arranged in two or more rows and two or more columns, and form lower electrodes surrounding the pillar-shaped nitride film layers and bottom portions thereof; etching back the second interlayer insulating film so as to expose upper portions of the lower electrodes surrounding the pillar-shaped nitride film layers; removing the exposed upper portions of the lower electrodes surrounding the pillar-shaped nitride film layers; depositing a phase change film so that the phase change film surrounds the pillar-shaped nitride film layers and connects with the lower electrodes; etching the phase change film into a side wall shape remaining on upper portions of the pillar-shaped nitride film layers; and forming a reset gate insulating film that surrounds the remaining phase change film and forming a reset gate that surrounds the phase change film having the side wall shape and remaining on the upper portions of the pillar-shaped nitride film layers.

The steps for producing a semiconductor device structure according to an embodiment of the present invention are as described in the above paragraphs.

The present invention can be implemented through various other embodiments and modifications without departing from the broad spirit and scope of the present invention. The embodiments described above are merely illustrative and do not limit the scope of the present invention.

For example, the above-described embodiments also cover a method for producing a semiconductor device in which the conductivity type (for example, p-type or $p^+$-type and n-type or $n^+$-type) is reversed, and a semiconductor device obtained by such a method, which naturally fall within the scope of the present invention.

The invention claimed is:

1. A method for producing a memory device, the method comprising a sixth step that includes:
    depositing a second interlayer insulating film on a substrate, forming contact holes arranged in two or more rows and two or more columns, and depositing a second metal and a nitride film;
    removing the second metal and the nitride film on the second interlayer insulating film so as to form, inside the contact holes, pillar-shaped nitride film layers arranged in two or more rows and two or more columns, and form lower electrodes surrounding the pillar-shaped nitride film layers and bottom portions thereof and being arranged in two or more rows and two or more columns;
    etching back the second interlayer insulating film so as to expose upper portions of the lower electrodes surrounding the pillar-shaped nitride film layers;
    removing the exposed upper portions of the lower electrodes surrounding the pillar-shaped nitride film layers;
    depositing a phase change film so that the phase change film surrounds the pillar-shaped nitride film layers and connects with the lower electrodes;
    etching the phase change film into a side wall shape remaining on upper portions of the pillar-shaped nitride film layers; and
    forming a reset gate insulating film that surrounds the remaining phase change film and forming a reset gate that surrounds the phase change film having the side wall shape and remaining on the upper portions of the pillar-shaped nitride film layers arranged in two or more rows and two or more columns.

2. The method for producing a memory device according to claim 1, the method further comprising:
    a first step of forming fin-shaped semiconductor layers on a semiconductor substrate and forming a first insulating film around the fin-shaped semiconductor layers;
    a second step following the first step, the second step including forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon;

a third step following the second step, the third step including forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates;

a fourth step of forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers;

a fifth step following the fourth step, the fifth step including depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers; and the sixth step according to claim 1, the sixth step following the fifth step.

3. The method for producing a memory device according to claim 2, further comprising forming a third insulating film on the first polysilicon after the first polysilicon is deposited and planarized on the second insulating film.

4. The method for producing a memory device according to claim 2, wherein after the fourth insulating film is formed around the first pillar-shaped semiconductor layers, the first dummy gates, the second pillar-shaped semiconductor layers, and the second dummy gates, a third resist is formed and etched back to expose upper portions of the first pillar-shaped semiconductor layers and first diffusion layers are formed in the upper portions of the first pillar-shaped semiconductor layers.

* * * * *